(12) United States Patent
Tokutomi et al.

(10) Patent No.: US 12,165,712 B2
(45) Date of Patent: *Dec. 10, 2024

(54) MEMORY SYSTEM

(71) Applicant: KIOXIA CORPORATION, Tokyo (JP)

(72) Inventors: Tsukasa Tokutomi, Kamakura Kanagawa (JP); Masanobu Shirakawa, Chigasaki Kanagawa (JP); Marie Takada, Yokohama Kanagawa (JP); Shohei Asami, Fujisawa Kanagawa (JP); Masamichi Fujiwara, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,221

(22) Filed: Jul. 31, 2023

(65) Prior Publication Data

US 2024/0021250 A1    Jan. 18, 2024

Related U.S. Application Data

(63) Continuation of application No. 17/568,336, filed on Jan. 4, 2022, now Pat. No. 11,763,893, which is a (Continued)

(30) Foreign Application Priority Data

Aug. 30, 2018   (JP) .................................. 2018-161899

(51) Int. Cl.
*G11C 16/26* (2006.01)
*G06F 3/06* (2006.01)
(Continued)

(52) U.S. Cl.
CPC ............ *G11C 16/26* (2013.01); *G06F 3/0604* (2013.01); *G06F 3/0659* (2013.01); (Continued)

(58) Field of Classification Search
CPC . G11C 16/26; G11C 16/0483; G11C 11/5671; G11C 16/08; G11C 11/5642; G11C 16/0466; G11C 2211/5648; G11C 16/10; G06F 3/0604; G06F 3/0659; G06F 3/0679; H10B 43/27; H10B 43/35
See application file for complete search history.

(56) References Cited

U.S. PATENT DOCUMENTS 7,843,723 B2   11/2010   Shibata
8,250,437 B2   8/2012   Sakurada et al.
(Continued)

*Primary Examiner* — Khamdan N. Alrobaie
(74) *Attorney, Agent, or Firm* — Oblon, McClelland, Maier & Neustadt, L.L.P.

(57) ABSTRACT

According to one embodiment, a memory system includes a semiconductor memory and a controller. The semiconductor memory includes first to fourth word lines and first to fourth memory cells. The controller is configured to issue first and second instructions. The controller is further configured to execute a first operation to obtain a first read voltage based on a threshold distribution of the first memory cell, and a second operation to read data from the second memory cell.

11 Claims, 52 Drawing Sheets

Related U.S. Application Data continuation of application No. 17/131,400, filed on Dec. 22, 2020, now Pat. No. 11,222,703, which is a continuation of application No. 16/297,789, filed on Mar. 11, 2019, now Pat. No. 10,910,067.

(51) Int. Cl.

| | | |
|---|---|---|
| *G11C 16/04* | (2006.01) | |
| *G11C 11/56* | (2006.01) | |
| *G11C 16/08* | (2006.01) | |
| *H10B 43/27* | (2023.01) | |
| *H10B 43/35* | (2023.01) | |

(52) U.S. Cl.
CPC ........ *G06F 3/0679* (2013.01); *G11C 16/0483* (2013.01); *G11C 11/5671* (2013.01); *G11C 16/08* (2013.01); *H10B 43/27* (2023.02); *H10B 43/35* (2023.02)

(56) References Cited

U.S. PATENT DOCUMENTS

| | | |
|---|---|---|
| 8,839,030 B2 | 9/2014 | Huang et al. |
| 9,251,892 B1 | 2/2016 | Asami |
| 9,502,126 B1 | 11/2016 | Kim |
| 10,770,147 B2 | 9/2020 | Asami |
| 2009/0267128 A1 | 10/2009 | Maejima |
| 2009/0268522 A1 | 10/2009 | Maejima |
| 2010/0124119 A1 | 5/2010 | Lee |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0020165 A1 | 1/2012 | Takekida |
| 2012/0063227 A1* | 3/2012 | Weingarten ........ G11C 16/3404 365/185.24 |
| 2012/0069663 A1 | 3/2012 | Itagaki et al. |
| 2012/0084490 A1 | 4/2012 | Choi |
| 2012/0120732 A1 | 5/2012 | Lee |
| 2012/0307557 A1 | 12/2012 | Itagaki |
| 2013/0173972 A1 | 7/2013 | Kubo |
| 2013/0176784 A1 | 7/2013 | Cometti |
| 2014/0223246 A1 | 8/2014 | Kim |
| 2015/0006983 A1* | 1/2015 | Lin ........ G11C 16/26 714/721 |
| 2015/0220394 A1 | 8/2015 | Tanaka |
| 2016/0035429 A1 | 2/2016 | Kim |
| 2016/0254059 A1 | 9/2016 | Ochi |
| 2016/0284414 A1 | 9/2016 | Lin |
| 2017/0011792 A1 | 1/2017 | Oh |
| 2018/0090216 A1 | 3/2018 | Hahn |
| 2018/0091170 A1 | 3/2018 | Asami |
| 2018/0158507 A1 | 6/2018 | Bang |
| 2018/0190348 A1 | 7/2018 | Tokutomi et al. |
| 2019/0198117 A1 | 6/2019 | Yu |
| 2019/0348107 A1 | 11/2019 | Shin |
| 2020/0211633 A1 | 7/2020 | Okuma |
| 2020/0264805 A1 | 8/2020 | Yoshii |

\* cited by examiner

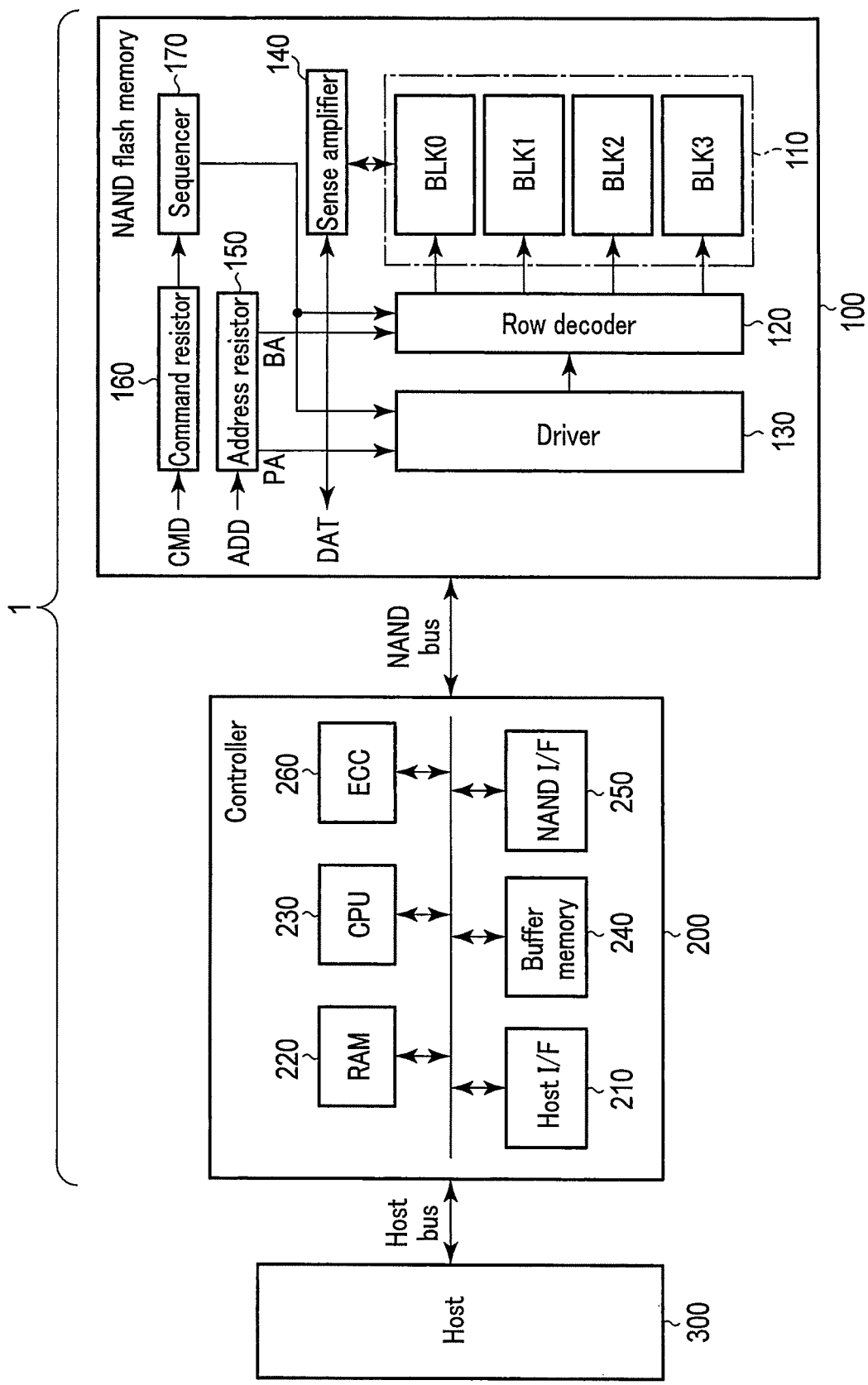
F I G. 1

| Index | Shift amount | | | | | | |
|---|---|---|---|---|---|---|---|
| | AR | BR | CR | DR | ER | FR | GR |
| 1 | ΔVA1 | ΔVB1 | ΔVC1 | ΔVD1 | ΔVE1 | ΔVF1 | ΔVG1 |
| 2 | ΔVA2 | ΔVB2 | ΔVC2 | ΔVD2 | ΔVE2 | ΔVF2 | ΔVG2 |
| 3 | ΔVA3 | ΔVB3 | ΔVC3 | ΔVD3 | ΔVE3 | ΔVF3 | ΔVG3 |
| 4 | ΔVA4 | ΔVB4 | ΔVC4 | ΔVD4 | ΔVE4 | ΔVF4 | ΔVG4 |
| 5 | ΔVA5 | ΔVB5 | ΔVC5 | ΔVD5 | ΔVE5 | ΔVF5 | ΔVG5 |
| 6 | ΔVA6 | ΔVB6 | ΔVC6 | ΔVD6 | ΔVE6 | ΔVF6 | ΔVG6 |
| 7 | ΔVA7 | ΔVB7 | ΔVC7 | ΔVD7 | ΔVE7 | ΔVF7 | ΔVG7 |
| 8 | ΔVA8 | ΔVB8 | ΔVC8 | ΔVD8 | ΔVE8 | ΔVF8 | ΔVG8 |
| 9 | ΔVA9 | ΔVB9 | ΔVC9 | ΔVD9 | ΔVE9 | ΔVF9 | ΔVG9 |
| 10 | ΔVA10 | ΔVB10 | ΔVC10 | ΔVD10 | ΔVE10 | ΔVF10 | ΔVG10 |
| 11 | ΔVA11 | ΔVB11 | ΔVC11 | ΔVD11 | ΔVE11 | ΔVF11 | ΔVG11 |
| 12 | ΔVA12 | ΔVB12 | ΔVC12 | ΔVD12 | ΔVE12 | ΔVF12 | ΔVG12 |

F I G. 5

| WL | Group | Index |
|---|---|---|
| 95 ⋮ 84 | GP7 WL84-95 | 3 |
| 83 ⋮ 72 | GP6 WL72-83 | 2 |
| 71 ⋮ 60 | GP5 WL60-71 | 2 |
| 59 ⋮ 48 | GP4 WL48-59 | 1 |
| 47 ⋮ 36 | GP3 WL36-47 | 2 |
| 35 ⋮ 24 | GP2 WL24-35 | 2 |
| 23 ⋮ 12 | GP1 WL12-23 | 3 |
| 11 ⋮ 0 | GP0 WL0-11 | 5 |

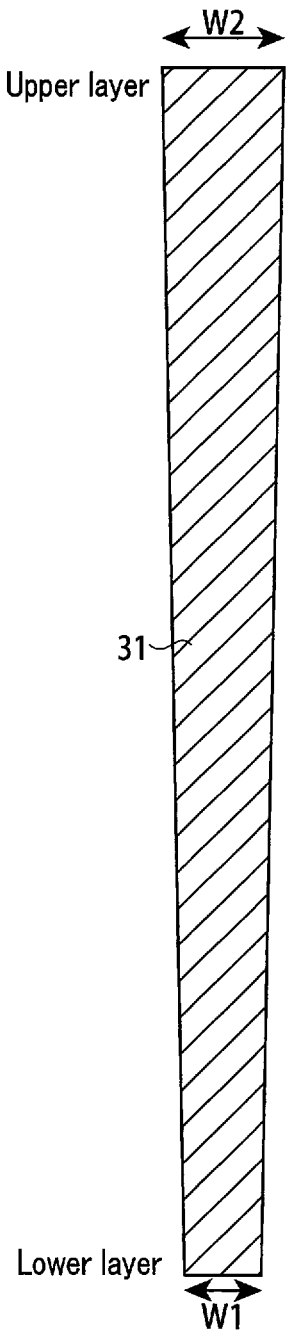
| WL | Group | Index |
|---|---|---|
| 92···95 | GP5 WL92-95 | 4 |
| 91 ⋮ 70 | GP4 WL70-91 | 2 |
| 69 ⋮ 48 | GP3 WL48-69 | 1 |
| 47 ⋮ 26 | GP2 WL26-47 | 1 |
| 25 ⋮ 4 | GP1 WL4-25 | 2 |
| 0···3 | GP0 WL0-3 | 6 |
F I G. 7

| Physical block/ Word line group | | Shift amount | | | | | | |
|---|---|---|---|---|---|---|---|---|
| | | AR | BR | CR | DR | ER | FR | GR |
| BLK0 | GP0 | $\Delta$VA6 | $\Delta$VB6 | $\Delta$VC6 | $\Delta$VD6 | $\Delta$VE6 | $\Delta$VF6 | $\Delta$VG6 |

FIG. 9A

| Physical block/ Word line group | | Shift amount | | | | | | |
|---|---|---|---|---|---|---|---|---|
| | | AR | BR | CR | DR | ER | FR | GR |
| BLK0 | GP0 | $\Delta$VA6 | $\Delta$VB6 | $\Delta$VC6 | $\Delta$VD6 | $\Delta$VE6 | $\Delta$VF6 | $\Delta$VG6 |
| | GP1 | $\Delta$VA2 | $\Delta$VB2 | $\Delta$VC2 | $\Delta$VD2 | $\Delta$VE2 | $\Delta$VF2 | $\Delta$VG2 |

FIG. 9B

| Physical block/ Word line group | | Shift amount | | | |
|---|---|---|---|---|---|
| | | AR | BR | ...... | GR |
| BLK0 | GP0→GP2 | ΔVA6→ΔVA1 | ΔVB6→ΔVB1 | ...... | ΔVG6→ΔVG1 |
| | GP1 | ΔVA2 | ΔVB2 | ...... | ΔVG2 |

F I G. 10A

| Physical block/ Word line group | | Shift amount | | | |
|---|---|---|---|---|---|
| | | AR | BR | ...... | GR |
| BLK0 | GP2 | ΔVA1→ΔVA2 | ΔVB1→ΔVB2 | ...... | ΔVG1→ΔVG2 |
| | GP1 | ΔVA2 | ΔVB2 | ...... | ΔVG2 |

F I G. 10B

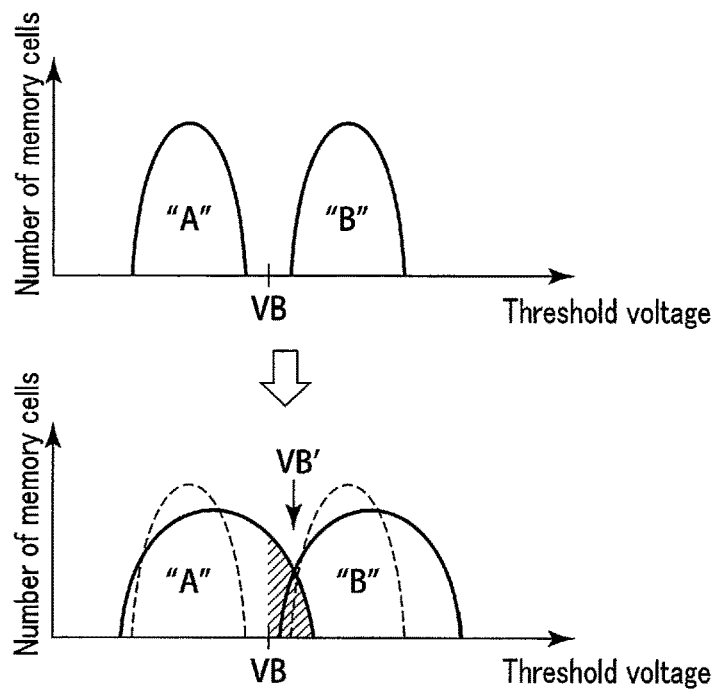
F I G. 11A
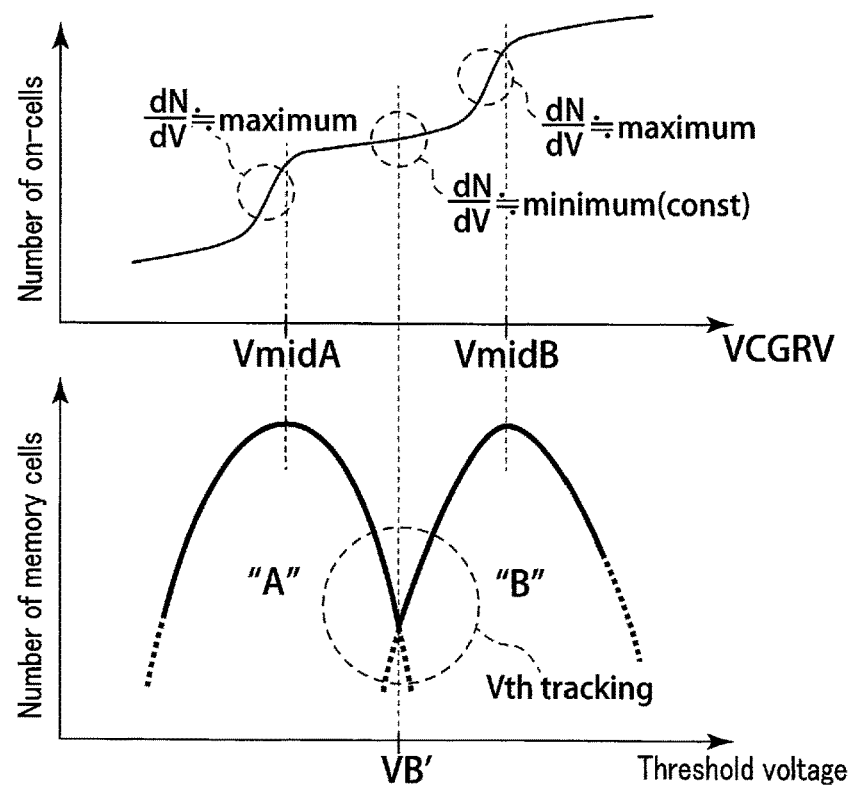
F I G. 11B

| | VA1 | VA2 | VA3 | VA4 | VC | VE1 | VE2 | VE3 | VE4 | Threshold voltage |
|---|---|---|---|---|---|---|---|---|---|---|
| TR | "1" | "1" | "1" | "1" | "1" | "0" | "0" | "0" | "0" | "0" |
| AR1/ER1 | "1" | "0" | "0" | "0" | "0" | "0" | "1" | "1" | "1" | "1" |
| AR2/ER2 | "1" | "1" | "0" | "0" | "0" | "0" | "0" | "1" | "1" | "1" |
| AR3/ER3 | "1" | "1" | "1" | "0" | "0" | "0" | "0" | "0" | "1" | "1" |
| AR4/ER4 | "1" | "1" | "1" | "1" | "0" | "0" | "0" | "0" | "0" | "1" |

FIG. 14A

| | VA1 | VA2 | VA3 | VA4 | VC | VE1 | VE2 | VE3 | VE4 | Threshold voltage |
|---|---|---|---|---|---|---|---|---|---|---|
| Separation data ARs1 | "1" | "0" | "0" | "0" | "0" | "0" | "0" | "0" | "0" | "0" |
| Separation data ARs2 | "1" | "1" | "0" | "0" | "0" | "0" | "0" | "0" | "0" | "0" |
| Separation data ARs3 | "1" | "1" | "1" | "0" | "0" | "0" | "0" | "0" | "0" | "0" |
| Separation data ARs4 | "1" | "1" | "1" | "1" | "0" | "0" | "0" | "0" | "0" | "0" |
| Separation data ERs1 | "0" | "0" | "0" | "0" | "0" | "0" | "1" | "1" | "1" | "1" |
| Separation data ERs2 | "0" | "0" | "0" | "0" | "0" | "0" | "0" | "1" | "1" | "1" |
| Separation data ERs3 | "0" | "0" | "0" | "0" | "0" | "0" | "0" | "0" | "1" | "1" |
| Separation data ERs4 | "0" | "0" | "0" | "0" | "0" | "0" | "0" | "0" | "0" | "1" |

FIG. 14B

| WL Group | WL | SU0 | SU1 | SU2 | SU3 |
|---|---|---|---|---|---|
| GP7 | 95 ⋮ | | | | |
| | 84 | tracking | | | |
| GP6 | 83 ⋮ | | | | |
| | 72 | tracking | | | |
| GP5 | 71 ⋮ | | | | |
| | 60 | tracking | | | |
| GP4 | 59 ⋮ | | | | |
| | 48 | tracking | | | |
| GP3 | 47 ⋮ | | | | |
| | 36 | tracking | | | |
| GP2 | 35 ⋮ | | | | |
| | 24 | tracking | | | |
| GP1 | 23 ⋮ | | | | |
| | 12 | tracking | | | |
| GP0 | 11 ⋮ | | | | |
| | 0 | tracking | | | |

F I G. 15

| WL Group | WL | SU0 | SU1 | SU2 | SU3 |
|---|---|---|---|---|---|
| GP7 | 95<br>⋮<br>89<br>⋮<br>84 | <br><br>tracking<br><br> | | | |
| GP6 | 83<br>⋮<br>77<br>⋮<br>72 | <br><br>tracking<br><br> | | | |
| GP5 | 71<br>⋮<br>65<br>⋮<br>60 | <br><br>tracking<br><br> | | | |
| GP4 | 59<br>⋮<br>53<br>⋮<br>48 | <br><br>tracking<br><br> | | | |
| GP3 | 47<br>⋮<br>41<br>⋮<br>36 | <br><br>tracking<br><br> | | | |
| GP2 | 35<br>⋮<br>29<br>⋮<br>24 | <br><br>tracking<br><br> | | | |
| GP1 | 23<br>⋮<br>17<br>⋮<br>12 | <br><br>tracking<br><br> | | | |
| GP0 | 11<br>⋮<br>5<br>⋮<br>0 | <br><br>tracking<br><br> | | | |

F I G. 20

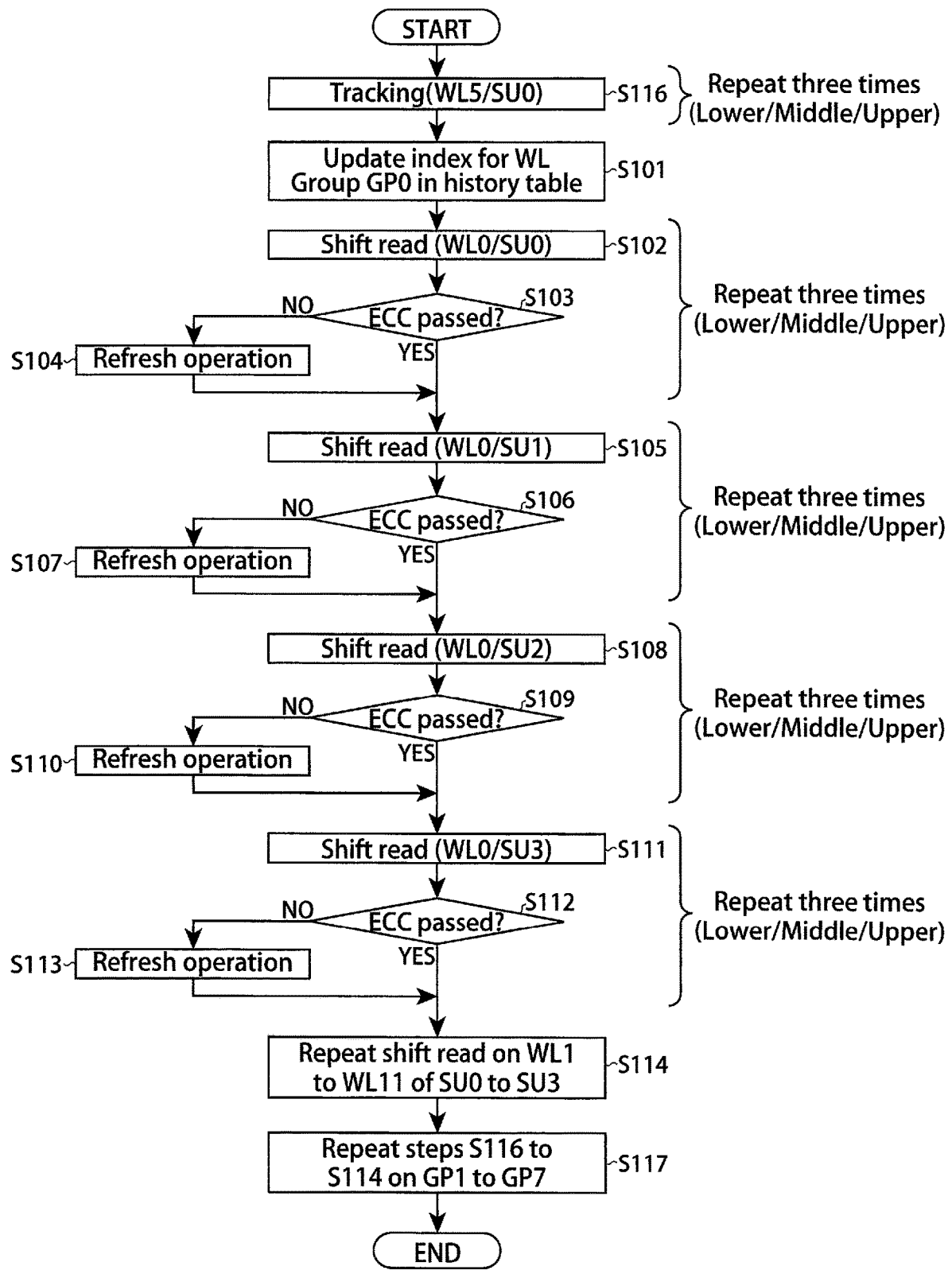
F I G. 21

| WL Group | WL | SU0 | SU1 | SU2 | SU3 |
|---|---|---|---|---|---|
| GP7 | 95<br>⋮<br>89<br>⋮<br>84 | tracking | tracking | tracking | tracking |
| GP6 | 83<br>⋮<br>77<br>⋮<br>72 | tracking | tracking | tracking | tracking |
| GP5 | 71<br>⋮<br>65<br>⋮<br>60 | tracking | tracking | tracking | tracking |
| GP4 | 59<br>⋮<br>53<br>⋮<br>48 | tracking | tracking | tracking | tracking |
| GP3 | 47<br>⋮<br>41<br>⋮<br>36 | tracking | tracking | tracking | tracking |
| GP2 | 35<br>⋮<br>29<br>⋮<br>24 | tracking | tracking | tracking | tracking |
| GP1 | 23<br>⋮<br>17<br>⋮<br>12 | tracking | tracking | tracking | tracking |
| GP0 | 11<br>⋮<br>5<br>⋮<br>0 | tracking | tracking | tracking | tracking |

F I G. 22

| WL Group | WL | SU0 | SU1 | SU2 | SU3 |
|---|---|---|---|---|---|
| GP7 | 95 | tracking | tracking | tracking | tracking |
| | ⋮ | | | | |
| | 89 | tracking | tracking | tracking | tracking |
| | ⋮ | | | | |
| | 84 | tracking | tracking | tracking | tracking |
| GP6 | 83 | tracking | tracking | tracking | tracking |
| | ⋮ | | | | |
| | 77 | tracking | tracking | tracking | tracking |
| | ⋮ | | | | |
| | 72 | tracking | tracking | tracking | tracking |
| GP5 | 71 | tracking | tracking | tracking | tracking |
| | ⋮ | | | | |
| | 65 | tracking | tracking | tracking | tracking |
| | ⋮ | | | | |
| | 60 | tracking | tracking | tracking | tracking |
| GP4 | 59 | tracking | tracking | tracking | tracking |
| | ⋮ | | | | |
| | 53 | tracking | tracking | tracking | tracking |
| | ⋮ | | | | |
| | 48 | tracking | tracking | tracking | tracking |
| GP3 | 47 | tracking | tracking | tracking | tracking |
| | ⋮ | | | | |
| | 41 | tracking | tracking | tracking | tracking |
| | ⋮ | | | | |
| | 36 | tracking | tracking | tracking | tracking |
| GP2 | 35 | tracking | tracking | tracking | tracking |
| | ⋮ | | | | |
| | 29 | tracking | tracking | tracking | tracking |
| | ⋮ | | | | |
| | 24 | tracking | tracking | tracking | tracking |
| GP1 | 23 | tracking | tracking | tracking | tracking |
| | ⋮ | | | | |
| | 17 | tracking | tracking | tracking | tracking |
| | ⋮ | | | | |
| | 12 | tracking | tracking | tracking | tracking |
| GP0 | 11 | tracking | tracking | tracking | tracking |
| | ⋮ | | | | |
| | 5 | tracking | tracking | tracking | tracking |
| | ⋮ | | | | |
| | 0 | tracking | tracking | tracking | tracking |

F I G. 25

| WL Group | WL | SU0 | SU1 | SU2 | SU3 |
|---|---|---|---|---|---|
| GP7 | 95 | tracking | tracking | tracking | tracking |
| | ⋮ | ⋮ | ⋮ | ⋮ | ⋮ |
| | 89 | tracking | tracking | tracking | tracking |
| | ⋮ | ⋮ | ⋮ | ⋮ | ⋮ |
| | 84 | tracking | tracking | tracking | tracking |
| GP6 | 83 | tracking | tracking | tracking | tracking |
| | ⋮ | ⋮ | ⋮ | ⋮ | ⋮ |
| | 77 | tracking | tracking | tracking | tracking |
| | ⋮ | ⋮ | ⋮ | ⋮ | ⋮ |
| | 72 | tracking | tracking | tracking | tracking |
| GP5 | 71 | tracking | tracking | tracking | tracking |
| | ⋮ | ⋮ | ⋮ | ⋮ | ⋮ |
| | 65 | tracking | tracking | tracking | tracking |
| | ⋮ | ⋮ | ⋮ | ⋮ | ⋮ |
| | 60 | tracking | tracking | tracking | tracking |
| GP4 | 59 | tracking | tracking | tracking | tracking |
| | ⋮ | ⋮ | ⋮ | ⋮ | ⋮ |
| | 53 | tracking | tracking | tracking | tracking |
| | ⋮ | ⋮ | ⋮ | ⋮ | ⋮ |
| | 48 | tracking | tracking | tracking | tracking |
| GP3 | 47 | tracking | tracking | tracking | tracking |
| | ⋮ | ⋮ | ⋮ | ⋮ | ⋮ |
| | 41 | tracking | tracking | tracking | tracking |
| | ⋮ | ⋮ | ⋮ | ⋮ | ⋮ |
| | 36 | tracking | tracking | tracking | tracking |
| GP2 | 35 | tracking | tracking | tracking | tracking |
| | ⋮ | ⋮ | ⋮ | ⋮ | ⋮ |
| | 29 | tracking | tracking | tracking | tracking |
| | ⋮ | ⋮ | ⋮ | ⋮ | ⋮ |
| | 24 | tracking | tracking | tracking | tracking |
| GP1 | 23 | tracking | tracking | tracking | tracking |
| | ⋮ | ⋮ | ⋮ | ⋮ | ⋮ |
| | 17 | tracking | tracking | tracking | tracking |
| | ⋮ | ⋮ | ⋮ | ⋮ | ⋮ |
| | 12 | tracking | tracking | tracking | tracking |
| GP0 | 11 | tracking | tracking | tracking | tracking |
| | ⋮ | ⋮ | ⋮ | ⋮ | ⋮ |
| | 5 | tracking | tracking | tracking | tracking |
| | ⋮ | ⋮ | ⋮ | ⋮ | ⋮ |
| | 0 | tracking | tracking | tracking | tracking |

FIG. 27

|  | GP0 | GP1 | GP2 | GP3 | GP4 | GP5 | GP6 | GP7 |
|---|---|---|---|---|---|---|---|---|
| Selected WL | 6 | 18 | 30 | 42 | 54 | 66 | 78 | 90 |
| Obtained DAC value | +3 | 0 | -3 | -6 | -9 | -12 | -15 | -18 |

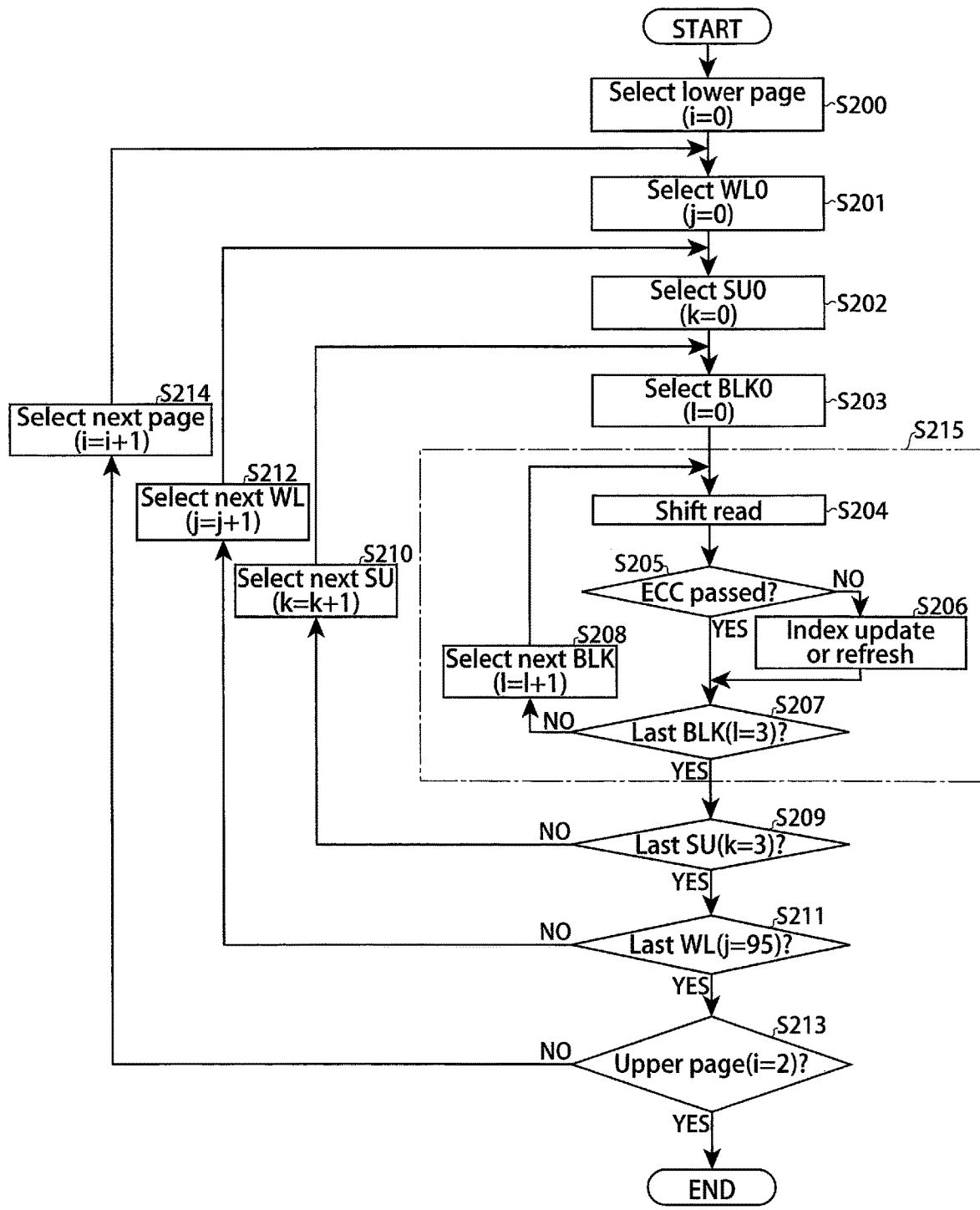
F I G. 33

| BLK0 | | | SU0 | SU1 | SU2 | SU3 |
|---|---|---|---|---|---|---|
| GP0 | WL0 | Lower | 1 | 2 | 3 | 4 |
| | | Middle | 17 | 18 | 19 | 20 |
| | | Upper | 33 | 34 | 35 | 36 |
| | WL1 | Lower | 5 | 6 | 7 | 8 |
| | | Middle | 21 | 22 | 23 | 24 |
| | | Upper | 37 | 38 | 39 | 40 |
| GP1 | WL2 | Lower | 9 | 10 | 11 | 12 |
| | | Middle | 25 | 26 | 27 | 28 |
| | | Upper | 41 | 42 | 43 | 44 |
| | WL3 | Lower | 13 | 14 | 15 | 16 |
| | | Middle | 29 | 30 | 31 | 32 |
| | | Upper | 45 | 46 | 47 | 48 |

↓

| BLK3 | | | SU0 | SU1 | SU2 | SU3 |
|---|---|---|---|---|---|---|
| GP0 | WL0 | Lower | 1 | 2 | 3 | 4 |
| | | Middle | 17 | 18 | 19 | 20 |
| | | Upper | 33 | 34 | 35 | 36 |
| | WL1 | Lower | 5 | 6 | 7 | 8 |
| | | Middle | 21 | 22 | 23 | 24 |
| | | Upper | 37 | 38 | 39 | 40 |
| GP1 | WL2 | Lower | 9 | 10 | 11 | 12 |
| | | Middle | 25 | 26 | 27 | 28 |
| | | Upper | 41 | 42 | 43 | 44 |
| | WL3 | Lower | 13 | 14 | 15 | 16 |
| | | Middle | 29 | 30 | 31 | 32 |
| | | Upper | 45 | 46 | 47 | 48 |

→

| BLK2 | | | SU0 | SU1 | SU2 | SU3 |
|---|---|---|---|---|---|---|
| GP0 | WL0 | Lower | 1 | 2 | 3 | 4 |
| | | Middle | 17 | 18 | 19 | 20 |
| | | Upper | 33 | 34 | 35 | 36 |
| | WL1 | Lower | 5 | 6 | 7 | 8 |
| | | Middle | 21 | 22 | 23 | 24 |
| | | Upper | 37 | 38 | 39 | 40 |
| GP1 | WL2 | Lower | 9 | 10 | 11 | 12 |
| | | Middle | 25 | 26 | 27 | 28 |
| | | Upper | 41 | 42 | 43 | 44 |
| | WL3 | Lower | 13 | 14 | 15 | 16 |
| | | Middle | 29 | 30 | 31 | 32 |
| | | Upper | 45 | 46 | 47 | 48 |

↑

| BLK1 | | | SU0 | SU1 | SU2 | SU3 |
|---|---|---|---|---|---|---|
| GP0 | WL0 | Lower | 1 | 2 | 3 | 4 |
| | | Middle | 17 | 18 | 19 | 20 |
| | | Upper | 33 | 34 | 35 | 36 |
| | WL1 | Lower | 5 | 6 | 7 | 8 |
| | | Middle | 21 | 22 | 23 | 24 |
| | | Upper | 37 | 38 | 39 | 40 |
| GP1 | WL2 | Lower | 9 | 10 | 11 | 12 |
| | | Middle | 25 | 26 | 27 | 28 |
| | | Upper | 41 | 42 | 43 | 44 |
| | WL3 | Lower | 13 | 14 | 15 | 16 |
| | | Middle | 29 | 30 | 31 | 32 |
| | | Upper | 45 | 46 | 47 | 48 |

F I G. 34A

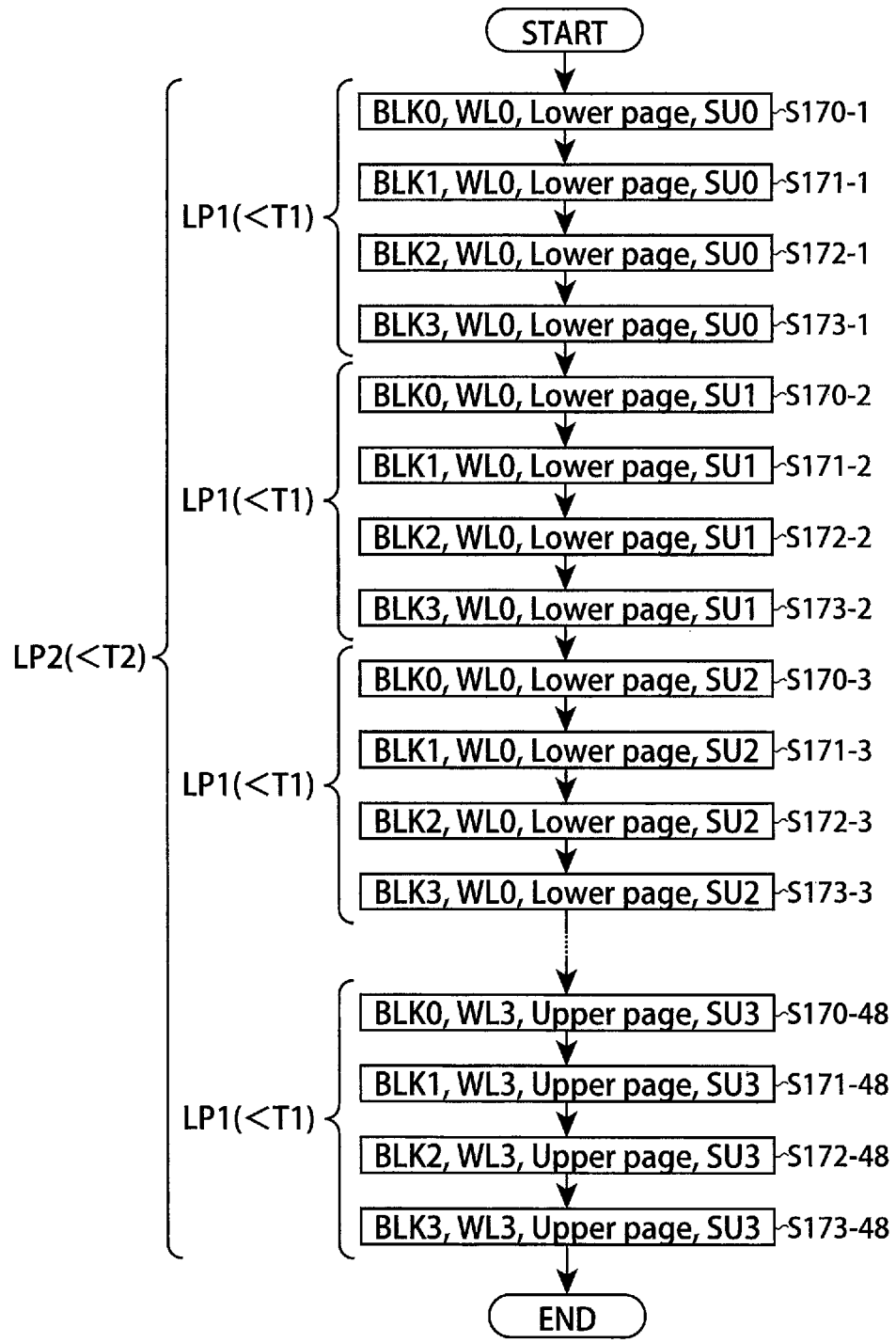
F I G. 34B

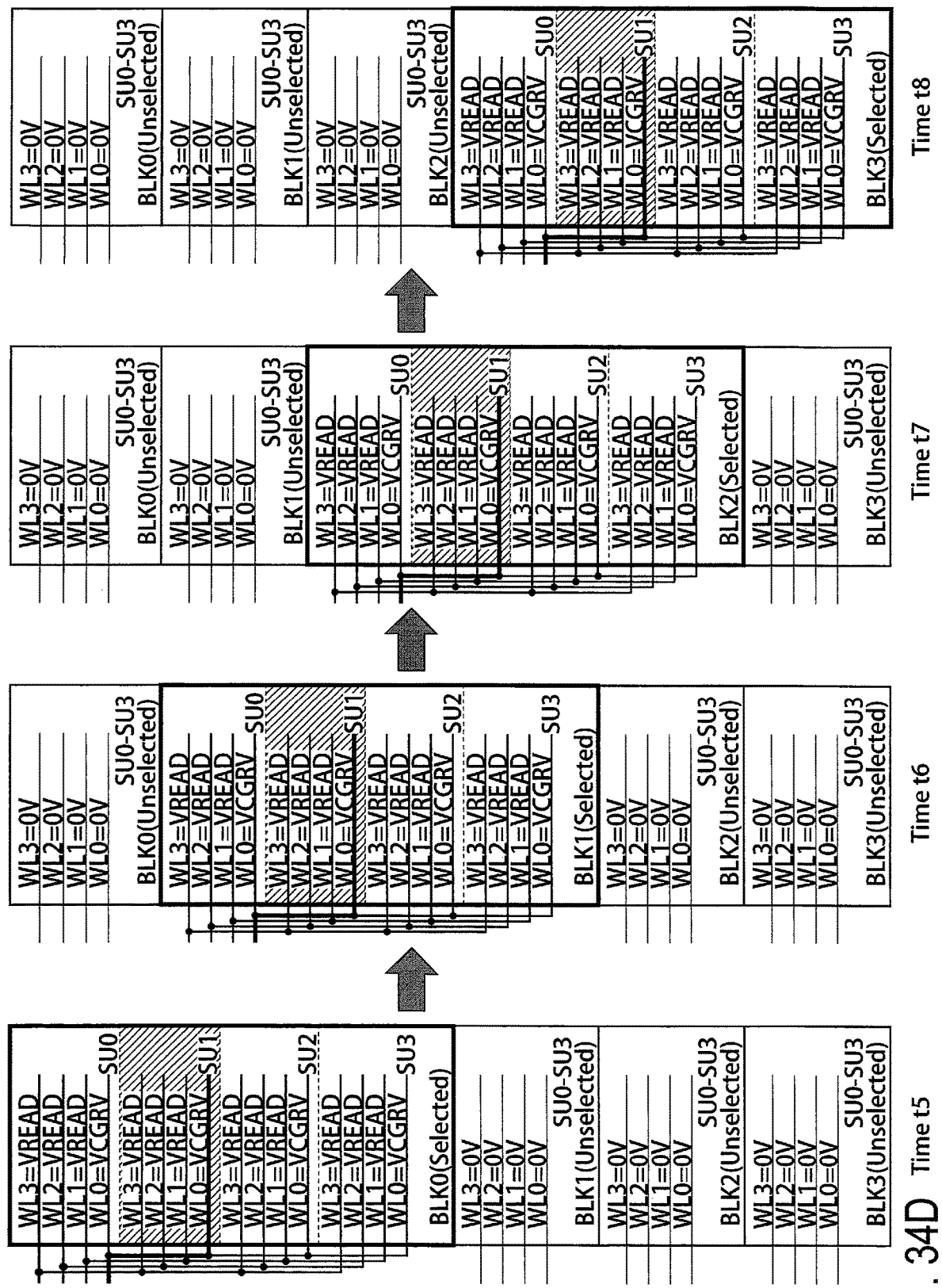
F I G. 34D

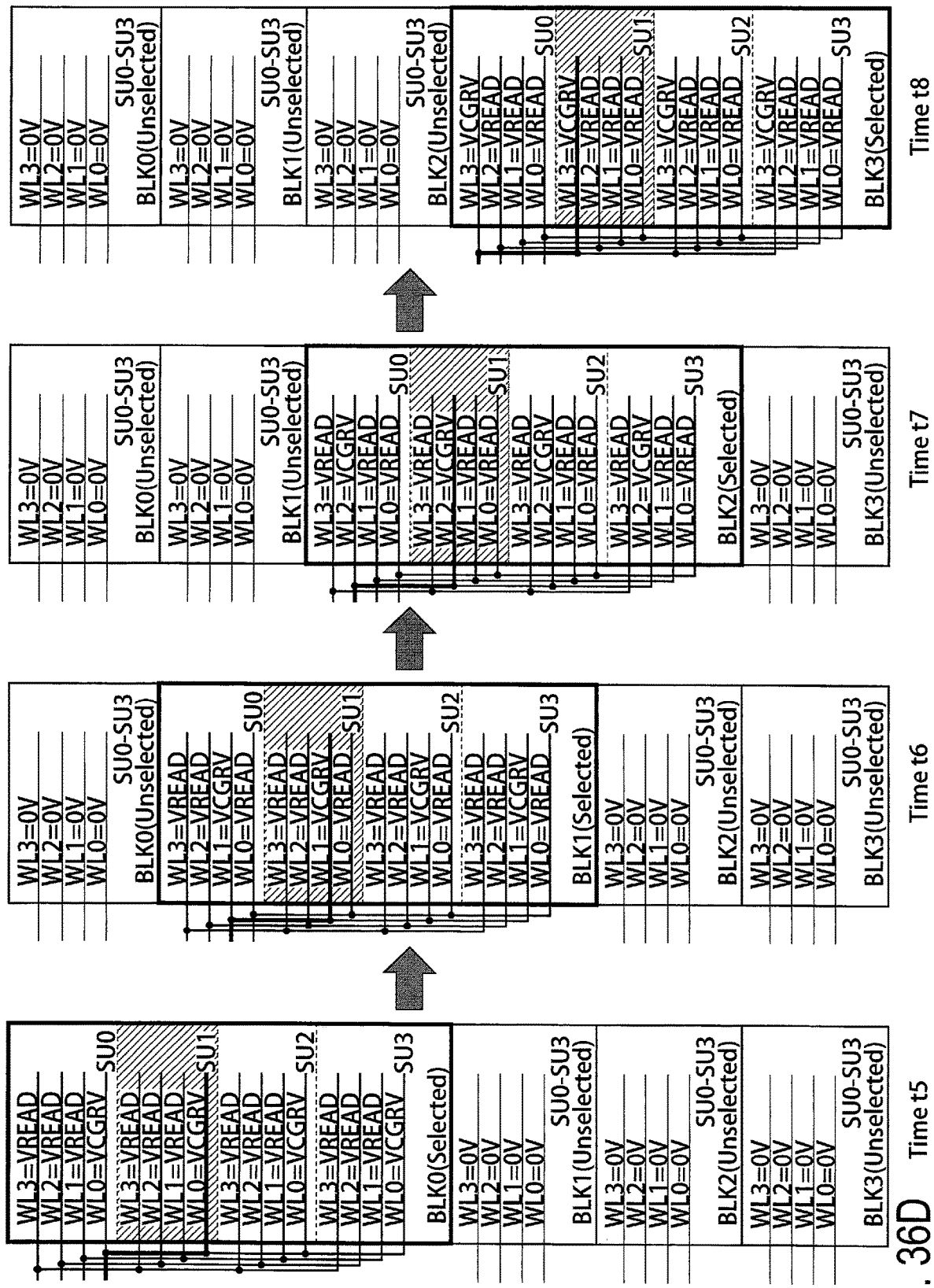
F I G. 36D

FIG. 38

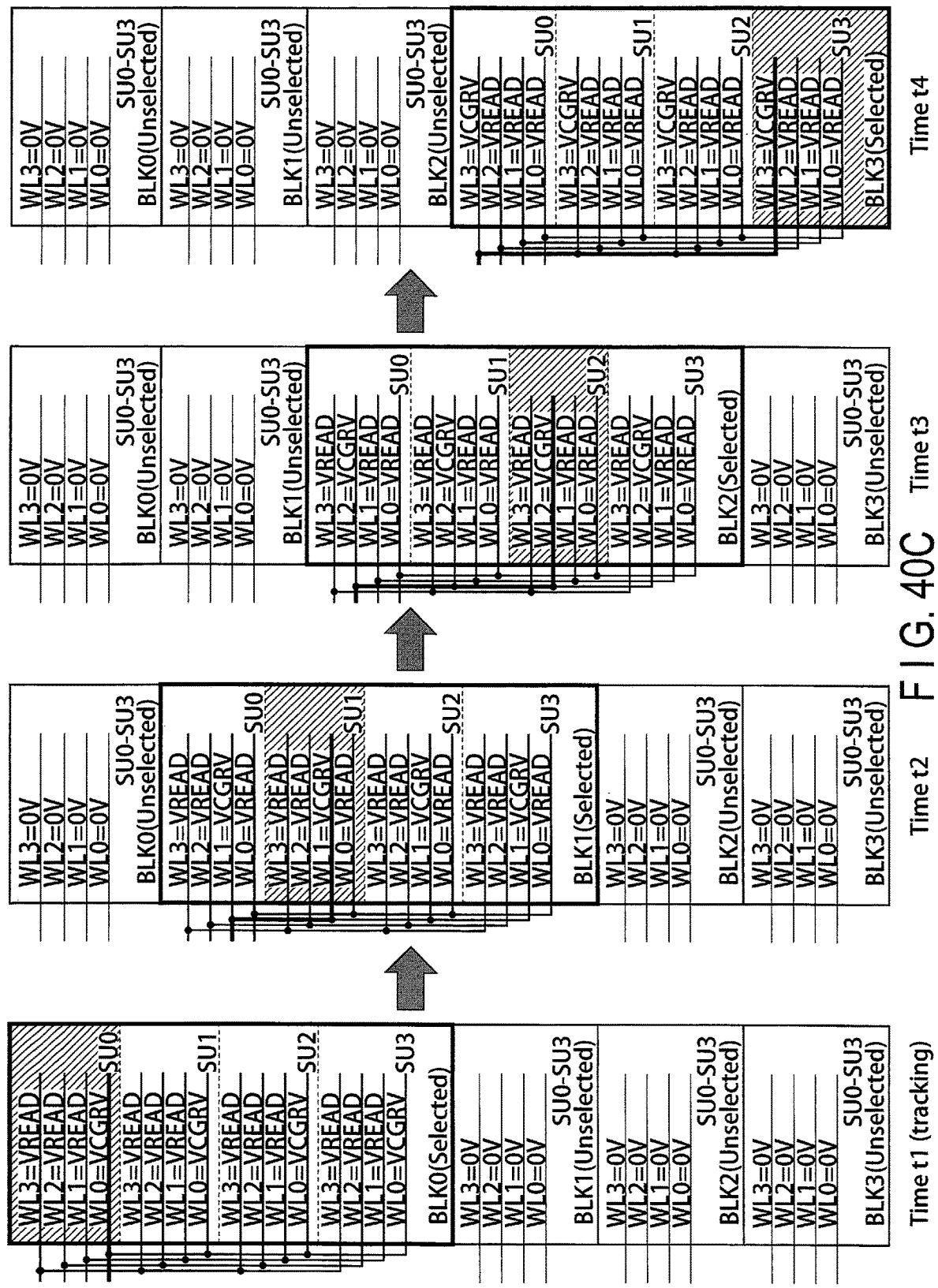
F I G. 40C

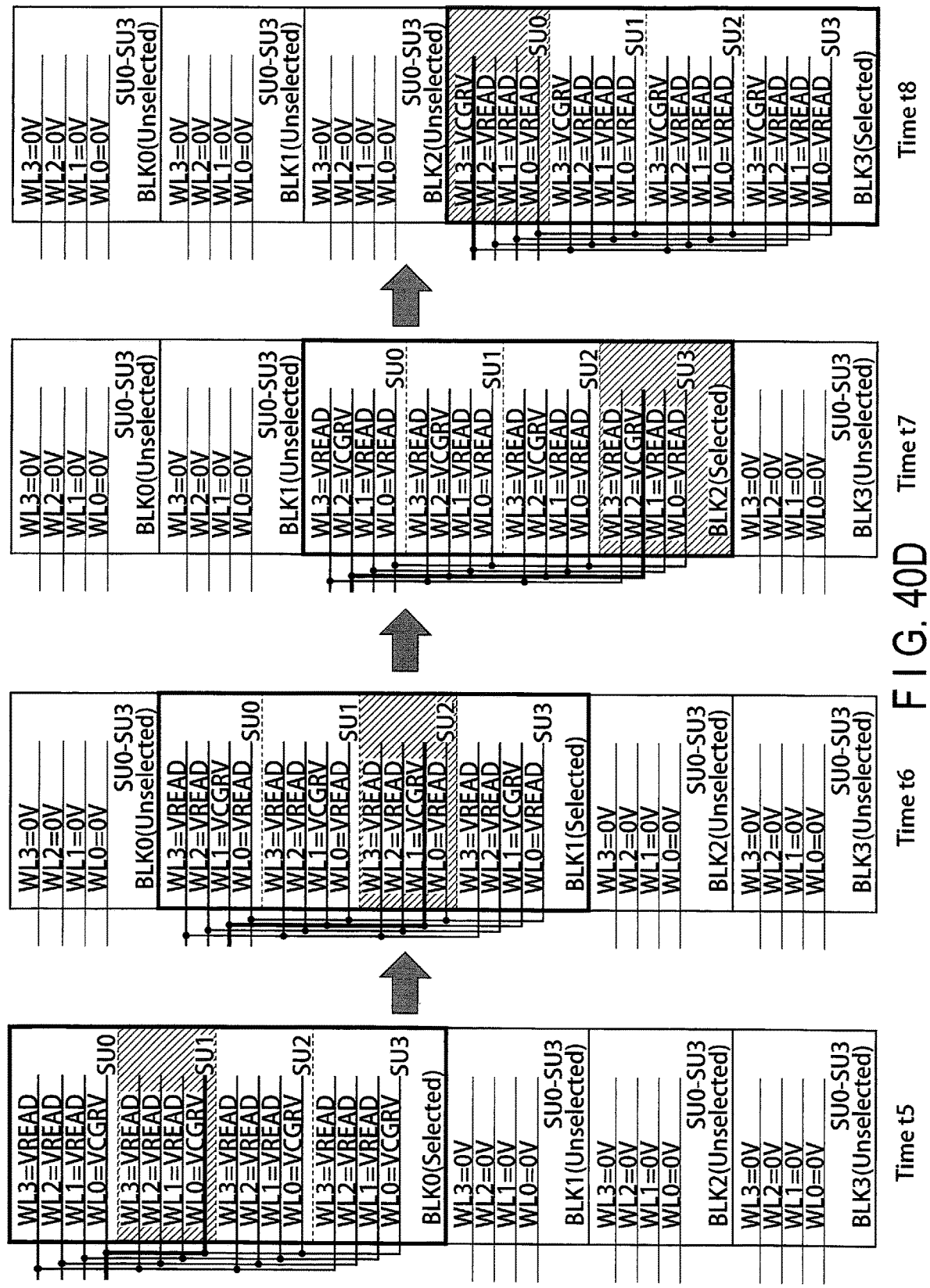
F I G. 40D

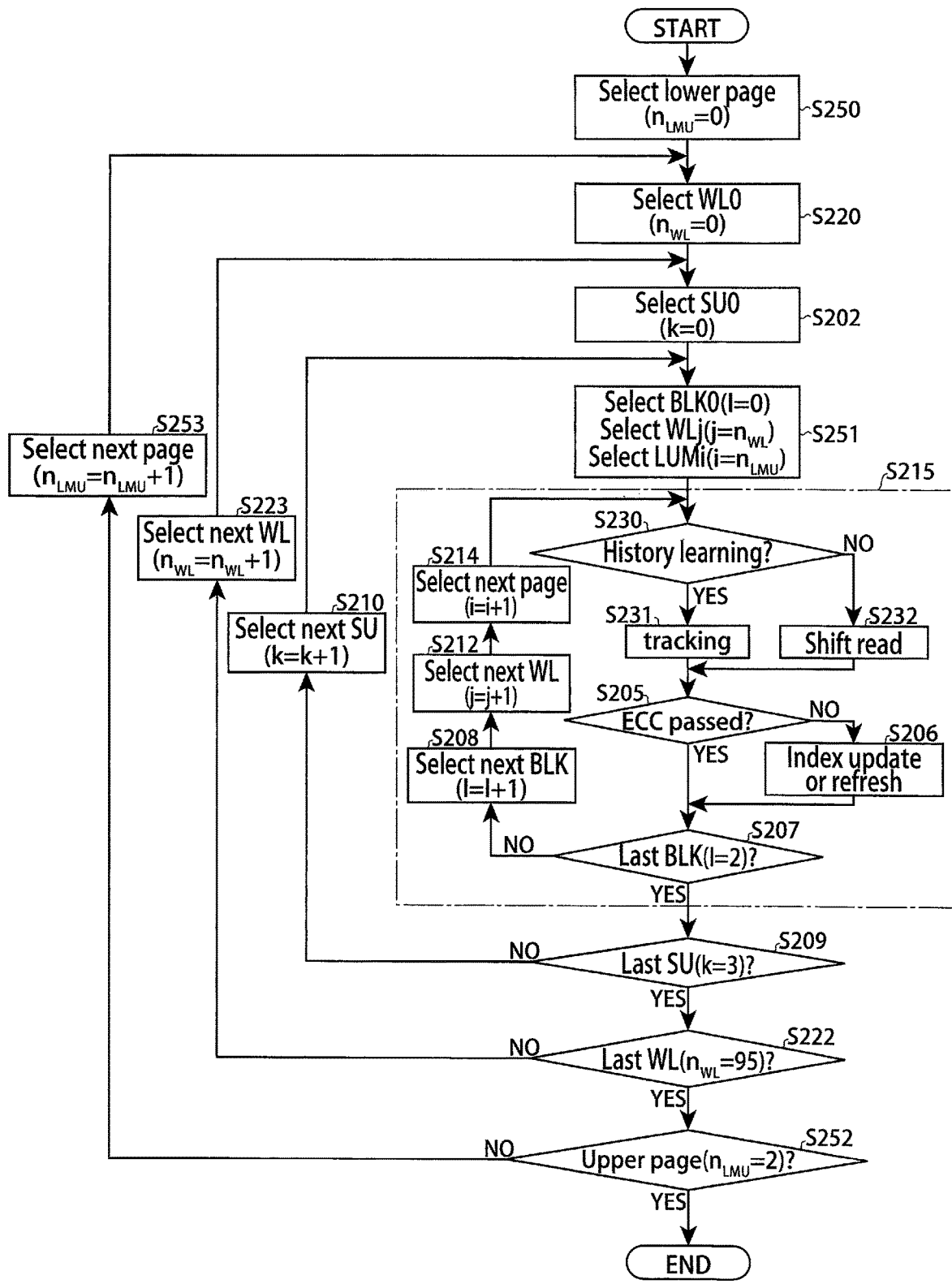
F I G. 41

FIG. 42A

MEMORY SYSTEM

CROSS-REFERENCE TO RELATED APPLICATIONS

This application is a continuation of and claims benefit under 35 U.S.C. § 120 to U.S. application Ser. No. 17/568,336, filed Jan. 4, 2022, which is a continuation of and claims benefit under 35 U.S.C. § 120 to U.S. application Ser. No. 17/131,400, filed Dec. 22, 2020 (now U.S. Pat. No. 11,222,703), which is a continuation of and claims benefit under 35 U.S.C. § 120 to U.S. application Ser. No. 16/297,789, filed Mar. 11, 2019 (now U.S. Pat. No. 10,910,067), and is based upon and claims the benefit of priority under 35 U.S.C. § 119 from Japanese Patent Application No. 2018-161899, filed Aug. 30, 2018, the entire contents of each of which are incorporated herein by reference.

FIELD

Embodiments described herein relate generally to a memory system.

BACKGROUND

A semiconductor memory in which memory cells are three-dimensionally arranged is known.

BRIEF DESCRIPTION OF THE DRAWINGS

FIG. 1 is a block diagram of a memory system according to the first embodiment;

FIG. 5 is a conceptual diagram of a shift table according to the first embodiment;

FIGS. 6 and 7 are conceptual diagrams of a history table according to the first embodiment;

FIGS. 9A and 9B are conceptual diagrams of a register according to the first embodiment;

FIGS. 10A and 10B are conceptual diagrams of the register according to the first embodiment;

FIG. 11A is a graph showing a threshold distribution of memory cells;

FIGS. 11B and 12 are conceptual diagrams showing a tracking operation according to the second embodiment;

FIG. 14A is a diagram showing a relationship between a read voltage and read data in the tracking operation according to the second embodiment;

FIG. 14B is a diagram showing a relationship between a read voltage and separation data in the tracking operation according to the second embodiment;

FIG. 15 is a diagram showing word lines and string units subjected to the tracking operation in the memory system according to the second embodiment;

FIG. 20 is a diagram showing word lines and string units subjected to the tracking operation in the memory system according to a modification of the second embodiment;

FIG. 21 is a flowchart of a patrol operation according to the modification the second embodiment;

FIG. 22 is a diagram showing word lines and string units subjected to the tracking operation in the memory system according to the third embodiment;

FIG. 25 is a diagram showing word lines and string units subjected to the tracking operation in the memory system according to the first modification of the third embodiment;

FIG. 27 is a diagram showing word lines and string units subjected to the tracking operation in the memory system according to the second modification of the third embodiment;

FIG. 33 is a flowchart of a patrol operation according to the fifth embodiment;

FIG. 34A shows diagrams showing a selection order of pages in the patrol operation according to the fifth embodiment;

FIG. 34B is a flowchart showing the selection order of pages in the patrol operation according to the fifth embodiment;

FIGS. 34C and 34D are conceptual diagrams of the memory cell array in the patrol operation according to the fifth embodiment;

FIGS. 36C and 36D are conceptual diagrams of the memory cell array in the first example of the patrol operation according to the sixth embodiment;

FIG. 38 shows diagrams showing the selection order of pages in the second example of the patrol operation according to the sixth embodiment;

FIGS. 40C, 40D, and 40E are conceptual diagrams of the memory cell array in the third example of the patrol operation according to the fifth embodiment;

FIG. 41 is a flowchart showing the fourth example of the patrol operation according to the sixth embodiment;

FIG. 42A shows diagrams showing the selection order of pages in the fourth example of the patrol operation according to the sixth embodiment.

DETAILED DESCRIPTION

Figure 2:
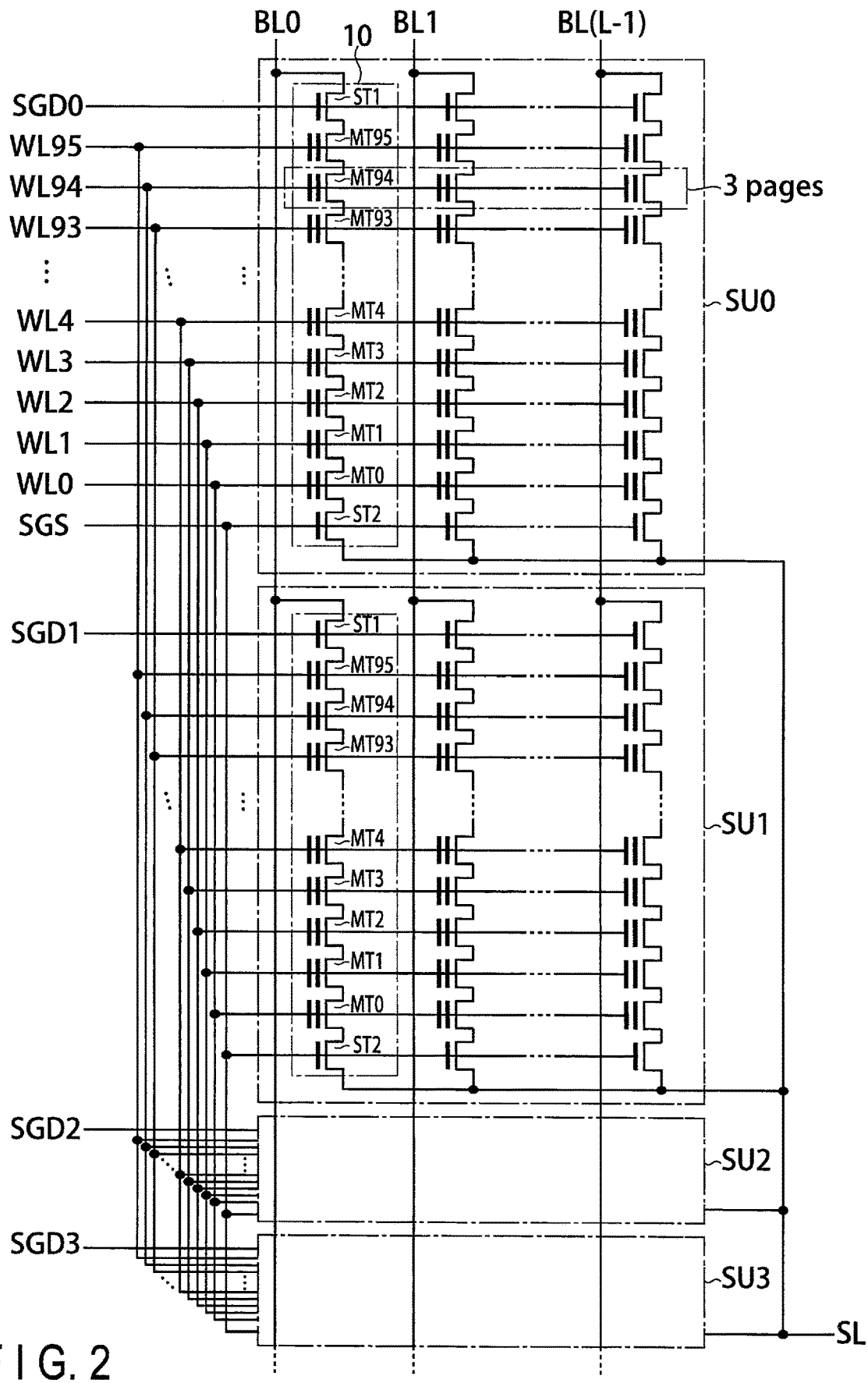
FIGS. 2 and 3 respectively are a circuit diagram and a sectional view of a block according to the first embodiment.

In general, according to one embodiment, a memory system includes: a semiconductor memory including a first word line, a second word line, a third word line, and a fourth word line arranged in order above a semiconductor substrate, and including a first memory cell, a second memory cell, a third memory cell, and a fourth memory cell coupled to the first to fourth word lines, respectively; and a controller configured to issue a first instruction to determine a threshold distribution of memory cells, and a second instruction to read data from a memory cell using a read voltage based on the threshold distribution. The controller is further configured to execute: a first operation, by selecting the first word line and issuing the first instruction, to obtain a first read voltage based on a threshold distribution of the first memory cell; a second operation, by selecting the second word line and issuing the second instruction designating a voltage based on the first read voltage as the read voltage, to read data from the second memory cell; a third operation, by selecting the third word line and issuing the first instruction, to obtain a second read voltage based on a threshold distribution of the third memory cell; and a fourth operation, by selecting the fourth word line and issuing the second instruction designating a voltage based on the second read voltage as the read voltage, to read data from the fourth memory cell.

1. First Embodiment

A memory system according to the first embodiment will be described. The following description will be provided while using, as an example, a memory system including a NAND flash memory as a semiconductor memory device.

1.1 Configuration 1.1.1 Overall Configuration of Memory System

The overall configuration of a memory system according to the present embodiment will be roughly described in relation to FIG. 1.

As shown in FIG. 1, a memory system 1 includes a NAND flash memory 100 and a controller 200. The NAND flash memory 100 and the controller 200 may be integrated into a single semiconductor device, for example. The semiconductor device is, for example, a memory card such as an SD™ card, or a solid state drive (SSD).

The NAND flash memory 100 includes a plurality of memory cells to non-volatilely store data. The controller 200 is coupled to the NAND flash memory 100 by a NAND bus, and is coupled to a host apparatus 300 by a host bus. The controller 200 controls the NAND flash memory 100, and accesses the NAND flash memory 100 in response to an instruction received from the host apparatus 300. The host apparatus 300 is, for example, a digital camera or a personal computer, and the host bus is, for example, a bus compliant with an SD™ interface. The NAND bus performs signal transmission/reception compliant with a NAND interface.

1.1.2 Configuration of Controller 200

Details of the configuration of the controller 200 will be described with continuous reference to FIG. 1. As shown in FIG. 1, the controller 200 includes a host interface circuit 210, an embedded memory (RAM) 220, a processor (CPU) 230, a buffer memory 240, a NAND interface circuit 250, and an error checking and correcting (ECC) circuit 260.

The host interface circuit 210 is coupled to the host apparatus 300 via the host bus to transfer instructions and data received from the host apparatus 300 respectively to the processor 230 and the buffer memory 240. The host interface circuit 210 also transfers data in the buffer memory 240 to the host apparatus 300 in response to an instruction from the processor 230.

The processor 230 controls the operation of the entire controller 200. For example, upon receipt of a read instruction from the host apparatus 300, the processor 230 issues, in response thereto, a read command to the NAND interface circuit 250. A similar process is performed for writing and erasing. The processor 230 also executes various processes, such as wear leveling, for managing the NAND flash memory 100.

The NAND interface circuit 250 is coupled to the NAND flash memory 100 via the NAND bus to communicate with the NAND flash memory 100. Based on instructions received from the processor 230, the NAND interface circuit 250 transmits various signals to, and receives various signals from, the NAND flash memory 100.

The buffer memory 240 temporarily holds write data and read data.

The embedded RAM 220 is, for example, a semiconductor memory, such as a DRAM or an SRAM, and is used as a work area of the processor 230. The embedded RAM 220 holds firmware for managing the NAND flash memory 100, and various management tables and the like, such as a shift table, and a history table, to be described later.

The ECC circuit 260 performs error detection and error correction processes on data stored in the NAND flash memory 100. Namely, the ECC circuit 260 provides the write data with parity bits generated by the error correction code in data writing, and decodes it in data reading.

1.1.3 Configuration of NAND Flash Memory 100

Next, a configuration of the NAND flash memory 100 will be described. As shown in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes a plurality of blocks BLK each including a plurality of nonvolatile memory cells associated with rows and columns. FIG. 1 shows four blocks BLK0 to BLK3, as an example. The memory cell array 110 stores data provided from the controller 200.

The row decoder 120 selects one of the blocks BLK0 to BLK3 based on a block address BA in the address register 150, and further selects a row in the selected block BLK.

The driver circuit 130 supplies a voltage to the selected block BLK via the row decoder 120 based on a page address PA in the address register 150.

In data reading, the sense amplifier 140 senses data read from the memory cell array 110, and performs a necessary arithmetic operation. Then, the sense amplifier 140 outputs the data DAT to the controller 200. In data writing, the sense amplifier 140 transfers write data DAT received from the controller 200 to the memory cell array 110.

The address register 150 holds an address ADD received from the controller 200. The address ADD includes the above-mentioned block address BA and page address PA. The command register 160 holds a command CMD received from the controller 200.

The sequencer 170 controls the operation of the entire NAND flash memory 100 based on the command CMD held in the command register 160.

Next, a configuration of the block BLK will be described in relation to FIG. 2. As shown in FIG. 2, the block BLK includes, for example, four string units SU (SU0 to SU3). Each string unit SU includes a plurality of NAND strings 10.

Each NAND string 10 includes, for example, ninety six memory cell transistors MT (MT0 to MT95), and two selection transistors ST1 and ST2. Each memory cell transistor MT includes a control gate and a charge accumulation layer, and non-volatilely holds data. The memory cell transistors MT are coupled in series between the source of selection transistor ST1 and the drain of selection transistor ST2.

Dummy transistors may be provided between the selection transistor ST2 and the memory cell transistor MT0, and between the selection transistor ST1 and the memory cell transistor MT95. Like the memory cell transistor MT, each dummy transistor includes a control gate and a charge accumulation layer. However, unlike the memory cell transistor MT, the dummy transistor is not used for holding data, but functions as a mere current path in the NAND string 10. Namely, the threshold of the dummy transistor is set at a low value so that the dummy transistor is always turned on in read operations and write operations. The threshold of the dummy transistor may be set at a predetermined value by performing a write operation on the dummy transistor and controlling the amount of charge in the charge accumulation layer.

The gates of selection transistors ST1 in string units SU0 to SU3 are coupled to respective selection gate lines SGD0 to SGD3. On the other hand, the gates of selection transistors ST2 in string units SU0 to SU3 are coupled in common to, for example, selection gate line SGS. The gates of selection transistors ST2 in string units SU0 to SU3 may of course be coupled to respective different selection gate lines SGS0 to SGS3. The control gates of the memory cell transistors MT0 to MT95 in the same block BLK are coupled in common to respective word lines WL0 to WL95.

The drains of selection transistors ST1 of the NAND strings 10 in the same column in the memory cell array 110 are coupled in common to a bit line BL (BL0 to BL(L−1), where (L−1) is a natural number equal to or larger than 2). Namely, the NAND strings 10 in the same column of a plurality of blocks BLK are coupled in common to a bit line BL. Moreover, the sources of a plurality of selection transistors ST2 are coupled in common to a source line SL.

String unit SU includes a plurality of NAND strings 10 coupled to different bit lines BL and coupled to the same selection gate line SGD. The block BLK includes a plurality of string units SU sharing word lines WL. The memory cell array 110 includes a plurality of blocks BLK sharing bit lines BL.

Figure 3:
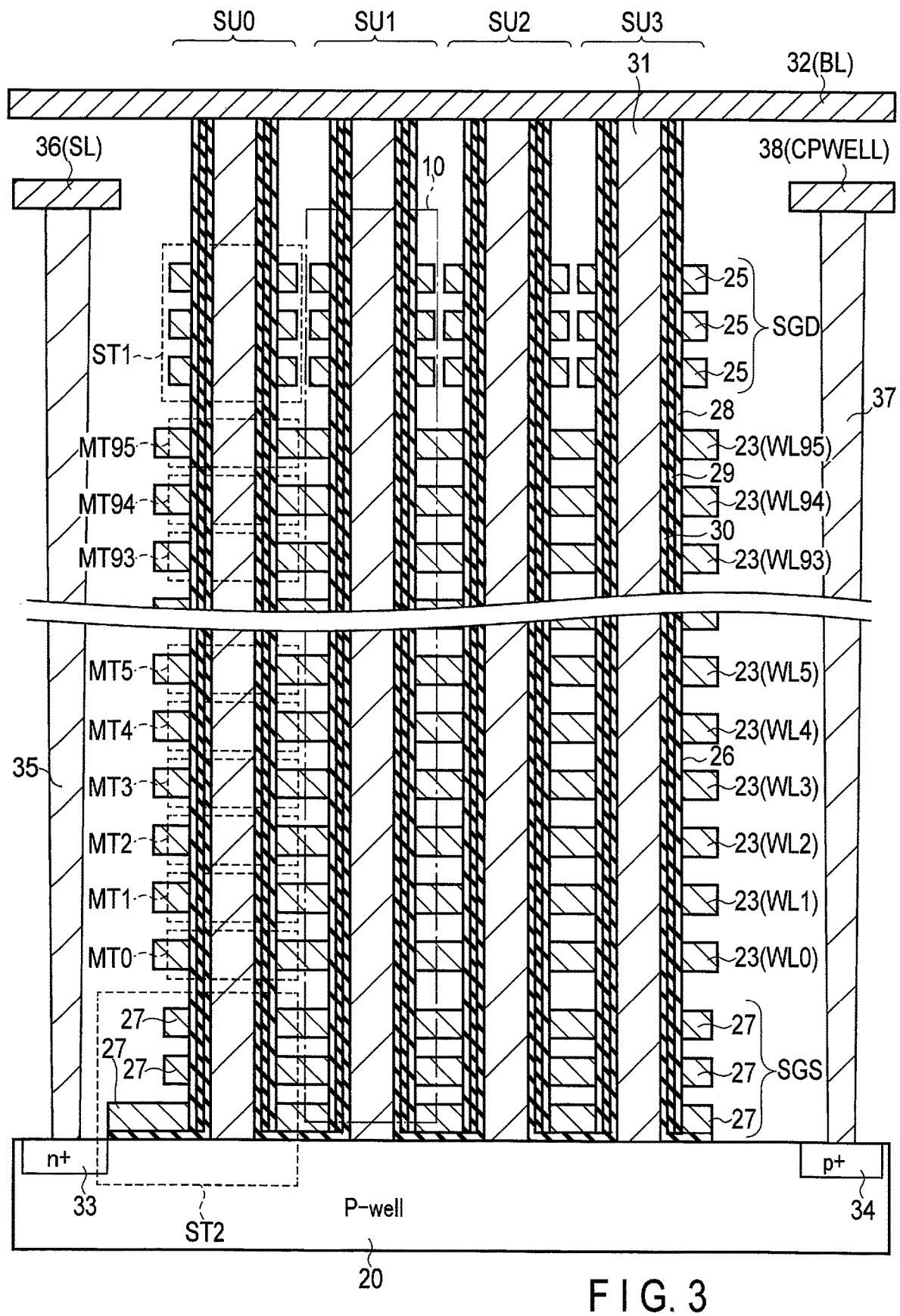

FIG. 3 is a sectional view of a partial region of the block BLK. As shown in FIG. 3, a plurality of NAND strings 10 are formed on a p-type well region 20. Namely, three interconnect layers 27 functioning, for example, as selection gate line SGS, ninety six interconnect layers 23 functioning as word lines WL0 to WL95, and three interconnect layers 25 functioning, for example, as selection gate line SGD, are sequentially stacked above the well region 20. Insulating films (not shown) are formed between the stacked interconnect layers.

A pillar-shaped conductor 31 extending through interconnect layers 25, 23, and 27 to reach the well region 20 is formed. A gate insulating film 30, a charge accumulation layer (insulating film) 29, and a block insulating film 28 are sequentially formed on the side surface of the conductor 31, thereby forming memory cell transistors MT, and selection transistors ST1 and ST2. The conductor 31 functions as a current path of the NAND string 10, and is used as a region in which a channel of each transistor is formed. The upper end of the conductor 31 is coupled to a metal interconnect layer 32 that functions as a bit line BL.

In a surface region of the well region 20, an $n^+$-type impurity diffusion layer 33 is formed. A contact plug 35 is formed on the diffusion layer 33, and is coupled to a metal interconnect layer 36 that functions as a source line SL. In the surface region of the well region 20, a p-type impurity diffusion layer 34 is also formed. A contact plug 37 is formed on the diffusion layer 34, and is coupled to a metal interconnect layer 38 that functions as a well interconnect CPWELL. The well interconnect CPWELL is used to provide a potential to the conductor 31 via the well region 20.

A plurality of configurations as described above are arranged in the depth direction of the sheet of FIG. 3, and a set of a plurality of NAND strings 10 aligned in the depth direction form a string unit SU.

In the present embodiment, one memory cell transistor MT can hold, for example, 3-bit data. The bits of the 3-bit data will be referred to as a lower bit, a middle bit, and an upper bit in ascending order from the least significant bit. A set of lower bits held in memory cells coupled to the same word line will be referred to as a lower page, a set of middle bits will be referred to as a middle page, and a set of upper bits will be referred to as an upper page. Namely, three pages are assigned to one word line WL, and the block BLK including ninety six word lines WL has a capacity of 288 pages. In other words, "page" may also be defined as a part of a memory space formed by memory cells coupled to the same word line. Data writing and data reading may be performed in units of pages.

Figure 4:
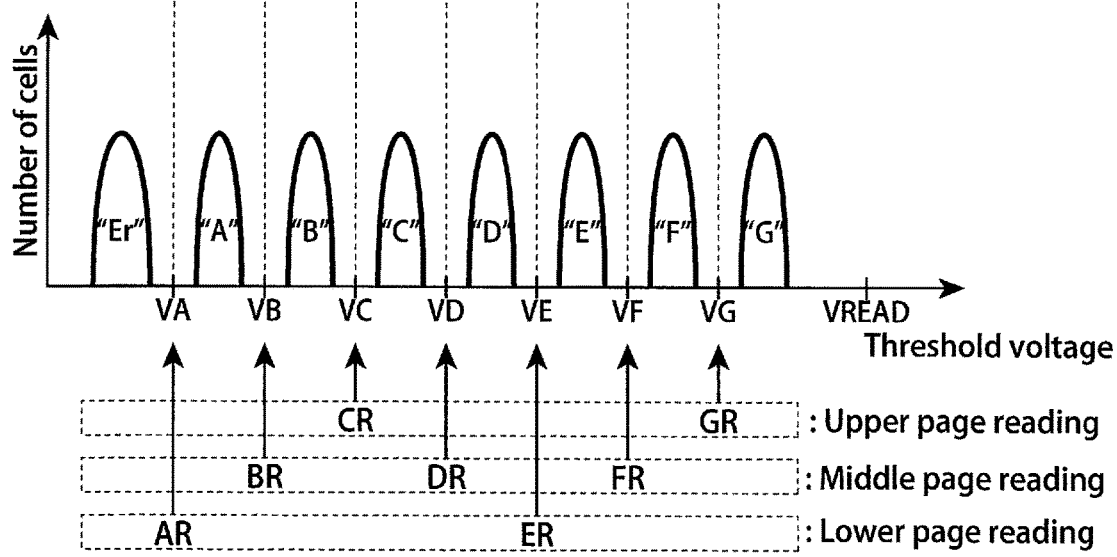
FIG. 4 is a graph showing a threshold distribution of memory cells according to the first embodiment.

FIG. 4 is a diagram showing storable data, threshold distribution, and voltages used in reading of memory cell transistors MT.

As shown in FIG. 4, the memory cell transistors MT may take eight states in accordance with their threshold voltages. The eight states will be referred to as an "Er" state, "A" state, "B" state, "C" state, . . . , and "G" state in ascending order of threshold voltage.

The threshold voltages of memory cell transistors MT in the "Er" state are lower than voltage VA, and the "Er" state corresponds to a data-erased state. The threshold voltages of memory cell transistors MT in the "A" state are equal to or higher than voltage VA, and lower than voltage VB (>VA). The threshold voltages of memory cell transistors MT in the "B" state are equal to or higher than voltage VB, and lower than voltage VC (>VB). The threshold voltages of memory cell transistors MT in the "C" state are equal to or higher than voltage VC and lower than voltage VD (>VC). The threshold voltages of memory cell transistors MT in the "D" state are equal to or higher than voltage VD and lower than voltage VE (>VD). The threshold voltages of memory cell transistors MT in the "E" state are equal to or higher than voltage VE and lower than voltage VF (>VE). The threshold voltages of memory cell transistors MT in the "F" state are equal to or higher than voltage VF and lower than voltage VG (>VF). The threshold voltages of the memory cell transistors MT in the "G" state are equal to or higher than voltage VG and lower than voltage VREAD. Of the eight states accordingly distributed, the "G" state is the highest threshold voltage state. Note that voltage VREAD is a voltage applied to non-selected word lines in read operations, and turns on memory cell transistors MT regardless of held data.

The above-described threshold distribution is obtained by writing 3-bit (3-page) data constituted by the above-mentioned lower bit, middle bit, and upper bit. The relationship between the above eight states and the lower bit, middle bit, and upper bit is as follows.

"Er" state: "111" (in the order of "upper/middle/lower")
"A" state: "110"
"B" state: "100"
"C" state: "000"
"D" state: "010"
"E" state: "011"
"F" state: "001"
"G" state: "101"

Only one of the three bits is different between data corresponding to adjacent two states in the threshold distribution.

Accordingly, when the lower bit is read, a voltage corresponding to the boundary where the value ("0" or "1") of the lower bit changes may be used; this also applies when reading the middle bit and the upper bit.

Namely, as shown in FIG. 4, in lower page reading, voltage VA, which distinguishes between the "Er" state and the "A" state, and voltage VE, which distinguishes between the "D" state and the "E" state, are used as read voltages. The read operations using voltages VA and VE will be referred to as read operations AR and ER, respectively.

In middle page reading, voltage VB, which distinguishes between the "A" state and the "B" state, voltage VD, which distinguishes between the "C" state and the "D" state, and voltage VF, which distinguishes between the "E" state and the "F" state, are used as read voltages. The read operations using voltages VB, VD, and VF will be referred to as read operations BR, DR, and FR, respectively.

In upper page reading, voltage VC, which distinguishes between the "B" state and the "C" state, and voltage VG, which distinguishes between the "F" state and the "G" state, are used as read voltages. The read operations using voltages VC and VG will be referred to as read operations CR and GR, respectively.

Data erasing can be performed in units of blocks BLK, or smaller units. An erase method is described in, for example, U.S. patent application Ser. No. 13/235,389 filed on Sep. 18, 2011, titled "NONVOLATILE SEMICONDUCTOR MEMORY DEVICE". An erase method is also described in U.S. patent application Ser. No. 12/694,690 filed on Jan. 27, 2010, titled "NON-VOLATILE SEMICONDUCTOR STORAGE DEVICE". Furthermore, an erase method is described in U.S. patent application Ser. No. 13/483,610 filed on May 30, 2012, titled "NONVOLATILE SEMICONDUCTOR MEMORY DEVICE AND DATA ERASE METHOD THEREOF". The entire contents of those patent applications are incorporated herein by reference.

The memory cell array 110 may have other configurations. A configuration of the memory cell array 110 is described in, for example, U.S. patent application Ser. No. 12/407,403 filed on Mar. 19, 2009, titled "THREE DIMENSIONAL STACKED NONVOLATILE SEMICONDUCTOR MEMORY". A configuration of the memory cell array 110 is also described in U.S. patent application Ser. No. 12/406,524 filed on Mar. 18, 2009, titled "THREE DIMENSIONAL STACKED NONVOLATILE SEMICONDUCTOR MEMORY", U.S. patent application Ser. No. 12/679,991 filed on Mar. 25, 2010, titled "NON-VOLATILE SEMICONDUCTOR STORAGE DEVICE AND METHOD OF MANUFACTURING THE SAME", U.S. patent application Ser. No. 12/532,030 filed on Mar. 23, 2009, titled "SEMICONDUCTOR MEMORY AND METHOD FOR MANUFACTURING SAME". The entire contents of those patent applications are incorporated herein by reference. Alternatively, the configuration may be such that peripheral circuits such as the row decoder 120 and the sense amplifier 140 are formed on the semiconductor substrate, source line SL is formed thereabove, and the NAND string 10 shown in FIG. 3 is formed on the source line SL.

1.1.4 Shift Table

Next, a shift table will be described. As mentioned above, the controller 200 holds a shift table in, for example, the RAM 220. A concept of the shift table will be described using FIG. 5. FIG. 5 is a conceptual diagram of an example of the shift table.

As shown in FIG. 5, the shift table includes a plurality of (twelve in the example of FIG. 5) entries. The entries are sequentially assigned with indexes "1" to "12". Each entry holds information indicating a shift amount of a read voltage applied to a selected word line WL in each of read operations AR, BR, CR, . . . , and GR.

The shift amount will be described below. The threshold distributions corresponding to the "Er" state, "A" state, . . . , and "G" state described in relation to FIG. 4 are apart from one another. Accordingly, the states can be distinguished from one another by voltages VA, VB, . . . , and VG. However, the width of the threshold distribution may be increased by, in addition to the interference with an adjacent cell, the electron trapping or detrapping to the charge accumulation layer resulting from various causes (which is referred to as an interference effect). For example, threshold distributions may be shifted to the low voltage side by the interference effect with an adjacent cell after time has elapsed from data writing. This shift amount increases as the elapsed time increases and as the number of writes in the block increases. In contrast, threshold distributions may be shifted to the high voltage side when data is read or written from other memory cell transistors MT. This shift amount increases as the voltage applied to the word line WL is larger and as the applying duration is longer.

If the threshold distributions change due to the interference effect as described above, data may not be correctly read at the above-mentioned voltages VA, VB, . . . , and VG. Specifically, the number of error bits included in read data exceeds the number of bits that can be corrected by the ECC circuit 260. In such a case, the controller 200 shifts the read voltages from voltages VA, VB, . . . , and VG (which are referred to as default voltages), and retries a data read. This is called a shift read. Information indicating shift amounts $\Delta V$ from default voltages used for the shift read is held in the shift table shown in FIG. 5.

The shift table of this example indicates shift amounts $\Delta VAi, \Delta VBi, \ldots,$ and $\Delta VGi$ (where i is an index, i.e., one of natural numbers 1 to 12; which will be collectively referred to as shift amounts $\Delta V$ when not distinguished from one another) for respective read operations AR, BR, ..., and OR. The shift amounts $\Delta VAi, \Delta VBi, \ldots,$ and $\Delta VGi$ corresponding to an index i may be all different values, partly the same, or all the same. Those shift amounts $\Delta V$ are set at appropriate values as suited by, for example, the controller 200. For example, the shift amount $\Delta V$ corresponding to each index of the shift table may be overwritten by the controller 200, or indexes may be added by the controller 200.

The shift table of this example corresponds to the case where when the influence of the interference effect is small, the applied index value is small, for example. Namely, the shift amounts $\Delta V$ corresponding to index=1 (i.e., $\Delta VA1, \Delta VB1, \ldots,$ and $\Delta VG1$) are optimized for the case where the influence of the interference effect is the smallest. In contrast, the shift amounts $\Delta V$ corresponding to index=12 (i.e., $\Delta VA12, \Delta VB12, \ldots,$ and $\Delta VG12$) are optimized for the case where the influence of the interference effect is the largest. Of course, the shift table is not limited to such an example, and the order of indexes is not limited to this example.

The shift table configured as described above is held in, for example, one block BLK of the NAND flash memory 100. Then, the shift table is read by the controller 200, for example, immediately after the power of the memory system 1 is turned on, and is held in, for example, the RAM 220. When the power of the memory system 1 is shut off, the shift table held in, for example, the RAM 220 may be written in one block BLK of the NAND flash memory 100. However, it may adopt the configuration in which the shift table is written in the ROM fuse of the NAND flash memory 100 and the shift table itself is not updated after shipment.

1.1.5 History Table

Figure 6:
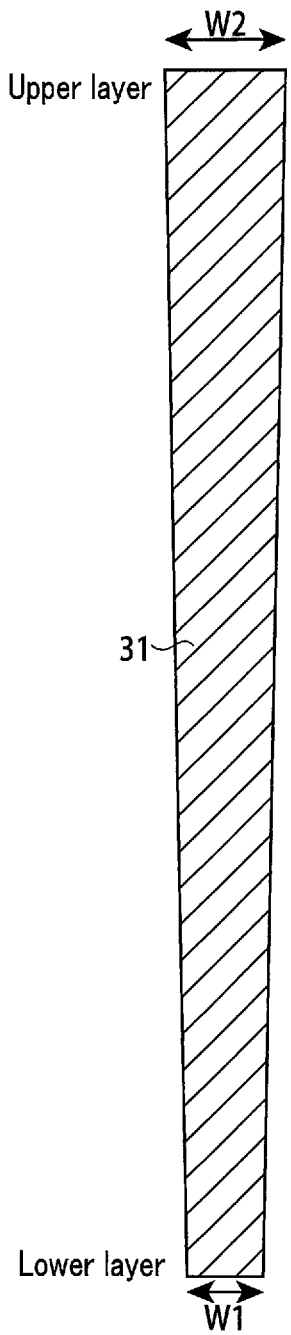

The controller 200 further holds a history table. The history table indicates which shift amounts should be used for word lines WL0 to WL95 of the shift amounts in the shift table described in relation to FIG. 5. Two examples of the history table are shown in FIGS. 6 and 7. FIGS. 6 and 7 are the conceptual diagrams of the history table, and show the sectional view of a silicon pillar 31; in the figures, the position where the word lines WL are represented corresponds to the height of the silicon pillar 31.

First Example

First, the first example of the history table will be described in relation to FIG. 6. As shown in FIG. 6, the silicon pillar 31 has a diameter that decreases toward the lower layer, and if the diameter at the lower end is defined as W1 while the diameter at the upper end is defined as W2, the relationship is W2>W1.

In the history table, a plurality of word lines WL are grouped. In this example, twelve word lines WL are grouped sequentially, and an index is assigned to each group. Specifically, word lines WL0 to WL11 belong to word line group GP0, word lines WL12 to WL23 belong to word line group GP1, word lines WL24 to WL35 belong to word line group GP2, and in a similar manner, last word lines WL84 to WL95 belong to word line group GP7.

Index "5" is assigned to word line group GP0. This means that when read voltages are applied to one of word lines WL0 to WL11 belonging to group GP0, the shift amounts ($\Delta VA5, \Delta VB5, \ldots,$ and $\Delta VG5$) corresponding to index=5 in the shift table shown in FIG. 5 are applied to the default values. In a similar manner, index "3" is assigned to word line group GP1, index "2" is assigned to word line group GP2, and index "3" is assigned to word line group GP7.

The shift amounts designated by the history table are set in the NAND flash memory 100 by the controller 200 by use of, for example, a set feature command. Details thereof will be explained later in item 1.2.

Second Example

Next, the second example of the history table will be described using FIG. 7. The second example relates to the way of grouping different from that in the first example. As shown in FIG. 7, the silicon pillar 31 has the same shape as that in the first example.

Word lines WL0 to WL3 belong to word line group GP0, word lines WL4 to WL25 belong to word line group GP1, word lines WL26 to WL47 belong to word line group GP2, and word lines WL48 to WL69 belong to word line group GP3. Furthermore, word lines WL70 to WL91 belong to word line group GP4, and word lines WL92 to WL95 belong to word line group GP5.

Namely, in this example, unlike the first example, the number of word lines WL belonging is different in word line groups GP. Specifically, four word lines WL are assigned to each of word line groups GP0 and GP5 while twenty two word lines WL are assigned to each of word line groups GP1 to GP4.

The reason for assigning word lines WL in the above-described manner is that there is a high possibility that the memory cell transistors arranged at the upper end portion (word lines WL92 to WL95) and the lower end portion (word lines WL0 to WL3) of the silicon pillar 31 have comparatively significantly different characteristics from those of memory cell transistors arranged at the other areas. Thus, in this example, the word lines WL in the areas where characteristics are considered to significantly change are grouped in a fine manner while the word lines WL in the other areas are grouped in a rough manner. Thereby, it is possible to conform to the position dependence of the characteristics of the memory cell transistors.

1.2 Read Operation

Figure 8:
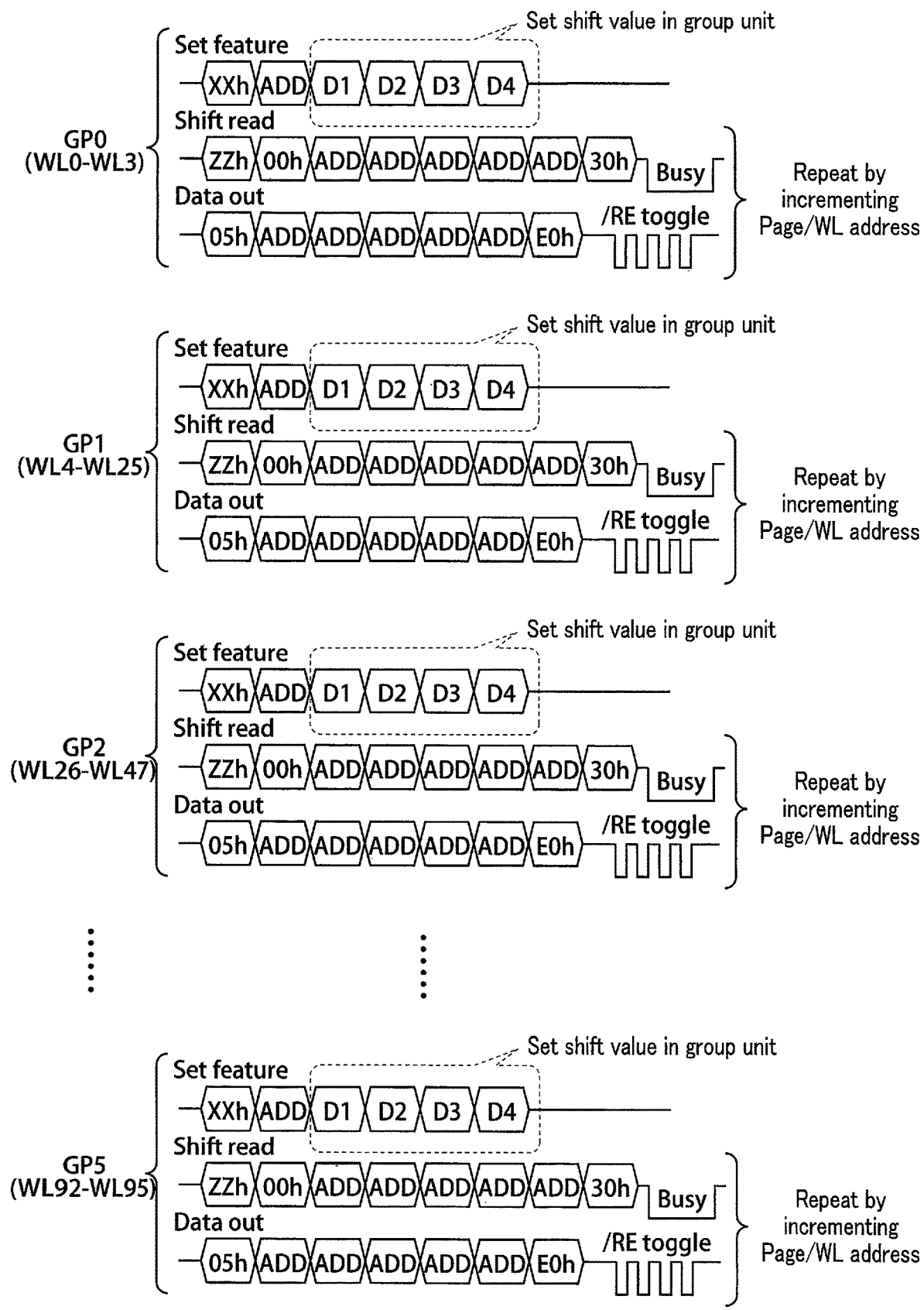
FIG. 8 is a command sequence in the data read operation according to the first embodiment.

Next, the data read operation according to the present embodiment will be described with reference to FIG. 8. FIG. 8 shows the case where word lines WL0 to WL95 are sequentially selected in the grouping described in relation to FIG. 7, and shows the case where word lines WL0 to WL95 are selected for the first time after the power of the NAND flash memory 100 is turned on.

The processor 230, for example, of the controller 200 in receipt of the data request from the host apparatus 300 first refers to the shift table read to the RAM 220. The processor 230 thereby grasps shift amounts to be applied to each word line WL of each block BLK. The controller 200 issues a set feature command, and sets the grasped shift amounts in the NAND flash memory 100.

Namely, as shown in FIG. 8, a set feature command is first issued for word line group GP0. The set feature command is a command that can change various settings, such as a voltage and timing, etc. in the NAND flash memory 100.

The command sequence of the set feature is as follows.

<XXh><ADD><D1><D2><D3><D4>

In this command sequence, command "XXh" is a command that announces a setting change to the NAND flash memory 100. Address "ADD" is an address that designates a register that holds setting values to be changed by the set feature command in the NAND flash memory 100. After that, the controller 200 transmits data over four cycles (data "D1" to "D4"). The data "D1" to "D4" includes information on the shift amounts to be applied to group GP0. In the example of FIG. 7, the data "D1" to "D4" includes information on the shift amounts corresponding to index="6".

As a result, information as shown in FIG. 9A is held in the designated register in the NAND flash memory 100. FIG. 9A is a conceptual diagram of the register. Namely, the register includes a plurality of entries, and in the example of FIG. 9A, the register includes two entries. One of the entries holds shift amounts $\Delta v$ used to perform read operations AR, BR, . . . , and GR on word line group GP0 of block BLK0. Thereafter, when group GP0 is selected, the driver 130 of the NAND flash memory 100 applies, as read voltages VCGRV, voltages obtained by adding the shift amounts $\Delta V$ held in the register to the default voltages VA, VB, . . . , and VG for reading, to a selected word line WL via the row decoder 120. Alternatively, a voltage generator whose illustration is omitted in FIG. 1 generates voltages VCGRV in accordance with information in the register.

Then, the controller 200 issues a shift read command as shown in FIG. 8. The command sequence of the shift read is as follows.

<ZZh><00h><ADD><ADD><ADD><ADD><ADD><30h>

In this command sequence, command "ZZh" is a command that announces a shift read to the NAND flash memory 100. Command "00h" is a command that notifies the NAND flash memory 100 that an address will be transmitted. Address "ADD" transmitted over five circles designates a block BLK, word line WL, and page to be read. The address to be designated first is, in this example, the lower page of word line WL0. Upon receipt of command "30h", the NAND flash memory 100 changes to the busy state, and executes data read from the memory cell array 110. As described above, the NAND flash memory 100 applies, to the selected word line WL, read voltages VCGRV shifted by the shift amounts $\Delta V$ designated by the set feature command. For example, when the lower page of word line WL0 is read, voltages (VA+$\Delta$VA6) and (VE+$\Delta$VE6) are used as read voltages VCGRV.

When the NAND flash memory 100 returns to the ready state from the busy state, the controller 200 issues a data output command. As shown in FIG. 8, the command sequence for data output is as follows.

<05h><ADD><ADD><ADD><ADD><ADD><E0h>

In this command sequence, command "05h" is a command that announces a random data output to the NAND flash memory 100. Then, address "ADD" transmitted over five cycles, for example, designates a column corresponding to data to be transferred to the controller 200. Lastly, command "E0h" is transmitted to the NAND flash memory 100. Thereafter, when the controller 200 toggles a read enable signal /RE, the NAND flash memory 100 transmits data sequentially to the controller 200 from the designated column. The read enable signal /RE is a signal transmitted to the NAND flash memory 100 from the controller 200, and asserted ("L" level in this example) in data reading. In this manner, the lower page data of word line WL0 is read to the controller 200.

Then, the controller 200 issues the shift read command and the data output command to thereby read middle page data and upper page data of word line WL0. Furthermore, similar commands are issued for word lines WL1 to WL3 to thereby read lower page data, middle page data, and upper page data of word lines WL1 to WL3. During this period, read voltages VCGRV, to which the shift values shown in FIG. 9A are applied, are applied to the selected word line WL. Namely, when data read is performed by selecting word lines WL1 to WL3 belonging to the same word line group GP0 as word line WL0, it is unnecessary to issue a set feature command.

Next, the controller 200 reads lower page data of word line WL4. Word line WL4 belongs to word line group GP1. Thus, the controller 200 issues a set feature command as shown in FIG. 8. As a result, as shown in FIG. 9B, the next entry of the register shown in FIG. 9A holds shift amounts $\Delta V$ used to perform read operations AR, BR, . . . , and GR on word line group GP1.

The subsequent operations are similar to those of group GP0. Namely, the aforementioned operations are performed for word line groups GP2 to GP5. If there is no vacant entry, the shift amounts are overwritten in one entry. This is shown in FIG. 10A. FIG. 10A shows the case where the shift amounts for group GP0 are overwritten with the shift amounts for group GP2. Since the number of entries is limited, one entry in the register is updated every time the read command is issued.

Thus, the shift amounts $\Delta V$ held in the register shown in FIG. 10A, for example, are used to read data from the memory cell array 110. The controller 200 determines whether the shift amounts are appropriate or not based on, for example, the number of error bits included in read data for each word line group GP. For example, when the number of error bits exceeds a prescribed value, the controller 200 determines that the shift amounts are not appropriate. In this case, the controller 200 searches shift values in which the number of error bits is below the prescribed value, and based on the searched result, updates the values in the history table to appropriate values. When accessing the group GP again having the updated shift values in the history table, the controller 200 issues a set feature command to update the shift amounts in the register to appropriate values. This is shown in FIG. 10B. FIG. 10B shows an example in which the shift amounts $\Delta V$ of word line group GP2 are updated. Namely, in the controller 200, the index corresponding to word line group GP2 of the history table is updated from "1" to "2". In association with this, as shown in FIG. 10B, the shift amounts in the register of the NAND flash memory 100 are updated from $\Delta$VA1, $\Delta$VB1, . . . , and $\Delta$VG1 to $\Delta$VA2, $\Delta$VB2, . . . , and $\Delta$VG2.

The history table generated once may be written in one block BLK of the NAND flash memory 100 when the power of the NAND flash memory 100 (or memory system 1) is turned off. In a manner similar to the shift table described above, the history table may be read from the block BLK of the NAND flash memory 100 immediately after the power of the NAND flash memory 100 is turned on, and held in, for example, the RAM 220 of the controller 200. In addition, the sequencer 170, for example, may set the register as shown in FIG. 10A in accordance with the history table read from the block BLK.

1.3 Advantage According to Present Embodiment

The configuration according to the present embodiment can improve operation reliability of the memory system 1. Such advantages will be explained below.

As described in relation to FIGS. 6 and 7, in the history table according to the present embodiment, a plurality of word lines WL are grouped. An index is assigned to each word line group. Thus, it is possible to reduce a capacity of the history table as compared to when an index is assigned to each single word line. For the memory cell transistors MT, if the structures are similar, the characteristics are expected to be similar as well. One of the structure affecting the characteristics is the shape of the memory pillar 31. Thus, in the present embodiment, the memory cell transistors MT having close diameter sizes of the corresponding memory pillar 31 are grouped (see FIG. 6). Thus, even if word lines WL are grouped, appropriate indexes can be assigned to word line groups GP.

In the example of FIG. 7 described in the present embodiment, the word lines WL are not uniformly grouped, but are grouped in accordance with the degree of change in characteristics of memory cell transistors MT. Specifically, in the areas where characteristics are considered to significantly change, the word lines WL are grouped in a finer manner than the other areas. Thereby, it is possible to assign a more appropriate index to every word line group GP.

As described above, since appropriate index is assigned, it is possible to apply appropriate read voltage VCGRV to the selected word line WL in the shift read. This can reduce the number of shift reads, and improve reliability of reading data.

2. Second Embodiment

Next, a memory system according to the second embodiment will be described. The present embodiment relates to a read operation in which in the first embodiment, the controller 200 issues a read instruction without a read request from the host apparatus 300, and in response thereto, the NAND flash memory 100 reads data from the memory cell array 110. Hereinafter, this read operation will be referred to as a "patrol read". The patrol read is executed, for example, in an unoccupied time of the memory system 1.

2.1 Patrol Read

The patrol read according to the present embodiment includes two types of operations. One of the operations is a normal shift read. Namely, as described in the first embodiment, the controller 200 issues the shift read instruction, the NAND flash memory 100 applies read voltages VCGRV set by the set feature to the selected word line WL, and data is read from the memory cell array 110. However, data that is read from the memory cell array 110 is not transmitted to the host apparatus 300.

The other operation is a tracking operation. The tracking operation is an operation to obtain, when adjacent threshold distributions overlap each other, an intersection of the threshold distributions to calculate an appropriate read voltage, i.e., shift amount, from the intersection obtained. Alternatively, instead of the intersection, the operation searches, when the read voltage is varied, a voltage at which the number of error bits in the ECC is the minimum, or a voltage at which error correction can be made by the ECC. The tracking operation will be briefly described below, based on the example in which an intersection is calculated.

FIG. 11A shows the threshold distributions of the "A" state and the "B" state as an example. In FIG. 11A, for example, threshold distributions obtained immediately after data writing are assumed to be as shown in an upper figure of FIG. 11A. However, the threshold distributions are assumed to be broadened by a disturbance or the like as shown in a lower figure of FIG. 11A. Then, when read operation is performed at voltage VB, memory cell transistors MT corresponding to a shaded area in the lower figure of FIG. 11A are detected as the error bits. Then, if the total number of error bits exceeds the correctable number of the ECC circuit 260, the data fails to be accurately read. Therefore, the position (voltage) of the intersection where the two threshold distributions overlap is searched, and a voltage near the intersection is determined to be read voltage VB'. This is the tracking operation.

Details of the tracking operation will be described using FIG. 11B. FIG. 11B shows graphs illustrating the number of on-cells (a cumulative value for the number of memory cells in on-state) with respect to read voltage VCGRV, and the threshold distributions of the "A" state and the "B" state corresponding thereto.

As shown in the upper figure of FIG. 11B, as voltage VCGRV is increased, at a voltage slightly lower than voltage VmidA that is a median of the "A" state (a voltage with the highest distribution probability), the number of on-cells increases rapidly, and dN/dV is maximized (where N is the number of on-cells and V is the voltage on the selected word line WL). As voltage VCGRV is further increased, the increase rate of the number of on-cells decreases, and has a minimum value at a certain value. The increase rate at voltage VCGRV is zero when the threshold distribution of the "A" state and the threshold distribution of the "B" state do not overlap. On the other hand, when they overlap, the increase rate has a certain minimum value that is not zero (>0). As voltage VCGRV is further increased, the increase rate of the number of on-cells increases again, and dN/dV is maximized at a voltage slightly lower than voltage VmidB that is a median of the "B" state.

Such threshold distributions as shown in the lower figure of FIG. 11B can be determined based on the above-described changes in the cumulative value of the number of on-cells. That is, threshold distributions are obtained in which the voltage slightly higher than the voltage at which dN/dV has the maximum value corresponds to the median of each of the "A" and "B" states, and in which the voltage at which dN/dV has the minimum value corresponds to the intersection between the "A" state and the "B" state. The voltage at the intersection, that is, voltage VCGRV at which the increase rate of the cumulative value of the number of on-cells is minimized, is VB' to be found.

Figure 12:
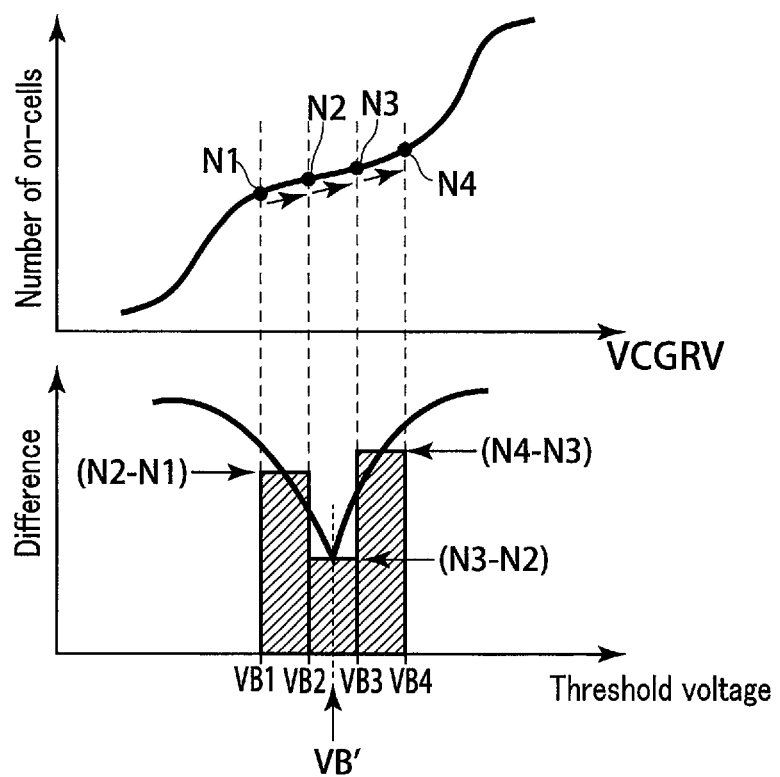

Specifically, the controller 200 issues a test read command different from the normal read command. Then, the NAND flash memory 100 reads one page of data, and counts the number of on-cells. This operation is repeated multiple times with voltage VCGRV shifted. This is shown in FIG. 12. An upper figure of FIG. 12 shows the number of on-cells (the total number of memory cells in the on-state) with respect to voltage VCGRV, while a lower figure of FIG. 12 shows a histogram indicating the number of memory cells turned on for the first time when the voltage on the word line WL is shifted by one step, and the resultant threshold distributions.

As shown in FIG. 12, at first, the read operation is performed using voltage VB1 shifted by a certain amount from voltage VB used when the normal read command is issued. The number of on-cells at this time is assumed to be N1. Next, the read operation is performed using voltage VB2 shifted from voltage VB1 in the plus direction by ΔVB. The number of on-cells at this time is assumed to be N2. Then, the number of memory cells newly turned on when the voltage on the selected word line WL increases from VB1 to VB2 is (N2−N1). Subsequently, the controller 200 performs the read operation using voltage VB3 shifted from voltage VB2 in the plus direction by ΔVB. The number of on-cells at this time is assumed to be N3. Then, the number of memory cells newly turned on when the voltage across the selected word line WL increases from VB2 to VB3 is (N3−N2). Given that (N2−N1)>(N3−N2), the voltage at which dN/dV=minimum is expected to be at least higher than voltage VB2. Therefore, the controller 200 performs the read operation using voltage VB4 further shifted from voltage V3 in the plus direction by ΔVB. Given that the number of on-cells at this time is N4 and that (N4−N3)>(N3−N2), such a histogram as shown in the lower figure of FIG. 12 is obtained.

As a result, the threshold distributions as shown in the lower figure of FIG. 12 are estimated. Based on the distributions, the controller 200 estimates that the position between voltages VB2 and VB3 corresponds to the position where the dN/dV=minimum described in relation to FIG. 11. The controller 200 sets the value between voltages VB2 and VB3 to be appropriate read voltage VB'.

Figure 13A:
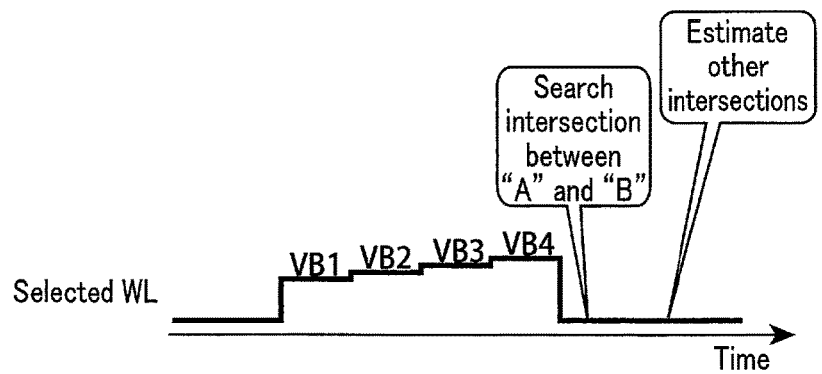
FIGS. 13A, 13B, and 13C are timing charts showing voltages of a selected word line in the tracking operation according to the second embodiment.
Figure 13B:
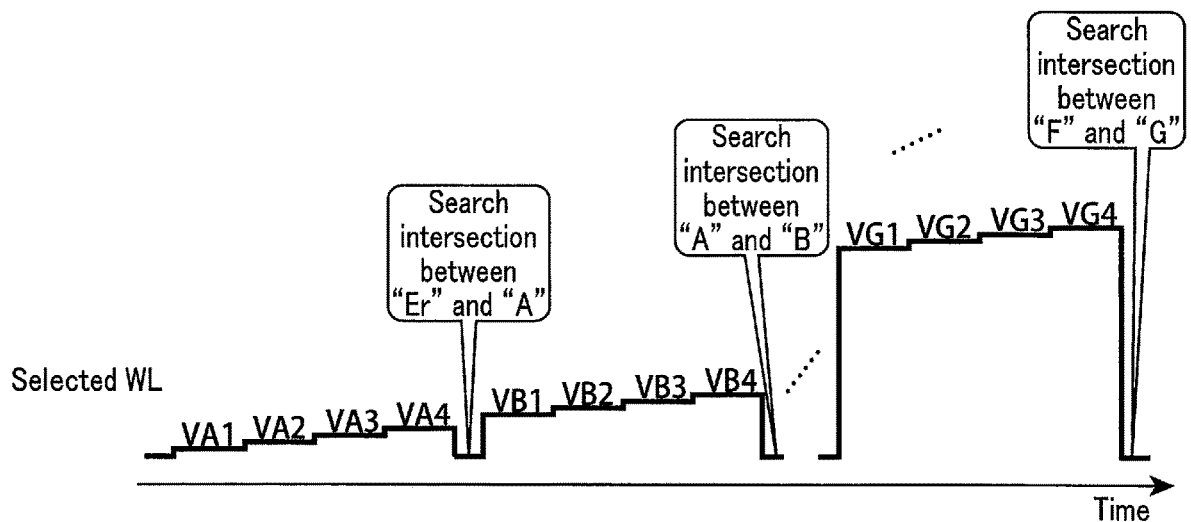
Figure 13C:
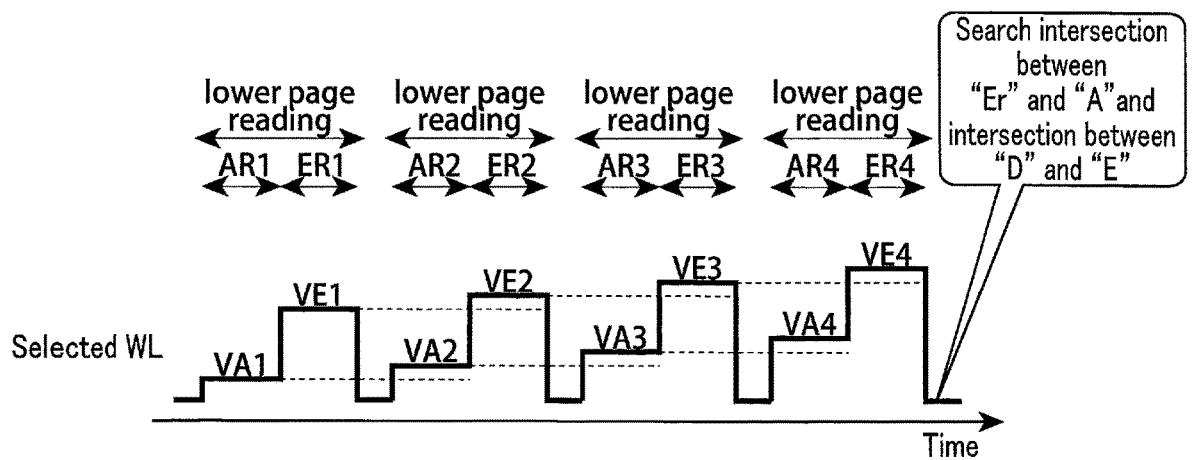

As described above, the memory system 1 may execute, for example, the method using the distribution read, and the method using the shift read tracking to search the intersection of threshold distributions in the tracking operation. In the following, each of the methods will be briefly described using FIGS. 13A, 13B, and 13C. FIGS. 13A and 13B are timing charts of voltages VCGRV applied to the selected word line WL during the distribution read, and FIG. 13C is a timing chart of voltages VCGRV applied to the selected word line WL during the shift read tracking. FIGS. 13A, 13B, and 13C correspond to the case where the intersection is searched described in relation to FIG. 12.

First, the example of FIG. 13A will be described. FIG. 13A shows an example of 1-level tracking using the distribution read. The distribution read is different from the normal read operation, and counts on-cells when a certain voltage is applied to the selected word line WL. Namely, in the normal read operation (in the case of page-by-page reading), data reading is executed on each page, and in the example of FIG. 4, lower page data, middle page data, and upper page data is respectively read. Thus, when lower page data is read, voltages VA and VE are applied as read voltages VCGRV to the selected word line WL. The same applies to the other pages. However, in the case of the distribution read, page data is not read, but it is merely determined whether the memory cell transistor MT has been turned on or not when a certain voltage is used for VCGRV.

In the example of FIG. 13A, voltages VB1, VB2, VB3, and VB4 are sequentially applied to the selected word line. The sequencer 170, for example, counts the number of memory cell transistors in on-state when each voltage is applied to the selected word line WL. As a result, the histogram described in relation to FIG. 12 is obtained, and the intersection of threshold distributions between the "A" state and the "B" state is obtained. Although FIG. 13A shows the case where voltage VCGRV is monotonically increased, the present embodiments are not limited to the monotonic increase depending on how the number of on-cells is increased or decreased.

In the case of the 1-level tracking, one intersection is searched, and other intersections are estimated based on the searched intersection. Namely, in the example of FIG. 13A, the intersection of threshold distributions between the "A" state and the "B" state is searched based on the number of on-cells actually obtained by the distribution read. However, intersections of other threshold distributions (i.e., the intersection between the "Er" state and the "A" state, the intersection between the "B" state and the "C" state, the intersection between the "C" state and the "D" state, . . . , and the intersection between the "F" state and the "G" state) are estimated based on the intersection of threshold distributions between the "A" state and the "B" state.

On the other hand, the method of obtaining all (or a plurality of) intersections using the distribution read is full level tracking. FIG. 13B shows the case of the full level tracking.

As shown in FIG. 13B, the operations described in relation to FIG. 13A are performed not only for voltage VB but also voltages VA, VC, VD . . . , and VG. Thereby, the intersection between the "Er" state and the "A" state, the intersection between the "A" state and the "B" state, the intersection between the "B" state and the "C" state, . . . , and the intersection between the "F" state and the "G" state are obtained. For simplicity, FIG. 13B shows, in a manner similar to FIG. 13A, the case where voltages VA, VB, VC, . . . and VG are changed in four stages; however, in the case of full level tracking, it is desirable that the voltages are finely stepped up (or stepped down) in a certain voltage range to search intersections in a more precise manner.

Next, shift read tracking will be described. The shift read tracking repeatedly executes the shift read similar to the normal page reading with the values of VCGRV changed.

This is shown in FIG. 13C. FIG. 13C shows the case where the lower page data is read. As shown in FIG. 13C, in read operations AR1 and ER1, voltages VA1 and VE1 are applied to the selected word line WL to read lower page data. Then, in read operations AR2 and ER2, voltages VA2 and VE2 are applied to the selected word line WL to read lower page data. The same is performed until read operations AR4 and ER4. Thereafter, the intersection of threshold distributions between the "Er" state and the "A" state and the intersection of threshold distributions between the "D" state and the "E" state are obtained.

FIG. 14A shows read data when read voltages VCGRV are changed from VA1 to VE4 in each of read operations AR1/ER1 to AR4/ER4. In FIG. 14A, "TR" denotes a test read performed before the operations shown in FIG. 13C. In the test read, a read voltage to be used is a voltage between a plurality of read voltages for reading page data (in the example of FIG. 14A, between voltages VA and VE), and in this example, is voltage VC. The data obtained using voltage VC is used to distinguish between data obtained at read voltages VA1 to VA4, and data obtained at read voltages VE1 to VE4. Thus, an intermediate voltage between voltages VA4 and VE1 is preferable.

As shown in FIG. 14A, in read operation AR1/ER1, read data is "1" when the threshold voltages of the memory transistors are lower than VA1, read data is "0" when the threshold voltages are equal to or higher than VA1 and lower than VE1, and read data is "1" when the threshold voltages are equal to or higher than VE1. In read operation AR2/ER2, read data is "1" when the threshold voltages of the memory transistors are lower than VA2, read data is "0" when the threshold voltages are equal to or higher than VA2 and lower than VE2, and read data is "1" when the threshold voltages are equal to or higher than VE2. In a similar manner, in read operation ARi/ERi in an i-th shift read (where i is a natural number), read data is "1" when the threshold voltages of the memory transistors are lower than VAi or equal to or higher than VEi, and read data is "0" when the threshold voltages are equal to or higher than VAi and lower than VEi.

In order to obtain changes in the number of on-cells when the read voltage is shifted from the read data as shown in FIG. 14A, separation data as shown in FIG. 14B is used.

Separation data ARs1 to ARs4 and ERs1 to ERs4 are calculated based on the data that is read in test read TR, and the data that is read in read operation AR/ER.

In this example, separation data ARsi (where i is a natural number) is calculated by a logical product operation on the data that is read in test read TR, and the data that is read in read operation ARi/ERi (ARs=TR AND (AR/ER)). Separation data ERsi (where i is a natural number) is calculated by a logical product operation on inverted data of the data that is read in test read TR, and the data that is read in read operation ARi/ERi (ERs=/TR AND (AR/ER)).

As a result, as shown in FIG. 14B, in separation data ARs1 to ARs4, data corresponding to read voltages equal to or higher than voltage VA4 are all determined to be "0", and it is possible to eliminate the influence due to variations in voltage VE. Namely, by counting the number of bits in which separation data ARs1 is "1", the number of memory cell transistors having the threshold voltages lower than VA1 is found. In addition, by counting the number of bits in which separation data ARs2 is "1", the number of memory cell transistors having the threshold voltages equal to or higher than VA1 and lower than VA2 is found.

The same applies to separation data ERs1 to ERs4. Namely, in separation data ERs1 to ERs4, data corresponding to the read voltages lower than voltage VE1 are all determined to be "0", and it is possible to eliminate the influence due to the variations in voltages VA. By counting the number of bits in which separation data ERs4 is "1", the number of memory cell transistors having the threshold voltages equal to or higher than VE4 is found. In addition, by counting the number of bits in which separation data ERs3 is "1", the number of memory cell transistors having the threshold voltages equal to or higher than VE3 and lower than VE4 is found.

The method of obtaining separation data is not limited to the above-described logical product operation, and various methods such as an OR operation can be used. Moreover, the shift read tracking is described in, for example, U.S. patent application Ser. No. 15/697,737 filed on Sep. 7, 2017, titled "SEMICONDUCTOR STORAGE DEVICE AND MEMORY SYSTEM". The entire contents of this patent application is incorporated herein by reference.

2.2 Patrol Read in Block BLK

Next, the method of the patrol read in the block BLK will be described using FIG. 15. FIG. 15 is a diagram showing the patrol read performed on word lines WL0 to WL95 in each of string units SU0 to SU3, and the empty spaces indicate that the normal shift read is performed.

In this example, in each word line group GP, the tracking operation is performed on only one word line WL in one string unit SU, and the shift read is performed on the other word lines WL. Namely, in the example of FIG. 15, in string unit SU0, the tracking operation is performed on initial word lines WL0, WL12, WL24, WL36, WL48, WL60, WL72, and WL84 of respective word line groups GP0 to GP7. For other word lines WL1 to WL11, WL13 to WL23, WL25 to WL35, WL37 to WL47, WL49 to WL59, WL61 to WL71, WL73 to WL83, and WL85 to WL95, the tracking operation is not performed, but the shift read is performed. For all word lines WL0 to WL95 in string units SU1 to SU3, the tracking operation is not performed, but the normal shift read is performed.

Figure 16:
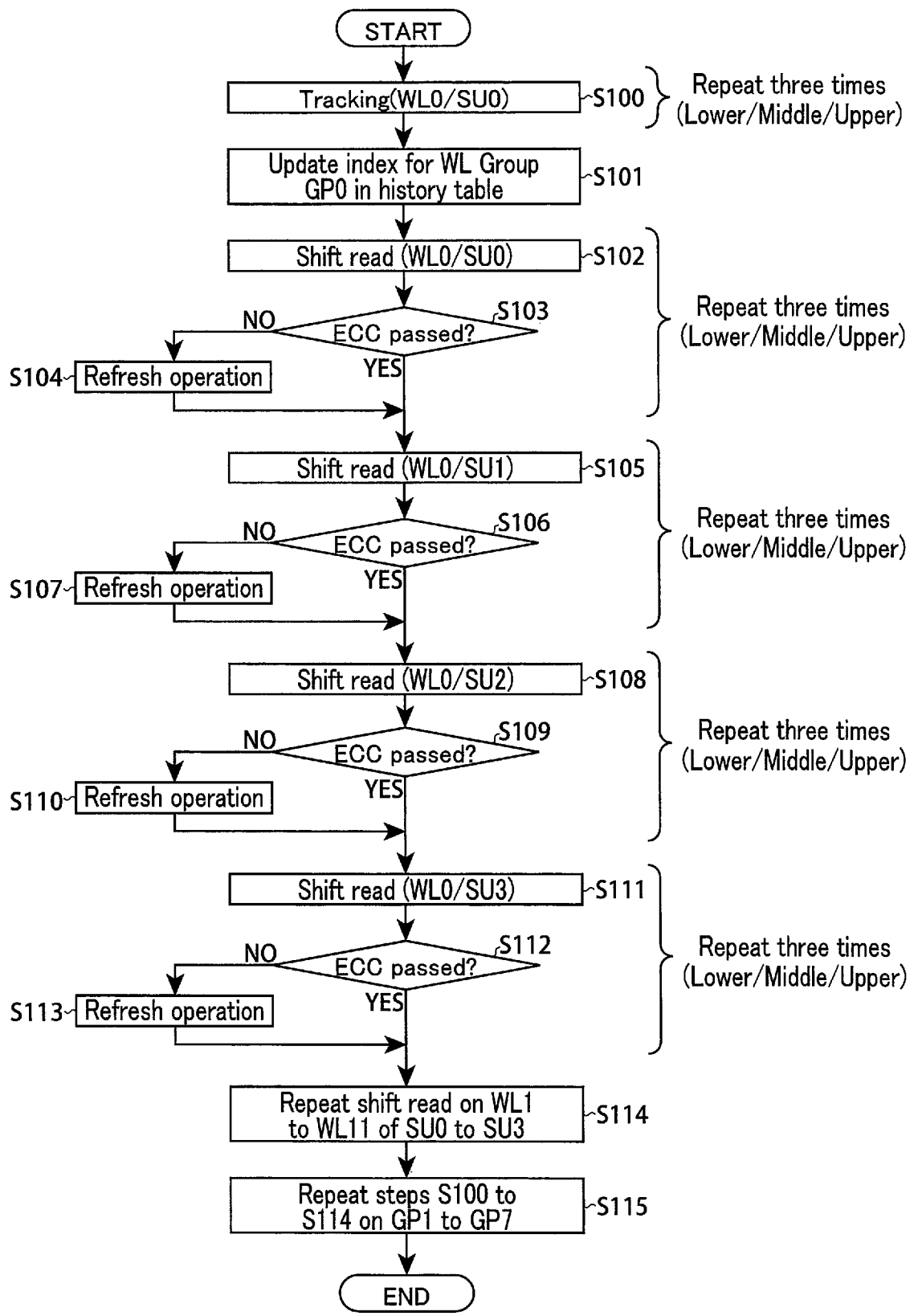
FIG. 16 is a flowchart of a patrol operation according to the second embodiment.

FIG. 16 is a flowchart of the patrol read according to the present embodiment. FIG. 16 shows the example where the tracking operation is performed using the shift read tracking, but the distribution read may be used.

As shown in FIG. 16, in the NAND flash memory 100 that has received the test command from the controller 200, the sequencer 170 first selects word line WL0 of string unit SU0, and executes the tracking operation (step S100). In the example of FIG. 16, the shift read tracking described in relation to FIGS. 13C, 14A and 14B is performed. Namely, the tracking operation of step S100 is performed on each of a lower page, middle page, and upper page of word line WL0. Furthermore, the tracking operation in this example is, for example, on-chip tracking, and the count of the number of on-cells and the intersection searching processing based on the histogram may be executed in the NAND flash memory 100 (e.g., the sequencer 170), not the controller 200. The intersection searching processing may of course be performed in the controller 200.

The controller 200 receives intersection information on threshold distributions in the lower page, middle page, and upper page from the NAND flash memory 100, and updates the history table held in the RAM 220, for example (step S101). Namely, in the shift table shown in FIG. 5, the processor 230 selects an index corresponding to the shift amount suited for the intersection information received from the NAND flash memory 100. Then, the processor 230 updates, to the selected index, the index of word line group GP0 in the history table described in relation to, for example, FIGS. 6 and 7.

Next, the controller 200 instructs the NAND flash memory 100 to perform a shift read on word line WL0 of string unit SU0 (step S102). In this step S102, as described in relation to FIG. 8, for example, the shift values in the register of the NAND flash memory 100 are updated by the set feature command. Then, the controller 200 issues the shift read command, and the data output command. Thereby, data that is read from the memory cell array 110 using the updated shift values is transmitted to the controller 200.

The NAND flash memory 100 may have the relationship between the intersections of threshold distributions and the shift values, and in step S101, the sequencer 170, for example, may update shift values in the register. In this case, in step S102, it is not necessary to issue a set feature command.

Figure 17:
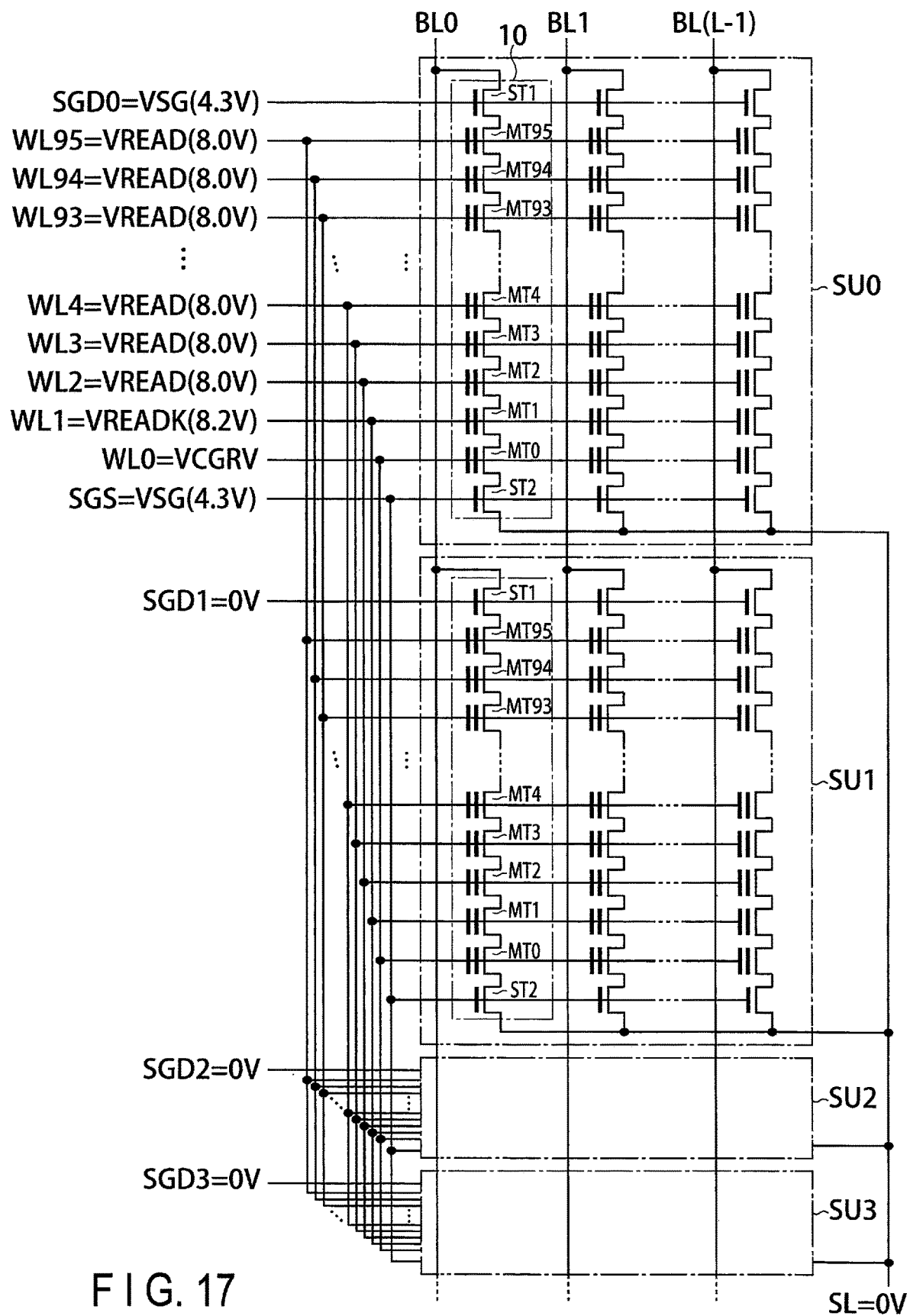
FIG. 17 is a circuit diagram of a memory cell array in a shift read operation according to the second embodiment.

FIG. 17 is a circuit diagram of block BLK0 when, in step S102, data is read in response to the shift read command. As shown in FIG. 17, during the shift read, the row decoder 120 transfers voltage VSG (e.g., 4.3V) to selection gate lines SGD0 and SGS. Voltage VSG turns on select transistors ST1 and ST2. 0V is transferred to other selection gate lines SGD1 to SGD3 to set selection transistors ST1 of string units SU1 to SU3 in an off state. The row decoder 120 further transfers voltage VCGRV to selected word line WL0. Read voltage VCGRV is a voltage shifted from the default voltage by the value corresponding to the index updated in step S101. The row decoder 120 further transfers voltage VREAD to other non-selected word lines WL1 to WL95. Voltage VREAD turns on memory cell transistors MT regardless of held data, and is approximately 8.0V, for example. Voltage VREADK may be applied to non-selected word lines adjacent to the selected word line, in which VREADK>VREAD, and VREADK is approximately 8.2V, for example. Moreover, the source line SL is grounded.

In addition, the sense amplifier 140 precharges the bit line BL. When a memory cell transistor MT coupled to selected word line WL0 is turned on, a current flows from bit line BL0 to source line SL, and when it is off, almost no current flows. The sense amplifier 140 senses the current flowing in bit line BL0 or the voltage, and determines whether the read data is "0" or "1".

One page of data read as described above is transmitted, in response to the data output command, to the controller 200 from the NAND flash memory 100. Then, the ECC circuit 260 performs an error detection and an error correction (step S103). As a result, when the error is detected and the error fails to be corrected (step S103, NO), the controller 200 instructs the NAND flash memory 100 to perform a refresh operation (step S104). The process of block BLK0 during the refresh operation is shown in FIG. 18.

Figure 18:
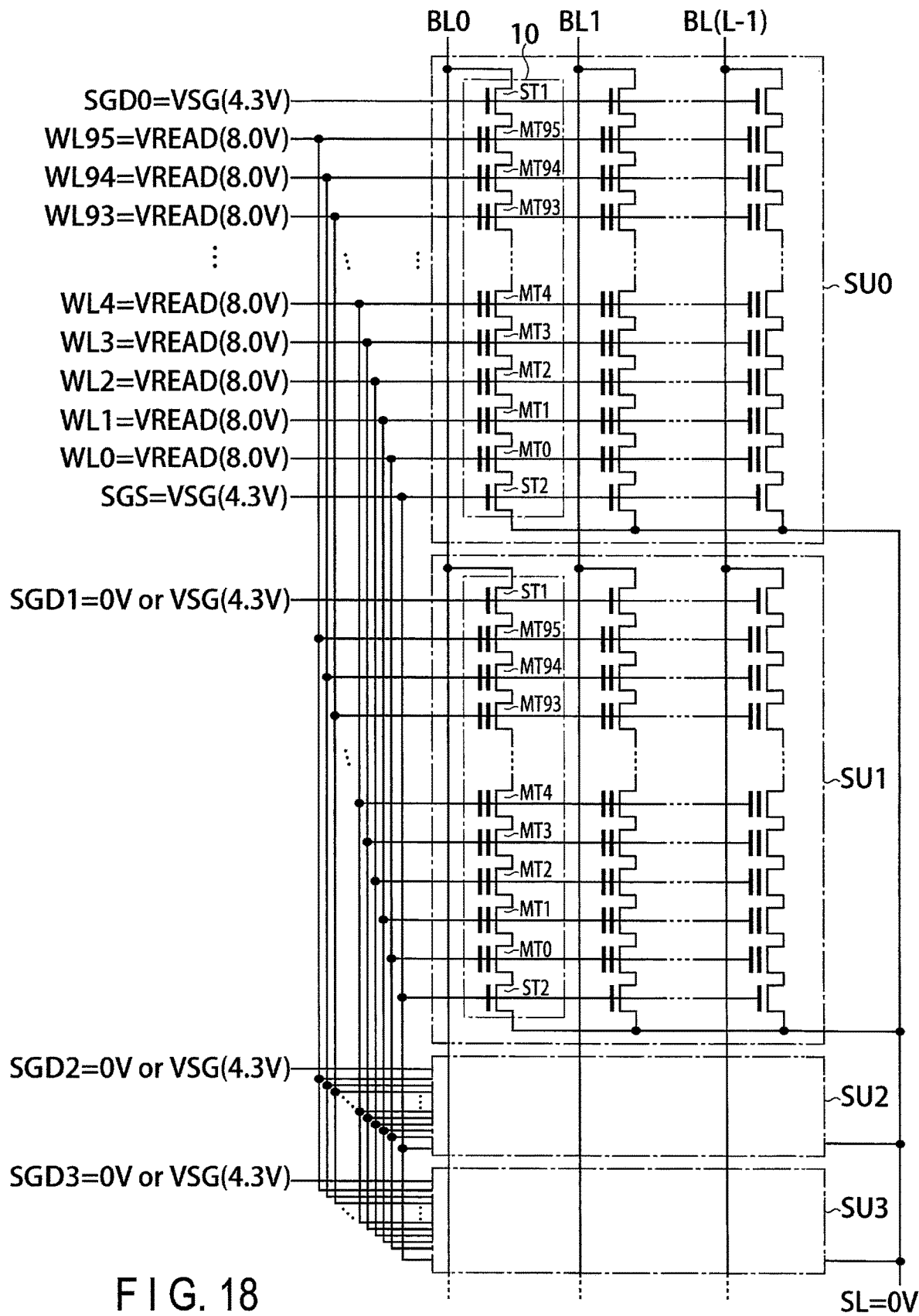
FIG. 18 is a circuit diagram of a memory cell array in a refresh operation according to the second embodiment.

As shown in FIG. 18, upon receipt of the refresh instruction from the controller 200, the row decoder 120 transfers, for example, voltage VREAD to all word lines WL0 to WL95 of block BLK0. Furthermore, the row decoder 120 transfers voltage VSG to all selection gate lines SGD0 to SGD3 and SGS of block BLK0. As a result, a voltage stress due to voltage VREAD is applied to all memory cell transistors MT of string units SU0 to SU3 of block BLK0, and the threshold voltage thereof is shifted to the high voltage side.

The operation of shifting the threshold voltage to the high voltage side is the refresh operation. In the NAND flash memory, the threshold voltage of the memory cell transistor MT may be lowered after time has elapsed from data writing in the memory cell transistor MT. This is because, for example, electrons injected in the charge accumulation layer move to the region between memory cell transistors, and the number of electrons in the charge accumulation layer of the memory cell transistor MT substantially decreases (interference effect). Thus, by performing the refresh operation, the controller 200 returns the threshold voltage shifted to the low voltage side due to the interference effect back to the high voltage side, thereby increasing the success probability of the shift read by the index updated in step S101.

The method of the refresh operation is not limited to FIG. 18, and any methods may be adopted as long as a voltage stress can be applied to the memory cell transistor MTs. For example, voltage VSG may be applied to selection gate line SGD0 while 0V is applied to selection gate lines SGD1 to SGD3. Alternatively, the refresh read operation may be an operation in which, in a manner similar to the data read operation, voltage VCGRV is applied to one selected word line WL, and voltage VREAD is applied to the other non-selected word lines WL. Alternatively, the refresh read operation may be an operation in which voltage VCGRV is applied to a dummy word line (not shown) (e.g., provided between selection gate line SGD or SGS and word line WL).

Moreover, the refresh operation is not limited to the method of applying a voltage stress to the memory cell transistors MT as described above. For example, data may be copied to separate block BLK. Specifically, when data in block BLK0 is read and error correction ends in failure in step S103, S106, S109, or S112, the controller 200 corrects the error by a method having a higher correction ability in step S104, S107, S110, or S113. An example is the case where the error correction in steps S103, S106, S109, and S112 is a hard decision (hard bit decoding) while the error correction in steps S104, S107, S110, and S113 is a soft decision (soft bit decoding). Alternatively, an example is the case where error correction in steps S104, S107, S110, and S113 uses Redundant Arrays of Inexpensive Disks (RAID). The controller 200 copies all effective data in block BLK0 together with error-corrected data to separate empty block BLK1. Then, data in block BLK0 is all erased. The logical address assigned to block BLK0 by then is assigned to block BLK1 to which data is copied. The refresh operation may be the above-described method.

The controller 200 executes the above-described processes of steps S102 to S104 on the lower page, the middle page, and the upper page. The controller 200 further executes the processes similar to steps S102 to S104 on the lower page, the middle page, and the upper page of word line WL0 of each of string units SU1, SU2, and SU3 (steps S105 to S107, S108 to S110, and S111 to S113). Read voltage VCGRV for respective string units corresponds to the index obtained in step S101.

The controller 200 further executes the operation of steps S102 to S113 by selecting word lines WL1 to WL11 sequentially in each of string units SU0 to SU3 (step S114). Read voltage VCGRV for respective string units and word lines also corresponds to the index obtained in step S101.

When the patrol read for word line group GP0 is completed as described above, the memory system 1 executes the processes similar to those executed on word line group GP0 on word line groups GP1 to GP7 (step S115).

Namely, at first, the tracking operation is executed by selecting word line WL12 of string unit SU0 (step S100), and an index used for word line group GP1 is determined (step S101). Thereafter, for word lines WL12 to WL23 in each of string units SU0 to SU3, read voltage VCGRV corresponding to the determined index is used to read lower page data, middle page data, and upper page data. At this time, the refresh operation is performed as necessary. The same applies to subsequent word line groups GP2 to GP7.

2.3 Normal Data Read Operation

Figure 19:
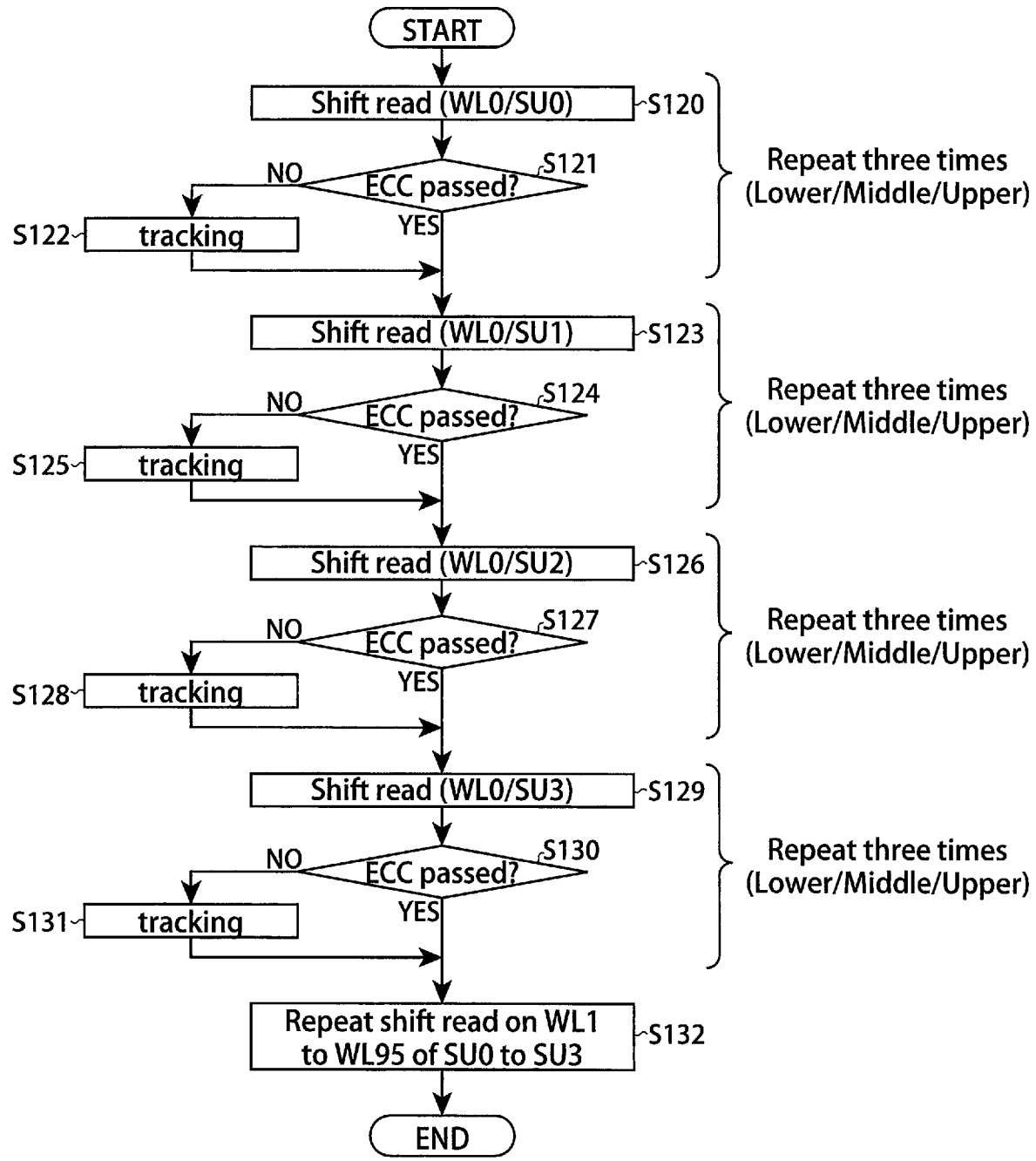
FIG. 19 is a flowchart of a data read operation method according to the second embodiment.

Next, the method of the normal data read operation will be briefly described using FIG. 19. FIG. 19 is a flowchart showing the operation when data is read to the controller 200 from one block BLK of the NAND flash memory 100 in accordance with the read request from the host apparatus 300, assuming that the host apparatus 300 sequentially accesses to the NAND flash memory. FIG. 19 shows the processing flow in a simple manner to clarify the difference from the patrol read shown in FIG. 16.

As shown in FIG. 19, the controller 200 that has received the read request from the host apparatus 300 instructs the NAND flash memory 100 to perform a shift read (step S120). For example, word line WL0 of string unit SU0 is selected and data of WL0 is read. In step S120, a set feature command may be issued before the shift read command as described in relation to FIG. 8 of the first embodiment. Then, the ECC circuit 260 attempts an error correction on the data read from the memory cell array 110 (step S121). When the ECC circuit 260 failed to correct the error (step S121, NO), the processor 230 increments the index of word line group GP0 in the history table, and instructs the NAND flash memory 100 to perform the shift read again. However, when the error correction is failed (step S121, NO) and the index value reaches a fixed reference value (for example, an upper limit value), the controller 200 instructs the NAND flash memory 100 to perform a tracking operation (step S122). Details of the tracking operation are as described in relation to FIGS. 11A, 11B, 12, 13A to 13C, 14A, and 14B. The processor 230 updates the indexes in the history table to appropriate values based on the result of the tracking operation, and instructs the NAND flash memory 100 to perform the shift read using the updated index values.

Then, the controller 200 executes the processes of steps S120 to S122 on the lower page, the middle page, and the upper page. As a result, the controller 200 can obtain three pages of data. The controller 200 further executes the processes similar to steps S120 to S122 on the lower page, the middle page, and the upper page of word line WL0 of each of string units SU1, SU2, and SU3 (steps S123 to S125, S126 to S128, and S129 to S131).

The controller 200 further executes the processes similar to steps S120 to S131 by sequentially selecting word lines WL1 to WL95 in each of string units SU0 to SU3 (step S132). At this time, as described in the first embodiment, the history table is updated for each word line group, not for each word line.

2.4 Advantage According to Present Embodiment

According to the present embodiment, a plurality of word lines WL are grouped in the history table, and the tracking operation is performed in the patrol read. Thereby, it is possible to optimize the index of each word line group GP in a period when there is no access from the host apparatus 300. As a result, in normal data reading, it is possible to reduce the possibility of occurrence of a situation where the shift read is repeated over and over again.

Moreover, according to the present embodiment, the tracking operation in the patrol read is performed on one word line WL of one string unit SU for each word line group GP, and is not performed on other word lines WL. In the case of FIG. 15, for example, in word line group GP0, the tracking operation is executed on only word line WL0 of string unit SU0. Thus, it is possible to obtain the above-described advantage while minimizing an increase in an increase a load (ex. a processing time of the NAND flash memory, a utilization rate of the NAND flash memory, or the like) in the NAND flash memory 100.

In the above-described embodiment, as shown in FIG. 15, the tracking operation is performed on the initial word lines of respective word line groups GP (word lines located on the lowermost layers in respective word line groups GP) WL0, WL12, WL24, WL36, . . . and WL84. However, word lines WL subjected to the tracking operation can be suitably selected. FIG. 20 shows the modification of FIG. 15 described in the above embodiment, showing the example in which the tracking operation is performed on the intermediate word lines of the respective word line groups GP (word lines located in the middle of the word lines on the uppermost and lowermost layers in the respective word line groups GP) WL5, WL17, WL29, WL41, . . . and WL89. FIG. 21 is a flowchart of the patrol read corresponding to FIG. 20. As shown in FIG. 21, when the patrol read is performed on word line group GP0, for example, word line WL5 is first selected to execute the tracking operation for the word line WL5 (step S116). Based on the result of the tracking operation, the index of word line group GP0 in the history table is updated (step S101). The subsequent operations are as described in the first embodiment.

According to this example, in each word line group GP, the word line WL located on the middle layer is selected, and the tracking operation is performed. Namely, the tracking operation is performed on the memory cell transistor MT having the average characteristics in each word line group GP. Thus, it is possible to obtain the shift amounts suitable for both the memory cell transistor MT on the uppermost layer and the memory cell transistor MT on the lowermost layer in each word line group GP.

In the above-described embodiment, a description has been given of the example in which the tracking operation is performed by selecting any one of word lines WL in any one of string units SU in each word line group GP. However, the tracking operation may be performed on a plurality of string units SU, and/or the tracking operation may be performed on a plurality of word lines WL. Namely, in one word line group GP, the tracking operation may be performed multiple times on different memory cell transistors MT. In this case, the tracking result of memory cell transistors MT having further deteriorated characteristics, i.e., the larger index values, may be preferentially held in the history table.

3. Third Embodiment

Next, a memory system according to the third embodiment will be described. According to the present embodiment, in the patrol read described in the second embodiment, the tracking operation is performed multiple times on a single word line group GP, and an average value of the result is held in the history table. In the following, only the parts different from those of the first and second embodiments will be described.

3.1 Patrol Read in Block BLK

FIG. 22 is a diagram showing the patrol read on word lines WL0 to WL95 in respective string units SU0 to SU3, and corresponds to FIGS. 15 and 20 described in the second embodiment.

As shown in FIG. 22, according to the method of this example, in each word line group GP, the tracking operation is performed in a plurality of string units SU0 to SU3. Specifically, in each of string units SU0 to SU3, the tracking operation is performed on the memory cell transistors MT coupled to the intermediate word lines WL5, WL17, WL29, . . . and WL89 of respective word line groups GP0 to GP7. Namely, the tracking operation is performed in each of four string units SU0 to SU3 of each word line group GP. For the other memory cell transistors MT, in a manner similar to the second embodiment, the shift read is performed, and no tracking operation is performed.

Figure 23:
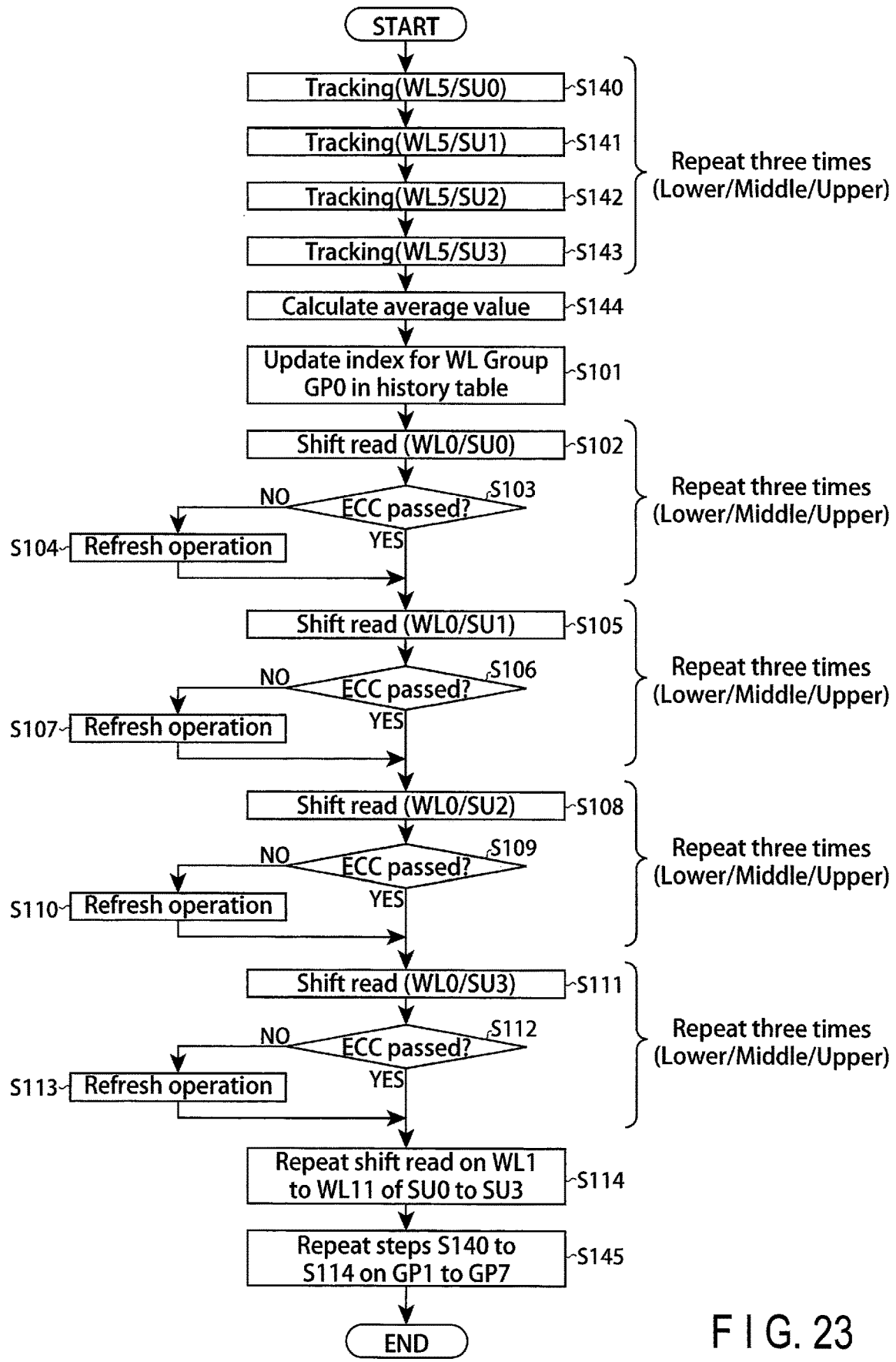
FIG. 23 is a flowchart of a patrol operation according to the third embodiment.

FIG. 23 is a flowchart of the patrol read according to the present embodiment. As shown in FIG. 23, the patrol read according to the present embodiment differs from that in FIG. 21 described in the second embodiment in the following points.

In string units SU1 to SU3 as well as string unit SU0, the tracking operation is performed on targeting word line WL5 (steps S140 to S143). Namely, the process of step S116 in FIG. 21 is performed in each of string units SU0 to SU3.

An average value of the voltages corresponding to the intersections of threshold distributions obtained in steps S140 to S143 is calculated (step S144). The average value may be calculated by, for example, the processor 230 of the controller 200, or by the sequencer 170 of the NAND flash memory 100.

In step S101, the history table is updated based on the average value obtained in step S144.

The tracking operation on string units SU0 to SU3, the update of the history table based on the average value of the voltages obtained by the tracking operation, and the shift read are also performed on word line groups GP1 to GP7 (step S145).

Figure 24:
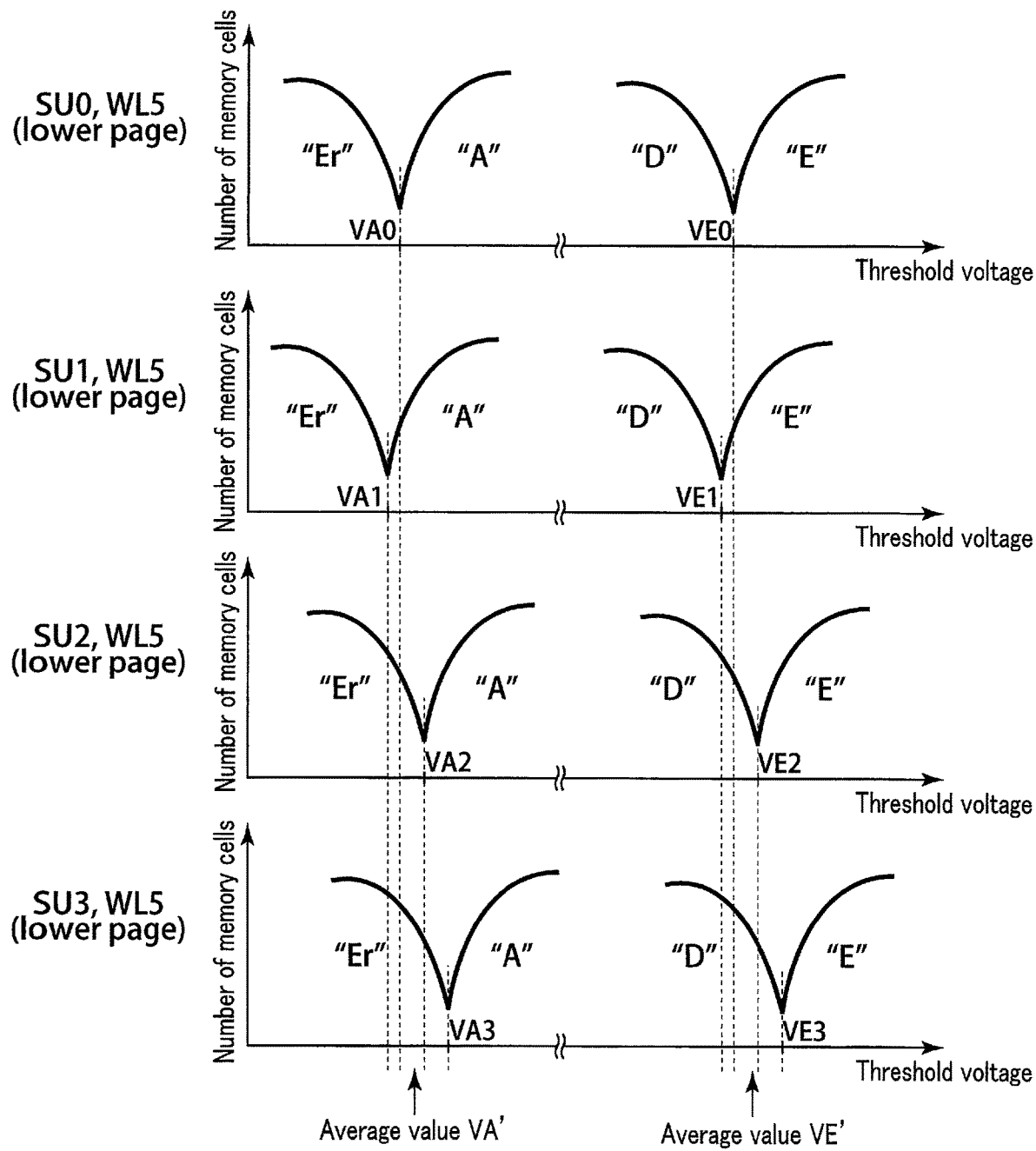
FIG. 24 shows graphs showing threshold distributions obtained in the tracking operation according to the third embodiment.

An example of the method of searching the intersections of threshold distributions according to the present embodiment will be described using FIG. 24. FIG. 24 shows graphs showing the intersections of the threshold distributions found in steps S140 to S143, and shows the case where the lower page data of word lines WL5 is subjected to tracking in each of string units SU0 to SU3. The graphs shown in FIG. 24 are obtained by, for example, the histogram as described using FIG. 12 in the first embodiment.

As shown in FIG. 24, according to the tracking operation result of string unit SU0, it is assumed that the voltage corresponding to the intersection between the erase state and the "A" state is VA0, and that the voltage corresponding to the intersection between the "D" state and the "E" state is VE0. According to the tracking operation result of string unit SU1, it is assumed that the voltage corresponding to the intersection between the erase state and the "A" state is VA1 (<VA0), and that the voltage corresponding to the intersection between the "D" state and the "E" state is VE1 (<VE0). Furthermore, according to the tracking operation result of string unit SU2, it is assumed that the voltage corresponding to the intersection between the erase state and the "A" state is VA2 (>VA1), and that the voltage corresponding to the intersection between the "D" state and the "E" state is VE2 (>VE1). Moreover, according to the tracking operation result of string unit SU3, it is assumed that the voltage corresponding to the intersection between the erase state and the "A" state is VA3 (>VA2), and that the voltage corresponding to the intersection between the "D" state and the "E" state is VE3 (>VE2).

Then, the NAND flash memory 100 transmits information on voltages VA0 to VA3 and VE0 to VE3 to, for example, the controller 200. The processor 230 determines average voltage VA' of voltages VA0 to VA3 as a voltage corresponding to the intersection between the erase state and the "A" state. Similarly, the processor 230 determines average value VE' of voltages VE0 to VE3 as a voltage corresponding to the intersection between the "D" state and the "E" state.

Similar processes are performed on the middle page and the upper page, thereby obtaining average values VB', VC', VD', VF', and VG'. The processor 230 updates indexes in the history table to values suited for average values VA' to VE'.

3.2 Advantage According to Present Embodiment

According to the present embodiment, in each word line group GP, the tracking operation is performed targeting a plurality of string units SU. Based on the average values of the voltages corresponding to the intersections of threshold distributions obtained in the respective string units SU, the indexes in the history table are determined. Namely, even if there is a difference in characteristics between string units SU, by averaging the results obtained in the respective string units SU, it is possible to select indexes suitable for each of four string units SU0 to SU3, and to improve data read reliability of the memory system 1.

In the example of FIGS. 22 and 23, the description has been given based on the example of the case where one word line WL5 is selected in each string unit SU. However, the word line WL selected to obtain the average value is not limited to this, and a plurality of word lines WL may be selected. FIG. 25 is a diagram showing the patrol read according to the first modification of the present embodiment.

As shown in FIG. 25, in the present modification, the tracking operation target per word line group is increased in each string unit SU in FIG. 22. Namely, as shown in FIG. 25, three word lines WL are selected per word line group GP in each string unit SU. In this example, in each of string units SU0 to SU3, word lines WL0, WL12, WL24 . . . , and WL84 located on the lowermost layer, word lines WL11, WL23, WL35, . . . WL95 located on the uppermost layer, and word lines WL5, WL17, WL29, . . . WL89 located on the middle thereof are selected. For example, in word line group GP0, word lines WL0, WL5, and WL11 are subjected to the tracking operation in each of string units SU0 to SU3. Thus, twelve values obtained in areas different from each other are obtained for one intersection between adjacent threshold distributions, and based on the average value of these values, the index is selected.

Figure 26:
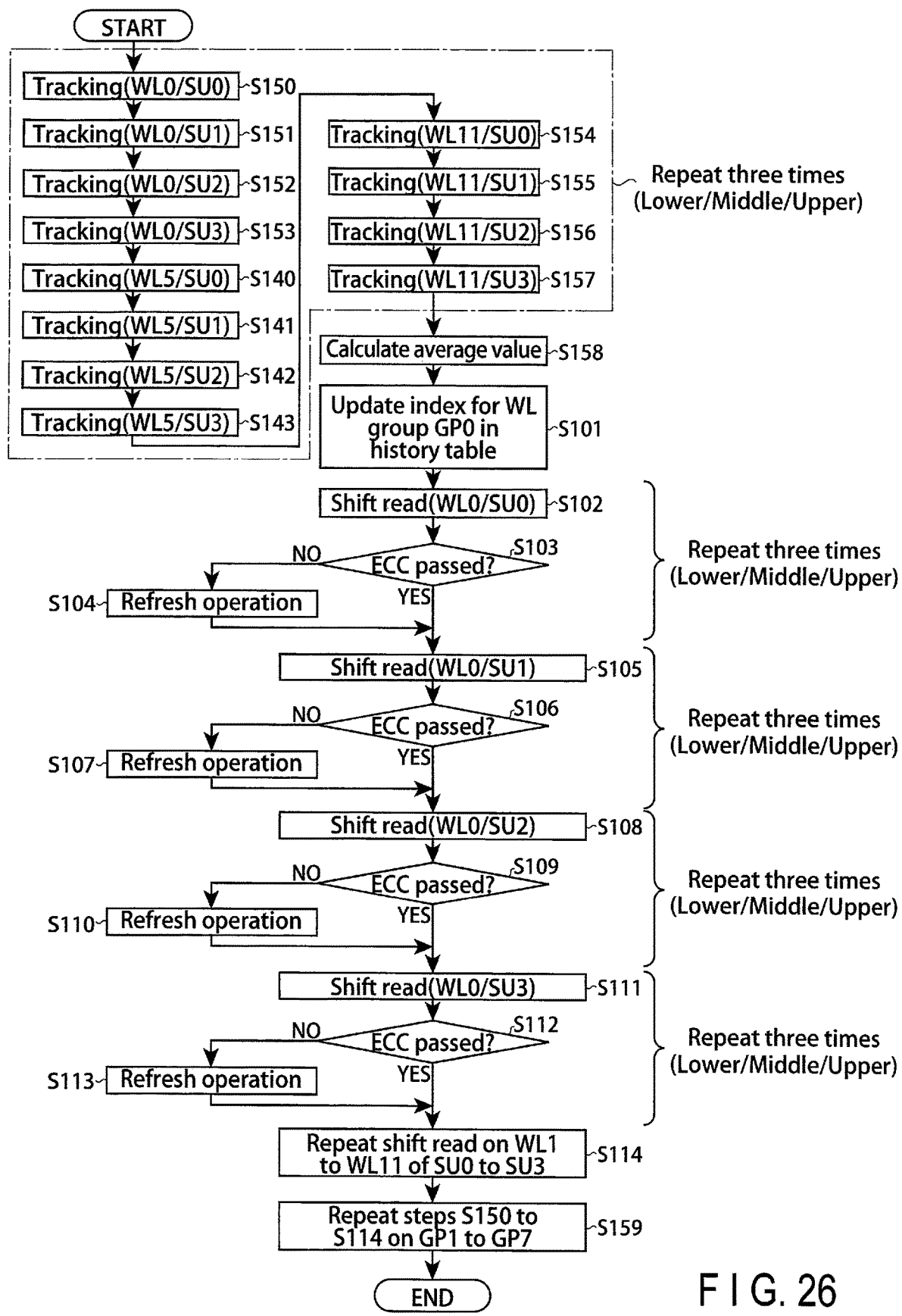
FIG. 26 is a flowchart of a patrol operation according to the first modification the third embodiment.

FIG. 26 is a flowchart of the patrol read described in relation to FIG. 25. As shown in FIG. 26, in the patrol read according to the present embodiment, in FIG. 23 described in the third embodiment, the tracking operation is performed on word lines WL0 of string units SU0 to SU3 in steps S150 to S153, the tracking operation is performed on word lines WL5 of string units SU0 to SU3 in steps S140 to S143, and the tracking operation is performed on word lines WL11 of string units SU0 to SU3 in steps S154 to S157. In step S158, the average value of the result obtained in steps S150 to S157 and S140 to S143 is obtained. In step S101, the index of the history table is determined based on the average value obtained in step S158. This operation is performed for word line groups GP1 to GP7 as well.

FIG. 27 is a diagram showing the patrol read according to the second modification of the present embodiment. As shown in FIG. 27, in the present modification, all twelve word lines WL are selected in each string unit SU. Namely, in word line group GP0, word lines WL0 to WL11 are subjected to the tracking operation in each of string units SU0 to SU3. Thus, forty eight values obtained in areas different from each other are obtained for one intersection between adjacent threshold distributions, and based on the average value of these values, the index is selected.

The combination of word lines WL subjected to the tracking operation is not limited to the above, and may be appropriately selected. At this time, it is preferable to select a plurality of areas where the characteristics of the memory cell transistors MT are likely to be significantly different. This is because such a selection can suppress selection of indexes based on certain characteristics.

4. Fourth Embodiment

Next, a memory system according to the fourth embodiment will be described. In the first to third embodiments described above, when data is read by selecting word lines WL belonging to the same word line group GP, the same index is applied, and the same read voltage VCGRV is applied to the word lines WL. In this regard, according to the present embodiment, a linear correction is performed using the index of each word line group GP obtained in the first to third embodiments, and suitable read voltages VCGRV different from each other are applied to the word lines WL even in the same word line group GP. In the following description, only the parts different from the first to third embodiments will be described.

4.1 Data Read Operation

Figure 28:
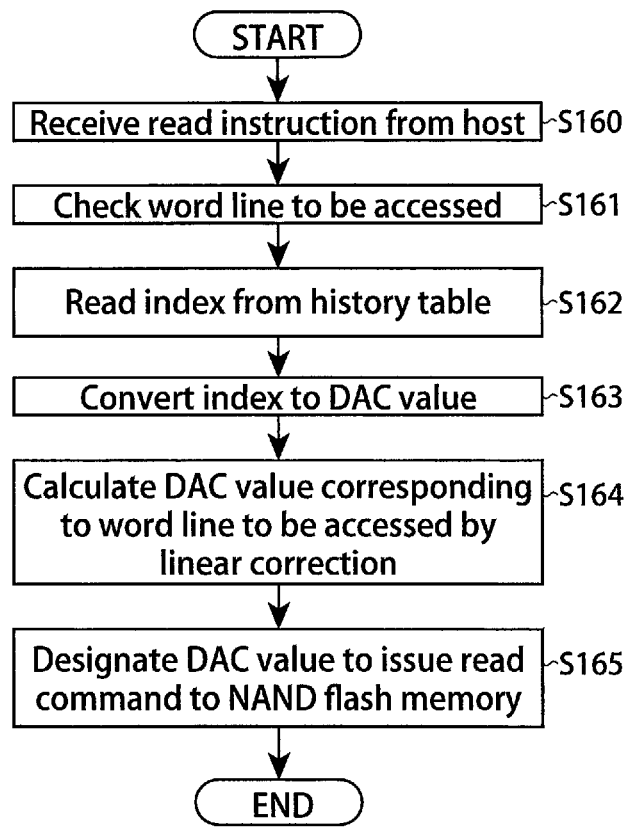
FIG. 28 is a flowchart of a data reading method according to the fourth embodiment.

The data read operation according to the present embodiment will be described using FIG. 28. FIG. 28 is a flowchart showing the operation of the controller 200 in data reading according to the present embodiment.

As shown in FIG. 28, the controller 200 receives a data read request from the host apparatus 300 (step S160). Next, the processor 230, for example, of the controller 200 checks a word line WL to be selected, and a word line group GP to which the word line WL belongs (step S161). Then, the processor 230 refers to the history table, and reads an index corresponding to the word line group GP, and an index corresponding another word line group GP (step S162). It is preferable that another word line group GP is continuous with the word line group GP including the word line to be read, but the configuration is not limited to this. The processor 230 converts a plurality of read indexes to Digital to Analog Converter (DAC) values (step S163).

The DAC values are digital values indicating read voltages VCGRV. Namely, the controller 200 deals with read voltages VCGRV as the digital values, that is, the DAC values, not analog values. Since the index is prepared for each word line group, the DAC values are discrete values.

Then, the processor 230 calculates a DAC value corresponding to the word line WL to be selected by a linear correction based on a plurality of DAC values (step S164). Namely, in the history table, the same index is assigned to the word lines WL belonging to the same word line group GP, but by the linear correction, a suitable DAC value is assigned to each of the word lines in the same word line group GP.

Then, the processor 230 issues a read instruction to the NAND flash memory 100 with DAC value information that designates a voltage to be applied to the selected word line WL (step S165). In the NAND flash memory 100, for example, the sequencer 170 instructs a voltage generator to generate read voltage VCGRV based on the DAC value received, and voltage VCGRV is applied to the selected word line WL.

Figure 29:
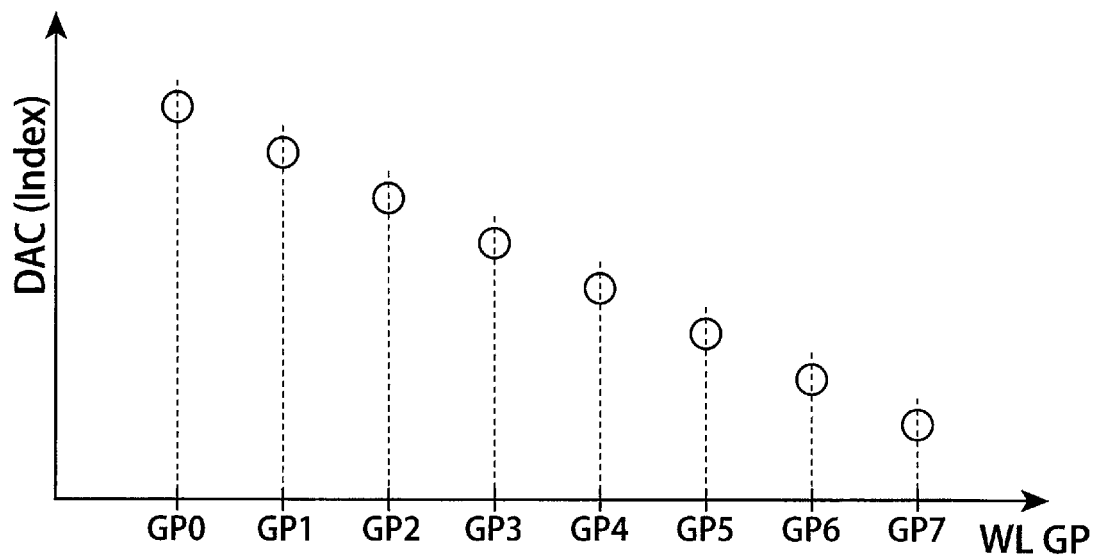
FIG. 29 is a graph showing a relationship between word line groups and DAC values according to the fourth embodiment.
Figure 30:
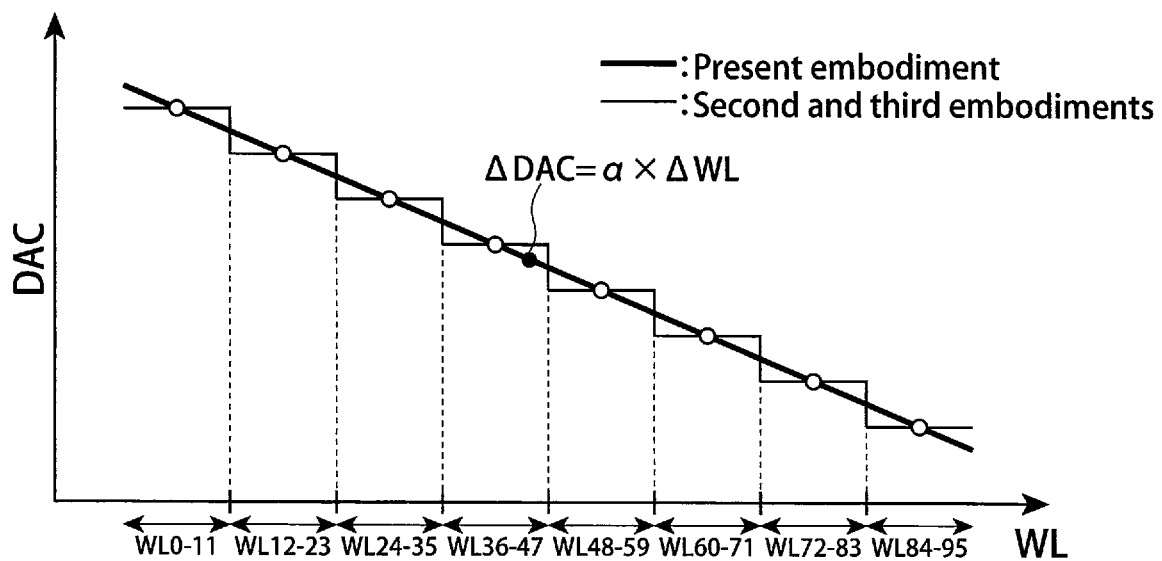
FIG. 30 is a graph showing a relationship between word lines and DAC values according to the fourth embodiment.

Details of the linear correction will be described. FIG. 29 is an example of the graph showing DAC values (i.e., index values) for the word line groups GP. As shown in FIG. 29, the threshold voltages of the memory cell transistors MT may be higher as the diameter of the memory pillar 31 is smaller. The DAC values obtained by the tracking operation are discrete values for each word line group GP as described above. However, there may be a case where the DAC values shown in FIG. 29 can be approximated by the linear function, for example. This is shown in FIG. 30. FIG. 30 is a graph showing the DAC values to be applied to the word lines WL obtained by the linear correction using the linear function in FIG. 29, and it is indicated by the thick line in FIG. 30. The graph indicated by the thin line in FIG. 30 shows the example of the first to third embodiments, in which the same DAC value is applied to a plurality of word lines WL belonging to the same word line group GP. In contrast, according to the present embodiment, DAC values corresponding to the linear function connecting the DAC values that correspond to the index values registered in the history table are applied. Namely, the shift amount ΔDAC from the default DAC value can be expressed as ΔDAC=α× ΔWL.

Figures 31A, 31B:
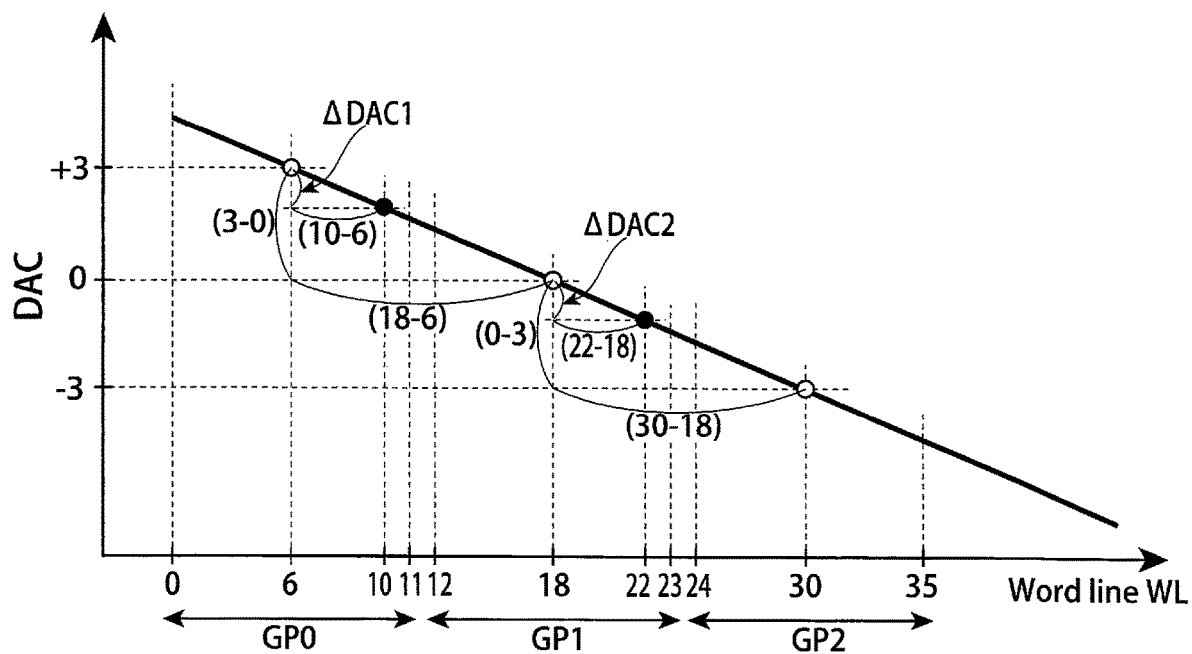
FIG. 31A is a diagram showing a relationship between word line groups and DAC values according to the fourth embodiment.
FIG. 31B is a graph showing a relationship between word lines and DAC values according to the fourth embodiment.

A specific example of the above-described linear correction will be described using FIGS. 31A and 31B. FIG. 31A is a table showing, in each word line group GP, the word line WL subjected to the tracking operation, and the DAC value corresponding to the index value obtained as a result of the tracking operation.

As shown in FIG. 31A, in the example of FIG. 31A, word lines WL6, WL18, WL30, . . . and WL90 located on the middle layer in the respective word line groups GP are subjected to the tracking operation. The DAC value applied to word line group GP0 is "+3", the DAC value applied to word line group GP1 is "0", the DAC value applied to word line group GP2 is "−3", and the DAC value applied to word line group GP7 is "−18". In this example, the case where data is read from word lines WL10 and WL22 will be described using FIG. 31B. FIG. 31B is a graph showing DAC values corresponding to word lines WL.

First, the case where word line WL10 is selected will be described. As shown in FIG. 31B, the DAC value of word line group GP0 and the DAC value of word line group GP1 are used to perform a linear correction. Namely, at least two word line groups GP are selected so that the selected word line WL is put between word lines WL subjected to the tracking operation (the configuration is not limited to this if word lines WL0 to WL5 and WL91 to WL95 at both ends are selected word lines). The change in the DAC values between word lines WL18 and WL6 is (0−3)="−3", and the inclination when they are approximated by the linear function is (−¼). The change in the number of word lines WL between word lines WL10 and WL6 is (10−6)="4", and if the amount changed from the DAC value of word line WL6 is defined as change amount ΔDAC1, the following relation holds.

$$(18-6):(3-0)=(10-6):\Delta DAC1$$

Thus, ΔDAC1="1", and the DAC value corresponding to word line WL10 is obtained as (3−1)="2".

The same applies to when word line WL22 is selected. In this case, as shown in FIG. 31B, the linear correction is performed using the DAC value of word line group GP1 and the DAC value of word line group GP2. If the amount changed from the DAC value of word line WL18 is defined as change amount ΔDAC2, the following relation holds.

$$(30-18):(0-3)=(22-18):\Delta DAC2$$

Thus, ΔDAC1="−1", and the DAC value corresponding to word line WL22 is obtained as "−1".

Figure 32:
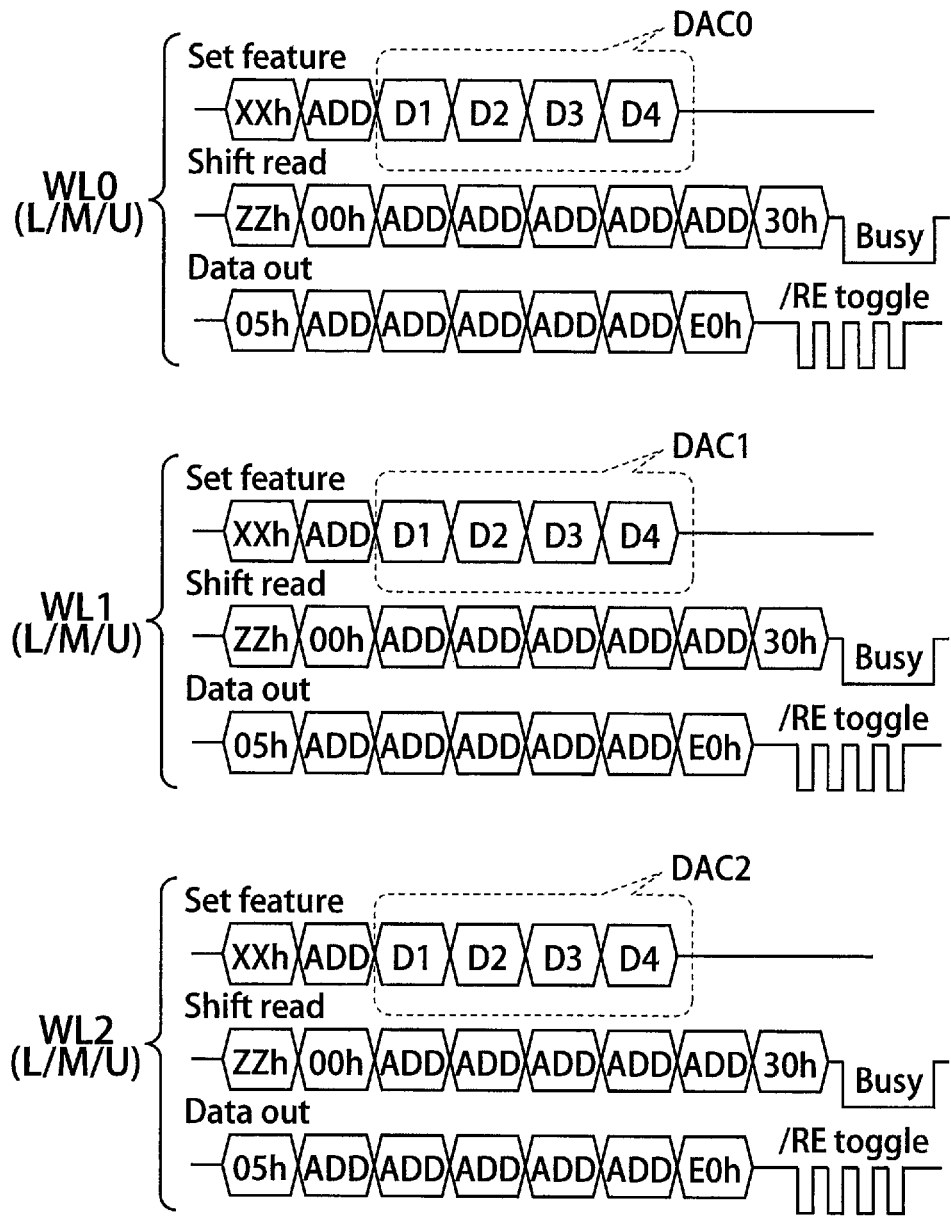
FIG. 32 shows command sequences in a data read operation according to the fourth embodiment.

FIG. 32 shows the command sequence transmitted from the controller 200 to the NAND flash memory 100 in data reading according to the present embodiment, and shows the example in which data is read from word lines WL0 to WL2.

As shown in FIG. 32, like the case of FIG. 8 described in the first embodiment, when data is read from a word line WL, the controller 200 sequentially issues a set feature command, a shift read command, and a data output command. The difference from FIG. 8 is that, as shown in FIG. 32, the set feature command is issued for each word line, not for each word line group. Namely, the controller 200 performs the correction process described in relation to FIGS. 31A and 31B to obtain a DAC value suitable for each word line WL. Thus, when data is read from word line WL0, DAC1 is set in the NAND flash memory 100 by the set feature command as a read voltage suitable for word line WL0. The same applies to word lines WL1 and WL2, and DAC1 and DAC2 are set in the NAND flash memory 100 by the set feature command. These DAC0 to DAC1 have a dependent relationship with each other. Specifically, the values of DAC0 to DAC1 are values according to a certain linear function.

The correction process described in relation to FIGS. 31A and 31B is performed on each of the lower page, the middle page, and the upper page. Thus, for reading each of the lower page, the middle page, and the upper page, the set feature command, the shift read command, and the data output command shown in FIG. 32 are issued. The DAC values applied to the lower pages of word lines WL0 to WL2 have a dependent relationship, the DAC values applied to the middle pages of word lines WL0 to WL2 have a dependent relationship with each other, and the DAC values applied to the upper pages of word lines WL0 to WL2 have a dependent relationship with each other.

4.2 Advantage According to Present Embodiment

According to the present embodiment, in a manner similar to the first to third embodiments, a plurality of word lines WL are grouped in the history table. An index is assigned to each word line group GP.

When data is read, the NAND flash memory 100 is instructed to calculate the DAC value to be used for each of word lines WL by the linear correction based on the indexes (DAC values) for the plurality of word line groups GP, and to apply voltage VCGRV based on the calculation result to the selected word line WL. Thus, suitable read voltages VCGRV can be applied to the word lines WL not subjected to the tracking operation when indexes to be registered in the history table are determined.

In the above-described embodiments, the description has been provided for the example in which the linear correction is performed on all word lines WL not subjected to the tracking operation to calculate a DAC value for each single word line. For example, focusing on word line group GP0 in which word line WL5 is subjected to the tracking operation, DAC values for word lines WL0 to WL4 and WL6 to WL11 are calculated by the linear correction. However, it is not necessarily required to calculate a DAC value for every single word line. For example, DAC values obtained by the linear correction may be grouped for each of a plurality of word lines. For example, the above-described example may also be a case where the same DAC value obtained by the linear correction is applied to word lines WL0 and WL1, another identical DAC value obtained by the linear correction is applied to word lines WL2 and WL3, and the DAC values corresponding to the intersections obtained in the tracking operation are applied to word lines WL4 to WL7.

Namely, focusing on one word line group GP, if the number of index values (N1=1) registered in the history table is compared with the number of types (volumes) of voltages (N2) applied to a plurality of word lines WL belonging to the word line group GP, N2=N1 in the first to third embodiments, whereas N2>N1 in the present embodiment.

5. Fifth Embodiment

Next, a memory system according to the fifth embodiment will be described. The present embodiment relates to the selection order of blocks BLK, word lines WL, string units SU, and pages, in the patrol operation in the first to fourth embodiments. In the following description, only the parts different from the first to fourth embodiments will be described.

5.1 Details of Patrol Operation

The patrol operation according to the present embodiment will be described using FIG. 33. FIG. 33 is a flowchart of the patrol operation, and shows the case where there are four blocks BLK, four string units SU in each block BLK, ninety six word lines WL in each string unit SU, and three bits (lower bit, middle bit, and upper bit) of held data of memory cell transistor MT. In the figure, four variables, i, j, k, and l are used, in which variable i denotes a page, i=1 denotes a lower page, i=2 denotes a middle page, and i=3 denotes an upper page (i.e., variable i in the present embodiment and a later-described sixth embodiment does not indicate the index described in the first embodiment, and does not indicate the number of shift reads described in the second embodiment). Variable j denotes the word line WL number, and j=0 to 95 (WL0 to WL95). Variable k denotes the string unit SU number, and k=0 to 3 (SU0 to SU3). Variable l denotes the block BLK number, and l=0 to 3 (BLK0 to BLK 3). The process of the controller 200 in FIG. 33 is executed essentially by the processor 230.

As shown in FIG. 33, the controller 200 first selects the lower page (i=0), word line WL0 (j=0), string unit SU0 (k=0), and block BLK0 (l=0) (steps S200 to S203). Then, the controller 200 instructs the NAND flash memory 100 to perform a shift read on the selected word line WL (step S204).

When the ECC circuit 260 fails in the error correction on the data read in the shift read (step S205, NO), the controller 200 updates the index in the history table, or executes the refresh operation described using FIGS. 16 and 18 in the second embodiment (step S206).

When the ECC circuit 260 succeeds in the error correction in step S205 (step S205, YES), or after step S206, it is determined whether the shift read target in step S204 is the last block BLK (l=3, i.e., BLK3) (step S207), when it is not last block BLK3 (step S207, NO), a next block BLK is selected (l=l+1, step S208), and the processing returns to step S204. Namely, the page to be read, the selected word line, and the selected string unit SU remain as they are while the shift read is repeatedly performed sequentially from block BLK0 to BLK1, BLK2 and BLK 3 (step S215).

When the shift read target is last block BLK3 (step S207, YES), the controller 200 determines whether the shift read target is the last string unit SU (k=3, i.e., SU3) (step S209). When it is not last string unit SU3 (step S209, NO), the controller 200 selects a next string unit SU (k=k+1, step S210), and the processing returns to step S203.

Namely, the page to be read and the selected word line remain as they are while the selected string unit SU is incremented and the shift read is repeatedly performed sequentially from block BLK0 to BLK1, BLK2, and BLK 3 (step S215).

When the shift read target is last string unit SU3 (step S209, YES), the controller 200 determines whether the shift read target is the last word line WL (j=95, i.e., WL95) (step S211). When it is not last word line WL95 (step S211, NO), the controller 200 selects a next word line WL (j=j+1, step S212), and the processing returns to step S202. Namely, the page to be read remains as it is while the selected word line WL is incremented, and the shift read is repeatedly performed sequentially on string units SU0 to SU3 from block BLK0 to BLK1, BLK2, and BLK 3 (step S215).

When the shift read target is last word line WL95 (step S211, YES), the controller 200 determines whether the shift read target is the upper page (i=2) (step S213). When it is not the upper page (step S213, NO), the controller 200 selects a next page, i.e., a middle page (i=1) (i=i+1, step S214), and the processing returns to step S201. Namely, the page to be read is incremented, and the shift read is repeatedly performed sequentially on word lines WL0 to WL95 of string units SU0 to SU3 from block BLK0 to BLK1, BLK2, and BLK 3 (step S215).

When the shift read target is the upper page (i=2) (step S213, YES), the processing returns to step S200. Namely, the shift read performed while the selected block BLK is shifted (step S215) is performed on the lower pages, middle pages, and upper pages of word lines WL0 to WL95 of each of string units SU0 to SU3. Thus, ultimately, the shift read is executed on the lower pages, middle pages, and upper pages of all word lines WL0 to WL95 of all string units SU0 to SU3 in all blocks BLK0 to BLK3.

5.2 Specific Example

Next, a specific example of the page selection order according to the present embodiment will be described using FIG. 34A. For the sake of clarification, FIG. 34A shows the case where each of four blocks BLK0 to BLK3 includes four string units SU0 to SU3, and two word line groups GP0 and GP1, in which each word line group GP includes a pair of word lines WL (a pair of word lines WL0 and WL1, or a pair of word lines WL2 and WL3). In addition, FIG. 34A shows in what order the three pages assigned to each of word lines WL0 to WL3 of each of string units SU0 to SU3 are subjected to the shift read in blocks BLK0 to BLK3.

In FIG. 34A, starting from block BLK0, blocks BLK are selected in the order indicated by the arrows. The numbers "1" to "48" in FIG. 34A show the order of selection. Namely, if one-time shift read is performed in a certain block BLK, the shift read is performed in a next block BLK, and the same applies thereafter. To assist in understanding, FIG. 34B shows a flowchart of what is shown in FIG. 34A. Each of steps S170 to S173 in FIG. 34B corresponds to step S204 in FIG. 33.

As shown in FIG. 34B, at first, block BLK0, word line WL0, the lower page, and string unit SU0 are selected, and the shift read is executed (step S170-1). Next, block BLK1, word line WL0, the lower page, and string unit SU0 are selected, and the shift read is executed (step S171-1). Then, block BLK2, word line WL0, the lower page, and string unit SU0 are selected, and the shift read is executed (step S172-1). Then, block BLK3, word line WL0, the lower page, and string unit SU0 are selected, and the shift read is executed (step S173-1). In this manner, the selected block BLK number is incremented from "0" to "3" while there is no change in the selected word line WL number, the selected string unit SU number, or the selected page. These four steps will be referred to as first loop LP1. First loop LP1 corresponds to step S215 in FIG. 33. The suffixes of steps S170 to S173 included in first loop LP1 correspond to the numbers "1" to "48" in each block BLK shown in FIG. 34A.

Thus, following steps S170-1 to S173-1, the string unit SU number is incremented, and first loop LP1 is repeated. Namely, at first, block BLK0, word line WL0, the lower page, and string unit SU1 are selected, and the shift read is executed (step S170-2). Next, block BLK1, word line WL0, the lower page, and string unit SU1 are selected, and the shift read is executed (step S171-2). Next, block BLK2, word line WL0, the lower page, and string unit SU1 are selected, and the shift read is executed (step S172-2). Then, block BLK3, word line WL0, the lower page, and string unit SU1 are selected, and the shift read is executed (step S173-2).

The same applies thereafter, and in the fifth, ninth, and thirteenth rounds of loop LP1, the selected word line WL number is incremented. Namely, in the fifth round of loop LP1, the selected word line is changed from WL0 to WL1. In the ninth round of loop LP1, the selected word line is changed from WL1 to WL2. In the thirteenth round of loop LP1, the selected word line is changed from WL2 to WL3.

In the seventeenth and thirty-third rounds of loop LP1, the selected page is changed. Namely, in the seventeenth round of loop LP1, the selected page is changed from the lower page to the middle page. In the thirty-third round of loop LP1, the selected page is changed from the middle page to the upper page.

In the forty-eighth round of loop LP1, at first, block BLK0, last word line WL3, the upper page, and last string unit SU3 are selected, and the shift read is executed (step S170-48). Next, block BLK1, word line WL3, the upper page, and string unit SU3 are selected, and the shift read is executed (step S171-48). Then, block BLK2, word line WL3, the upper page, and string unit SU3 are selected, and the shift read is executed (step S172-48). Then, block BLK3, word line WL3, the upper page, and string unit SU3 are selected, and the shift read is executed (step S173-48).

In the manner described above, first loop LP1 is repeated forty eight times. The assembly of the forty eight loops LP1 is referred to as second loop LP2. This second loop LP2 corresponds to steps S200 to S215 in FIG. 33. The controller 200 repeats the second loop LP2 unless other processes are particularly necessary. Each first loop LP1 is completed within period T1. Namely, during period T1, the shift read access to three blocks BLK0 to BLK3 is executed. Even when the index update or the refresh operation in step S206 described in relation to FIG. 33 is performed, one-time step S215 is completed in period T1. Furthermore, each second loop LP2 is completed within period T2 (>T1). Namely, during period T2, the shift read access to the lower pages, middle pages, and upper pages of all word lines WL0 to WL95 of all string units SU0 to SU3 of all blocks BLK0 to BLK3 is executed.

Figure 34C:
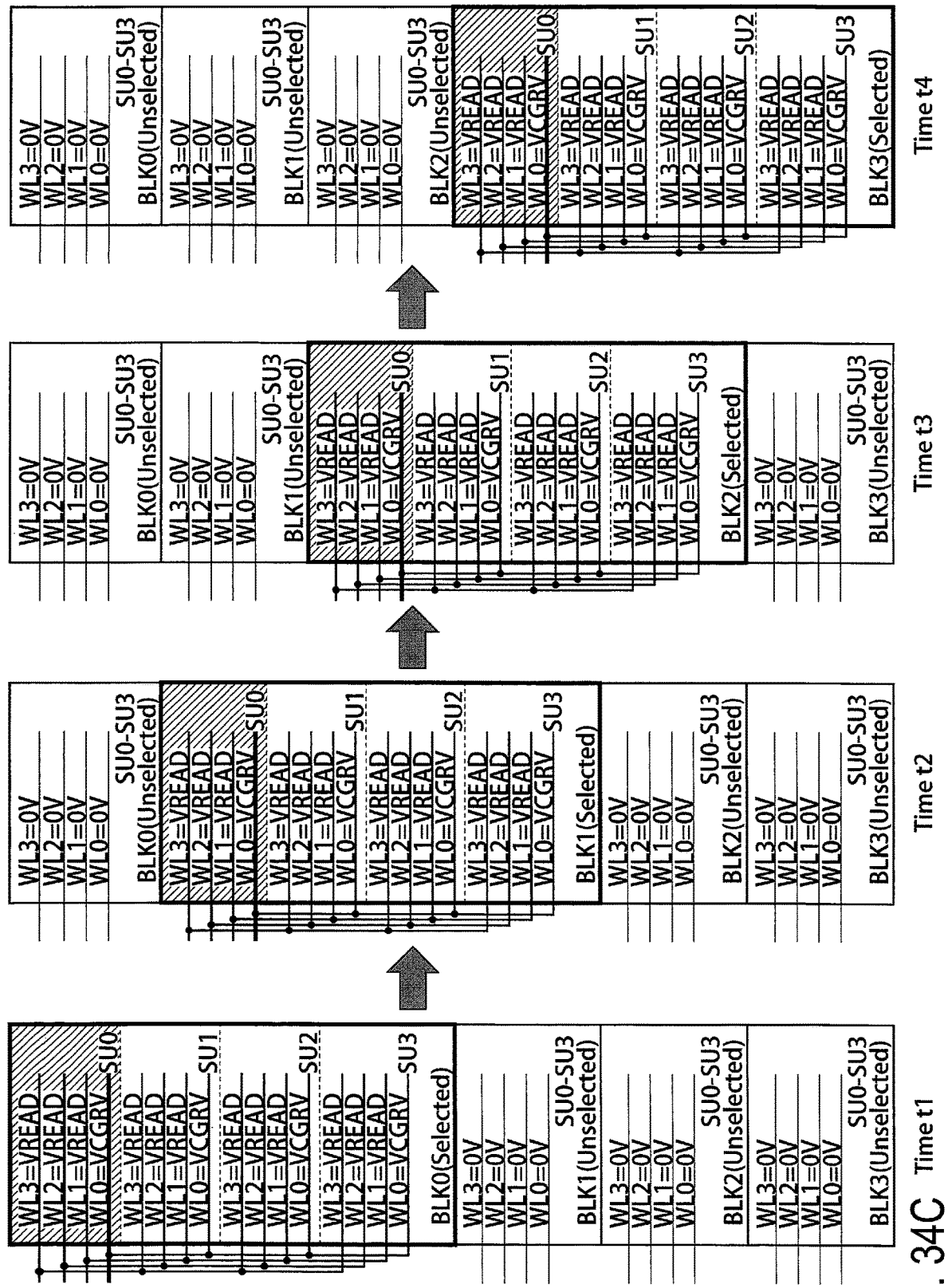

Next, the process of the memory cell array 110 during execution of first loop LP1 will be described. FIG. 34C is a circuit diagram of the memory cell array 110 during execution of the first round of first loop LP1. In FIG. 34C, the area surrounded by the thick line is the selected block BLK, the shaded area in the selected block BLK is the selected string unit SU, and the word line indicated by the thick line is the selected word line WL.

First, at time t1 of FIG. 34C, step S170-1 is executed. Namely, word line WL0 of block BLK0 is selected, and the shift read on the lower page is executed. Thus, the voltage for executing read operations AR and ER is applied to word line WL0 of block BLK0 as read voltage VCGRV, and voltage VREAD is applied to other word lines WL1 to WL3. In addition, in order to select string unit SU0, voltage VSG is applied to selection gate line SGD0, and for example, 0V is applied to SGD1 to SGD3. Moreover, 0V, for example, is applied to all word lines WL and all selection gate lines SGD of non-selected blocks BLK1 to BLK3.

When the lower page data is read from word line WL0 of string unit SU0 in block BLK0, the index update or refresh is executed as necessary, and at next time t2, step S171-1 is executed. Namely, word line WL0 of block BLK1 is selected, and the shift read on the lower page is executed. Thus, a voltage for executing read operations AR and ER is applied to word line WL0 of block BLK1 as read voltage VCGRV, and voltage VREAD is applied to other word lines WL1 to WL3. In addition, in order to select string unit SU0, voltage VSG is applied to selection gate line SGD0, and, for example, 0V is applied to SGD1 to SGD3. In addition, 0V, for example, is applied to all word lines WL and all selection gate lines SGD of non-selected blocks BLK0, BLK2, and BLK3.

When the lower page data is read from word line WL0 of string unit SU0 in block BLK1, the index update or refresh is executed as necessary, and at next time t3, step S172-1 is executed. Namely, word line WL0 of block BLK2 is selected, and the shift read on the lower page is executed. Thus, a voltage for executing read operations AR and ER is applied to word line WL0 of block BLK2 as read voltage VCGRV, and voltage VREAD is applied to other word lines WL1 to WL3. In addition, in order to select string unit SU0, voltage VSG is applied to selection gate line SGD0, and, for example, 0V is applied to SGD1 to SGD3. Moreover, 0V, for example, is applied to all word lines WL and all selection gate lines SGD of non-selected blocks BLK0, BLK1, and BLK3.

When the lower page data is read from word line WL0 of string unit SU0 in block BLK2, the index update or refresh is executed as necessary, and at next time t4, step S173-1 is executed. Namely, word line WL0 of block BLK3 is selected, and the shift read on the lower page is executed. Thus, a voltage for executing read operations AR and ER is applied to word line WL0 of block BLK3 as read voltage VCGRV, and voltage VREAD is applied to other word lines WL1 to WL3. In addition, in order to select string unit SU0, voltage VSG is applied to selection gate line SGD0, and for example, 0V is applied to SGD1 to SGD3. Moreover, 0V, for example, is applied to all word lines WL and all selection gate lines SGD of non-selected blocks BLK0 to BLK2.

During times t1 to t4 described above, steps S170-1 to S173-1, i.e., the first round of first loop LP1, are completed. Then, the second round of first loop LP1 (steps S170-2 to 173-2) is executed during times t5 to t8. This is shown in FIG. 34D.

As shown in FIG. 34D, the difference from FIG. 34C is that string unit SU1 is selected at each of times t5 to t8. Namely, selection gate line SGD1 is selected. The others are the same as FIG. 34C.

For example, at time t5, step S170-2 is executed. Namely, word line WL0 of block BLK0 is selected, and the shift read on the lower page is executed. At this time, in order to select string unit SU1, voltage VSG is applied to selection gate line SGD1.

Next, at times t6, t7, and t8, steps S171-2, 172-2, and 173-2 are respectively executed. Namely, word lines WL0 of blocks BLK1 to BLK3 are selected, and the shift read on the lower page is executed. At times t6 to t8, voltage VSG is applied to selection gate line SGD1, and string unit SU1 is selected.

In the manner described above, the second round of first loop LP1 is completed. The same applies to the third and subsequent rounds of first loop LP1.

5.3 Advantage According to Present Embodiment

According to the present embodiment, operation reliability of the memory system 1 can be further improved. This advantage will be described below.

First, according to the present embodiment, the patrol read is executed while the selected block BLK is shifted. In the embodiment, the memory cell array 110 includes four blocks BLK0 to BLK3, and sequentially accesses four blocks BLK0 to BLK3. Namely, four blocks BLK0 to BLK3 are accessed in the shortest order. The time in total required to access four blocks BLK0 to BLK3 is time T1 at the longest. Namely, the access to all blocks BLK0 to BLK3 included in the memory cell array 110 is executed at a cycle of T1 at the longest. This can improve reliability of data reading in each block BLK.

This is because of the following reason. In a three-dimensionally stacked NAND flash memory as shown in FIG. 3, when data is read from a certain word line WL, the memory cell transistors MT in the read target block BLK may be influenced by coupling. Thus, immediately after data reading, there are blocks BLK influenced by coupling and blocks BLK not influenced by coupling in the memory cell array 110. In this regard, according to the present embodiment, the patrol read on all blocks BLK0 to BLK3 is repeated at a short cycle. Namely, as described using FIGS. 34C and 34D, in the selected block BLK, voltage VCGRV is applied to the selected word lines WL, and voltage VREAD is applied to the non-selected word lines WL, regardless of the selected string unit SU or non-selected string unit SU. Thus, before the influence of coupling disappears, the patrol read is performed on all blocks BLK. Thus, in all blocks BLK, the memory cell transistors MT are always under the influence of coupling. As a result, the controller 200 may determine a read condition based on the premise that there is an influence of coupling, and does not have to consider a condition of a case where the influence of coupling has disappeared. Thus, it is possible to read data under suitable conditions, and to improve reliability of data reading.

According to the present embodiment, the patrol read at cycle T1 described above is repeated forty eight times to access all pages corresponding to all word lines WL of all string units SU in all blocks BLK. This period is period T2 at maximum. The role of the patrol read is not only to reduce the influence of coupling described above, but also to find, for example, a physical defect of memory cell transistors MT. To achieve this, it is necessary to access all pages corresponding to all word lines WL of all string units SU in all blocks BLK to find in which areas data can be correctly read and in which areas data cannot be correctly read. In the present embodiment, by the shortest forty eight patrol reads, the access to all pages corresponding to all word lines WL of all string units SU in all blocks BLK is completed. Thereby, even when an unexpected physical defect, for example, occurs, the controller 200 can take immediate address the problem, and it is possible to improve reliability of the read operation. Since the above-described influence of coupling disappears after a certain time has elapsed, the access to blocks BLK needs to be repeated at extremely short cycle T1, however, physical defects do not frequently occur as compared to the coupling, and thus the access to each page may be made at relatively long cycle T2.

As described above, according to the patrol read order of the present embodiment, it is possible to achieve both the countermeasure against coupling that requires the access at the short cycle in each block BLK, and the detection of physical defects that requires the access at a relatively long cycle in each page.

6. Sixth Embodiment

Next, a memory system according to the sixth embodiment will be described. The present embodiment relates to variations of the page selection order described in the fifth embodiment. In the following description, only the parts different from the fifth embodiment will be described.

6.1 First Example

Figure 35:
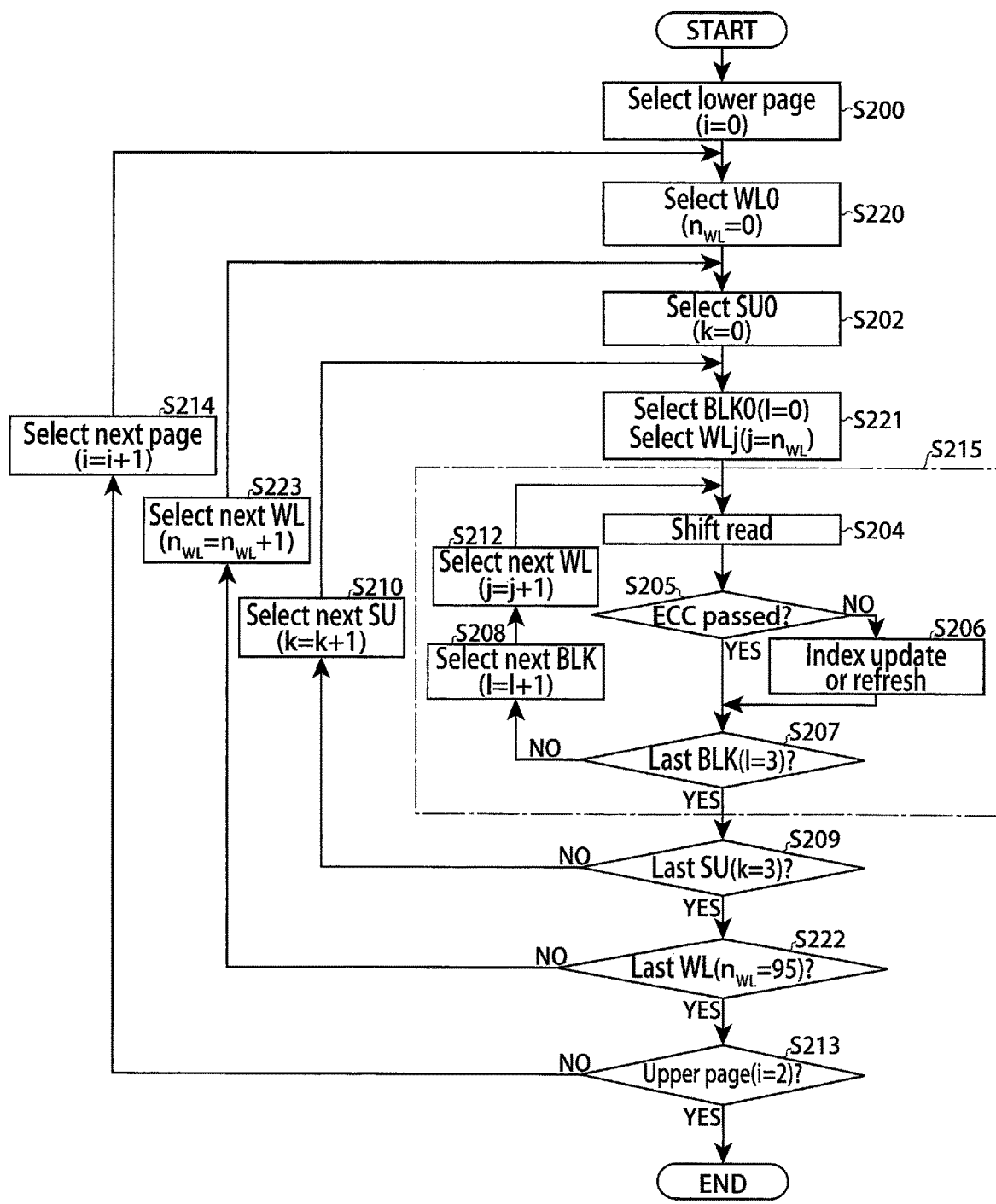
FIG. 35 is a flowchart showing the first example of the patrol operation according to the sixth embodiment.

First, the first example according to the present embodiment will be described. FIG. 35 is a flowchart of the patrol operation, and corresponds to FIG. 33 described in the fifth embodiment. That is, like FIG. 33, FIG. 35 shows the case where there are four blocks BLK, four string units SU in each block BLK, ninety six word lines WL in each string unit SU, and three bits of held data of memory cell transistor MT. The four variables, i, j, k, and l, in FIG. 35 denote the same as those in the fifth embodiment. In this example, the selected word line WL is shifted every time the selected block BLK is shifted in the fifth embodiment.

That is, as shown in FIG. 35, after step S200, the controller 200 determines an initial word line WL for executing first loop LP1. The variable showing the initial word line WL number is $n_{WL}$ in FIG. 35. First, $n_{WL}$="0", and word line WL0 is selected (step S220). Thereafter, in step S202, string unit SU0 is selected (k="0"), then block BLK0 is selected (l="0"), and word line WLj (j=$n_{WL}$) is selected (step S221).

Then, first loop LP1 is executed (step S215). First loop LP1 of this example differs from that in the fifth embodiment in that not only a next block BLK (l+1) is selected in step S208, but also a next word line WL is selected (j=j+1, step S212). In this manner, the block BLK and the word line WL are shifted, and the shift read is executed again (step S204).

When the shift read target is not last string unit SU3, a next string unit SU is selected (step S210) in the manner similar to the fifth embodiment, and the processing returns to step S221.

When the shift read target is last string unit SU3 (step S209, YES), the controller 200 determines whether the initial word line WL in the previous first loop LP1 is the last word line WL ($n_{WL}$="95", i.e., WL95) (step S222). When it is not last word line WL95 (step S222, NO), the controller 200 selects a next word line WL as an initial word line WL ($n_{WL}$=$n_{WL}$+1, step S223), and the processing returns to step S202. In this manner, since the initial word line WL is shifted in each first loop LP1, the variable j may exceed the last word line WL number (j="95") in step S222. In this case, the variable j is reset to "0", which indicates the initial word line, and it is incremented again from "0".

When the initial word line WL in loop LP1 is WL95 (step S222, YES), the processing advances to step S213.

Figure 36A:
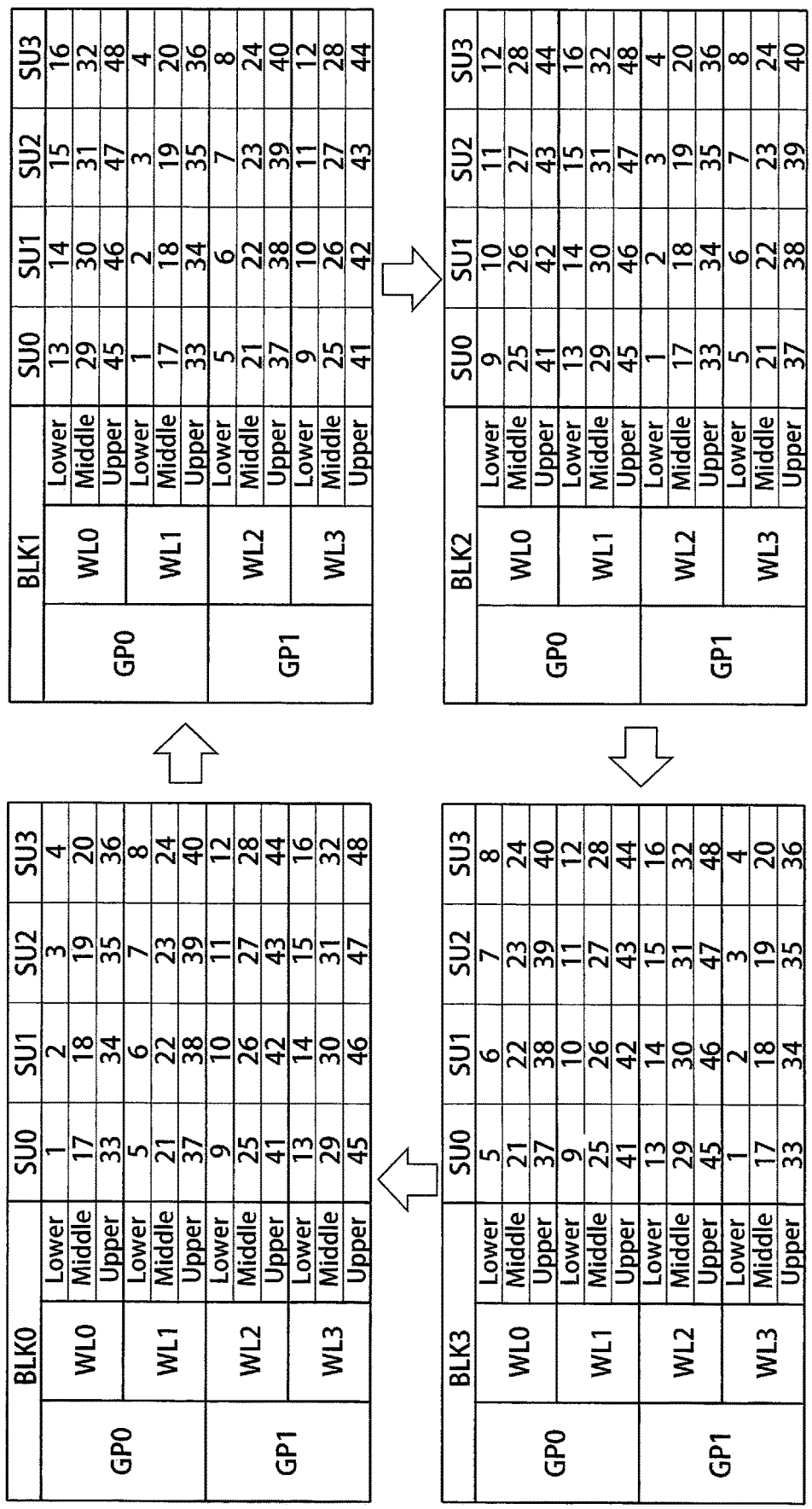
FIG. 36A shows diagrams showing the selection order of pages in the first example of the patrol operation according to the sixth embodiment.
Figure 36B:
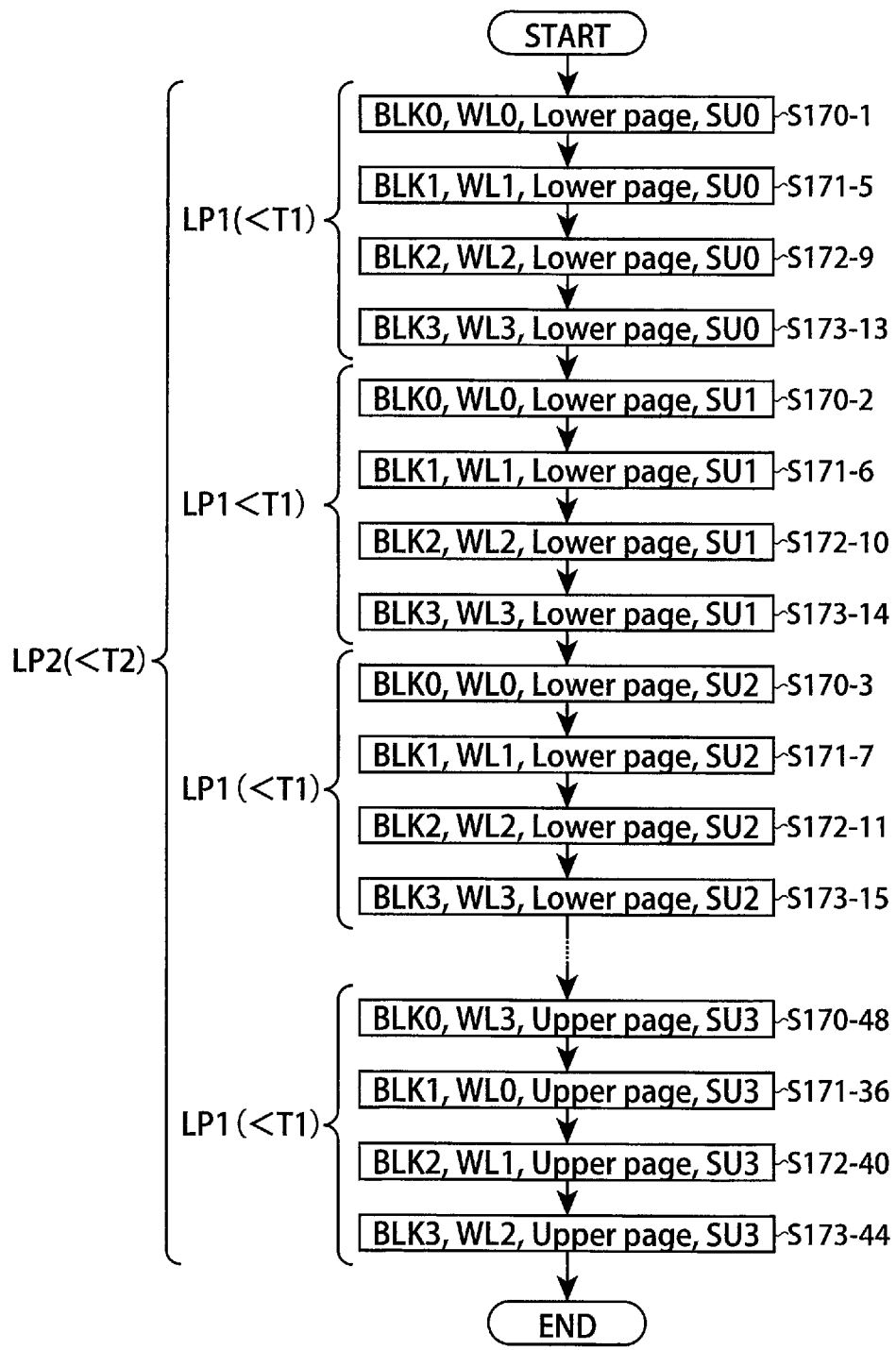
FIG. 36B is a flowchart showing the selection order of pages in the first example of the patrol operation according to the sixth embodiment.

Next, a specific example of this example will be described using FIG. 36A. FIG. 36A corresponds to FIG. 34A described in the fifth embodiment, and like FIG. 34A, shows the case where each of four blocks BLK0 to BLK3 includes four string units SU0 to SU3, and two word line groups GP0 and GP1, in which each word line group GP includes a pair of word lines WL (a pair of word lines WL0 and WL1, or a pair of word lines WL2 and WL3). FIG. 36B is the flowchart corresponding to FIG. 36A, and the suffix of each of steps S170 to S173 in FIG. 36B corresponds to the order shown in FIGS. 34A and 34B. Namely, step S171-5, for example, indicates step S171 executed in the fifth round of first loop LP1 in the fifth embodiment. This is to clarify the difference between the present embodiment and the fifth embodiment by comparing the reference numerals in FIG. 36B and those in FIG. 34B.

As shown in FIGS. 34B and 36B, at first, block BLK0, word line WL0, the lower page, and string unit SU0 are selected, and the shift read is executed (step S170-1). Next, the selected block and the selected word line are shifted to block BLK1 and word line WL1, respectively, then the lower page and string unit SU0 are selected, and the shift read is executed (step S171-5). Then, the selected block and the selected word line are shifted to block BLK2 and word line WL2, respectively, the lower page and string unit SU0 are selected, and the shift read is executed (step S172-9). Then, block BLK3, word line WL3, the lower page, and string unit SU0 are selected, and the shift read is executed (step S173-13).

In this manner, the selected block BLK number is incremented from "0" to "3", and the selected word line WL number is incremented from "0" to "3", while there is no change in the selected string unit SU number or the selected page. These four steps constitute the first round of first loop LP1. Namely, the first round of first loop LP1 includes steps S170-1, S171-5, S172-9, and S173-13 in FIG. 34B described in the fifth embodiment. Namely, the suffixes of steps S170 to S173 shown in FIG. 36B correspond to the numbers "1" to "48" in each block BLK shown in FIG. 34A.

Following steps S170-1, S171-5, S172-9 and S173-13, the string unit SU number is incremented, and first loop LP1 is repeated. Namely, at first, block BLK0, word line WL0, the lower page, and string unit SU1 are selected, and the shift read is executed (step S170-2). Next, block BLK1, word line WL1, the lower page, and string unit SU1 are selected, and the shift read is executed (step S171-6). Next, block BLK2, word line WL2, the lower page, and string unit SU1 are selected, and the shift read is executed (step S172-10). Then, block BLK3, word line WL3, the lower page, and string unit SU1 are selected, and the shift read is executed (step S173-14).

The same applies thereafter, and in the fifth, ninth, and thirteenth rounds of loop LP1, the initial word line WL number in first loop LP1 is incremented. Namely, in the fifth round of loop LP1, the initial word line is changed from WL0 to WL1. In the ninth round of loop LP1, the initial word line is changed from WL1 to WL2. In the thirteenth round of loop LP1, the initial word line is changed from WL2 to WL3.

In the seventeenth and thirty-third rounds of loop LP1, the selected page is changed. Namely, in the seventeenth round of loop LP1, the selected page is changed from the lower page to the middle page. In the thirty-third round of loop LP1, the selected page is changed from the middle page to the upper page. This is the same as the fifth embodiment.

In the forty-eighth round of loop LP1, at first, block BLK0, last word line WL3, the upper page, and last string unit SU3 are selected, and the shift read is executed (step S170-48). Next, block BLK1, word line WL0, the upper page, and string unit SU3 are selected, and the shift read is executed (step S171-36). Then, block BLK2, word line WL1, the upper page, and string unit SU3 are selected, and the shift read is executed (step S172-40). Then, block BLK3, word line WL2, the upper page, and string unit SU3 are selected, and the shift read is executed (step S173-44).

In the manner described above, first loop LP1 is repeated forty eight times by which second loop LP2 is executed.

Figure 36C:
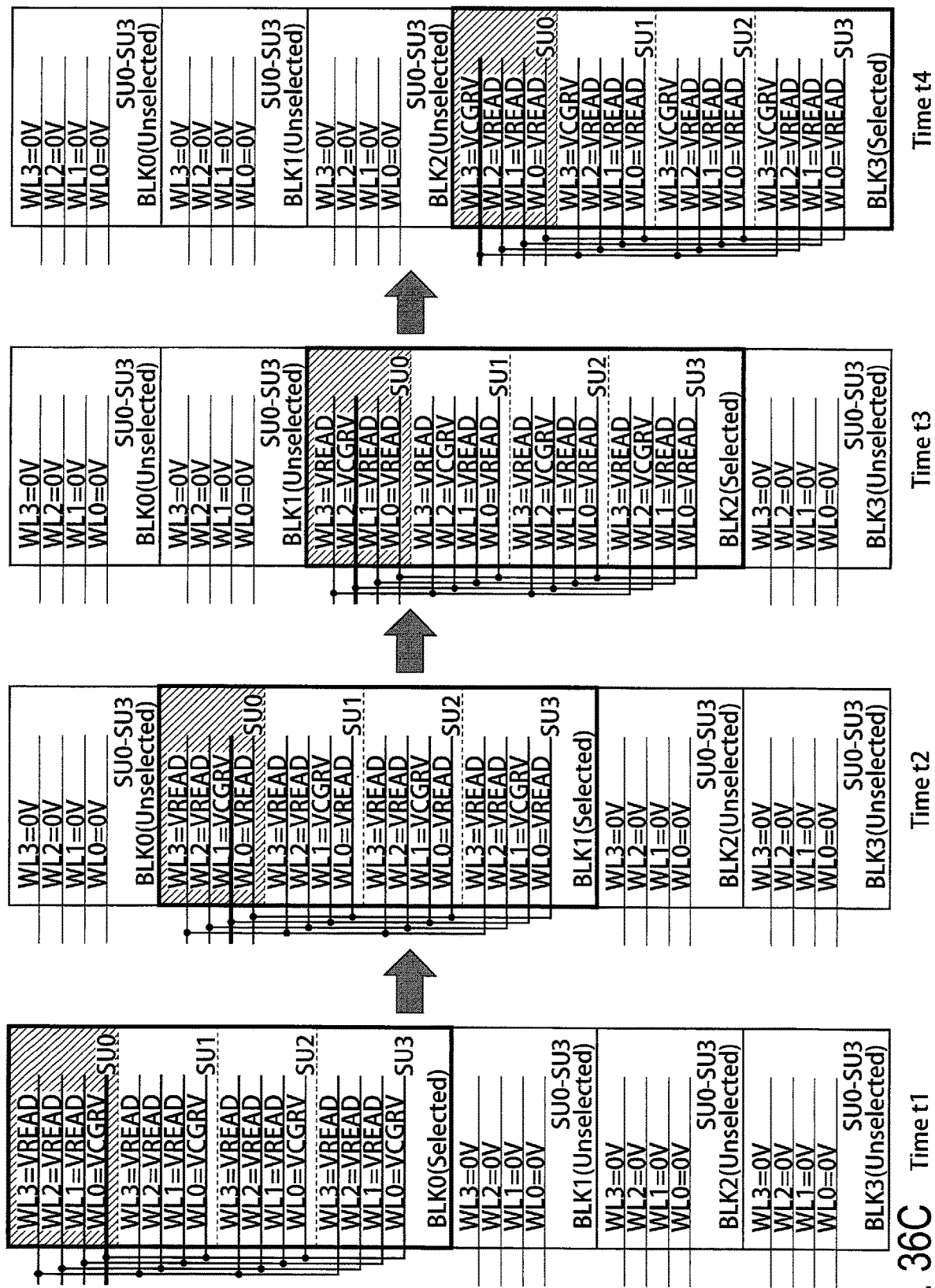

Next, the process of the memory cell array 110 during execution of first loop LP1 of the present example will be described. FIG. 36C is a circuit diagram of the memory cell array 110 during execution of the first round of first loop LP1.

First, at time t1 of FIG. 36C, step S170-1 is executed. Namely, word line WL0 of block BLK0 is selected, and the shift read on the lower page is executed. Thus, read voltage VCGRV is applied to word line WL0 of block BLK0, and voltage VREAD is applied to other word lines WL1 to WL3. In addition, in order to select string unit SU0, voltage VSG is applied to selection gate line SGD0.

When the lower page data is read from word line WL0 of string unit SU0 in block BLK0, the index update or refresh is executed as necessary, and at next time t2, step S171-5 is executed. Namely, word line WL1 of block BLK1 is selected, and the shift read on the lower page is executed. Thus, read voltage VCGRV is applied to word line WL1 of block BLK1, and voltage VREAD is applied to other word lines WL0, WL2, and WL3. In addition, in order to select string unit SU0, voltage VSG is applied to selection gate line SGD0.

When the lower page data is read from word line WL1 of string unit SU0 in block BLK1, the index update or refresh is executed as necessary, and at next time t3, step S172-9 is executed. Namely, word line WL2 of block BLK2 is selected, and the shift read on the lower page is executed. Thus, read voltage VCGRV is applied to word line WL2 of block BLK2, and voltage VREAD is applied to other word lines WL0, WL1, and WL3. In addition, in order to select string unit SU0, voltage VSG is applied to selection gate line SGD0.

When the lower page data is read from word line WL2 of string unit SU0 in block BLK2, the index update or refresh is executed as necessary, and at next time t4, step S173-13 is executed. Namely, word line WL3 of block BLK3 is selected, and the shift read on the lower page is executed. Thus, read voltage VCGRV is applied to word line WL3 of block BLK3, and voltage VREAD is applied to other word lines WL0 to WL2. In addition, in order to select string unit SU0, voltage VSG is applied to selection gate line SGD0.

During times t1 to t4 described above, steps S170-1, S171-5, S172-9 and S173-13, i.e., the first round of first loop LP1, are completed. Then, the second round of first loop LP1 (steps S170-2, S171-6, S172-10 and S173-14) is executed during times t5 to t8. This is shown in FIG. 36D.

As shown in FIG. 36D, the difference from FIG. 36C is that string unit SU1 is selected at each of times t5 to t8. Namely, selection gate line SGD1 is selected. The others are the same as FIG. 36C.

Similarly, third to forty-eighth rounds of first loop LP1 are repeated.

6.2 Second Example

Figure 37:
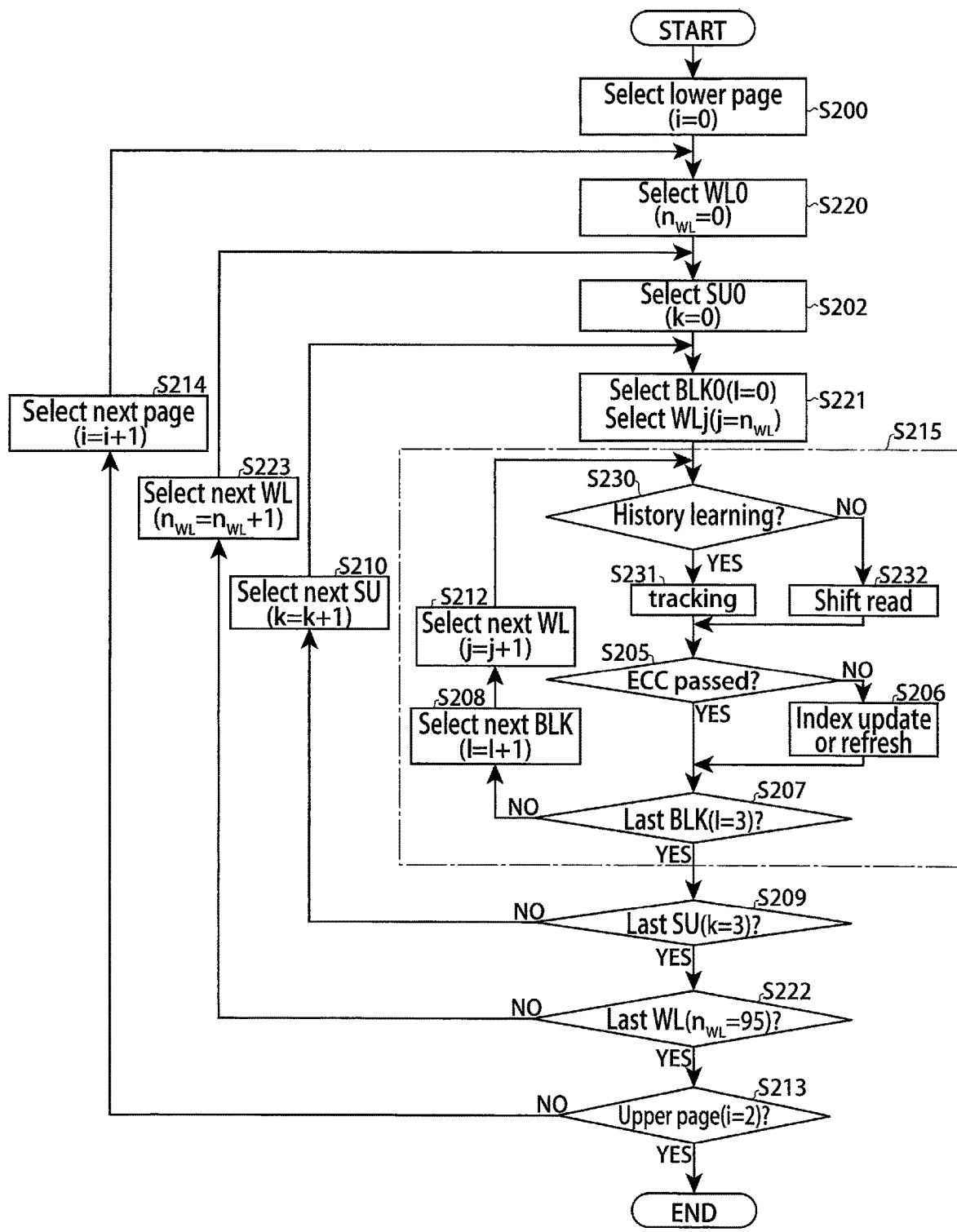
FIG. 37 is a flowchart showing the second example of the patrol operation according to the sixth embodiment.

Next, the second example according to the embodiment will be described. FIG. 37 is a flowchart of the patrol operation, and corresponds to FIG. 35 described in the first example. This example differs from the first example in that the tracking operation is performed on one word line WL in one first loop LP1.

As shown in FIG. 37, after step S221, the controller 200 determines whether to perform "history learning" (step S230). "History learning" is to obtain an intersection of threshold distributions corresponding to the read target page by the tracking operation to update a history table based on the result thereof. When the history learning is not performed (step S230, NO), the controller 200 issues a shift read instruction (step S232). The operation in this case is exactly the same as FIG. 35.

When the controller 200 performs the history learning (step S230, YES), the controller 200 instructs the NAND flash memory 100 to perform the tracking operation (step S231). Details of the tracking operation are as described in the first embodiment. Then, the shift read is performed using a voltage corresponding to the intersection obtained. Thereafter, the operations of step S205 and the subsequent steps are performed.

Figure 38:
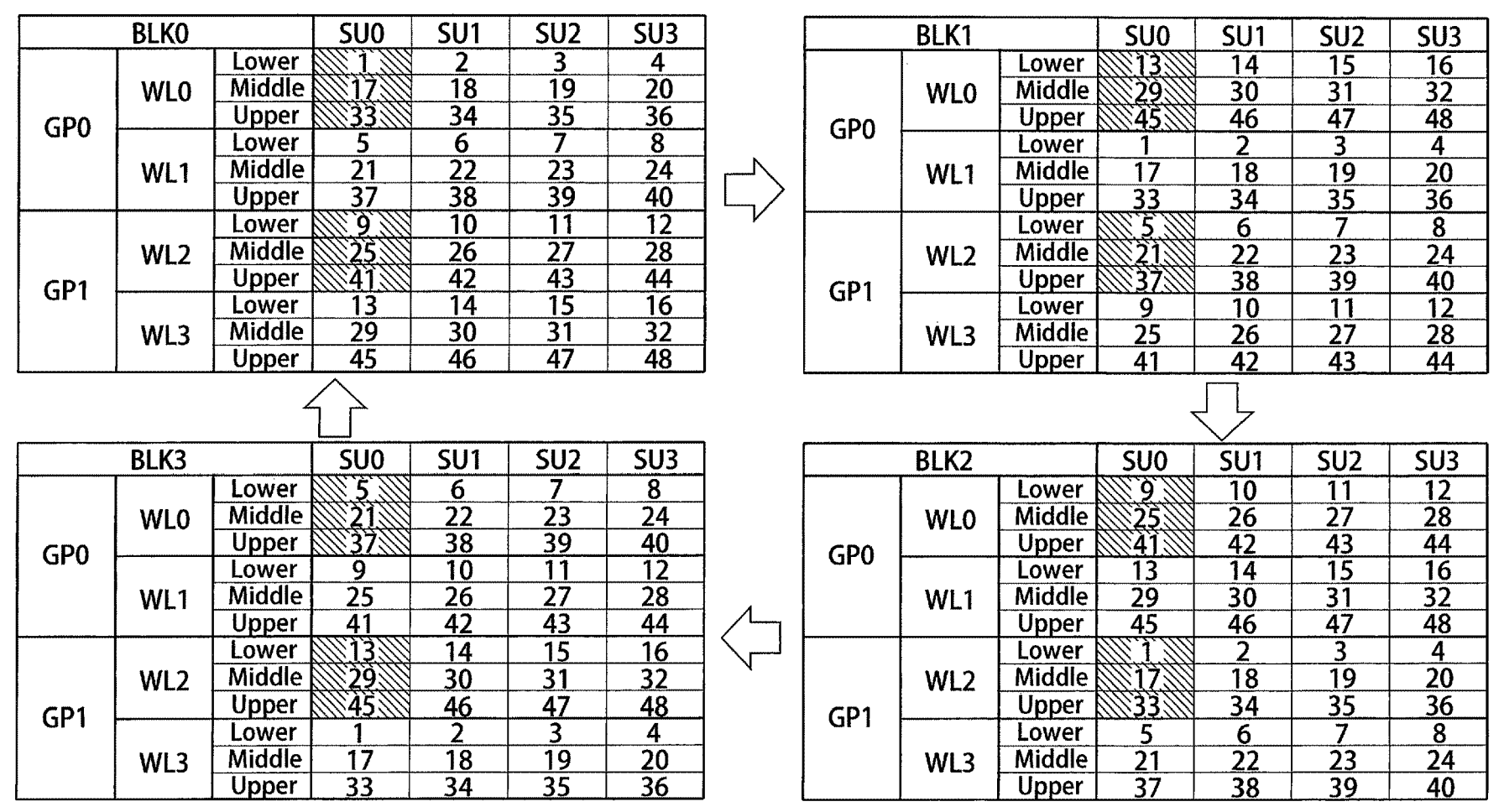

FIG. 38 is a specific example of the present example, and corresponds to FIG. 36A described in the first example. The difference from FIG. 36A is that, in FIG. 38, the tracking operation is performed in the shaded patrol reads.

As shown in FIG. 38, the page selection order during the patrol read in this example is the same as that in the first example. However, the tracking operation is performed in the following.

first round of first loop LP1: BLK0, SU0, WL0, lower page
first round of first loop LP1: BLK2, SU0, WL2, lower page
fifth round of first loop LP1: BLK1, SU0, WL2, lower page
fifth round of first loop LP1: BLK3, SU0, WL0, lower page
ninth round of first loop LP1: BLK0, SU0, WL2, lower page
ninth round of first loop LP1: BLK2, SU0, WL0, lower page
thirteenth round of first loop LP1: BLK1, SU0, WL0, lower page
thirteenth round of first loop LP1: BLK3, SU0, WL2, lower page
seventeenth round of first loop LP1: BLK0, SU0, WL0, middle page
seventeenth round of first loop LP1: BLK2, SU0, WL2, middle page
twenty-first round of first loop LP1: BLK1, SU0, WL2, middle page
twenty-first round of first loop LP1: BLK3, SU0, WL0, middle page
twenty-fifth round of first loop LP1: BLK0, SU0, WL2, middle page
twenty-fifth round of first loop LP1: BLK2, SU0, WL0, middle page
twenty-ninth round of first loop LP1: BLK1, SU0, WL0, middle page
twenty-ninth round of first loop LP1: BLK3, SU0, WL2, middle page
thirty-third round of first loop LP1: BLK0, SU0, WL0, upper page
thirty-third round of first loop LP1: BLK2, SU0, WL2, upper page
thirty-seventh round of first loop LP1: BLK1, SU0, WL2, upper page
thirty-seventh round of first loop LP1: BLK3, SU0, WL0, upper page
forty-first round of first loop LP1: BLK0, SU0, WL2, upper page
forty-first round of first loop LP1: BLK2, SU0, WL0, upper page
forty-fifth round of first loop LP1: BLK1, SU0, WL0, upper page
forty-fifth round of first loop LP1: BLK3, SU0, WL2, upper page According this example, the tracking operation is performed regularly, and thus it is possible to further improve accuracy of the history table.

6.3 Third Example

Figure 39:
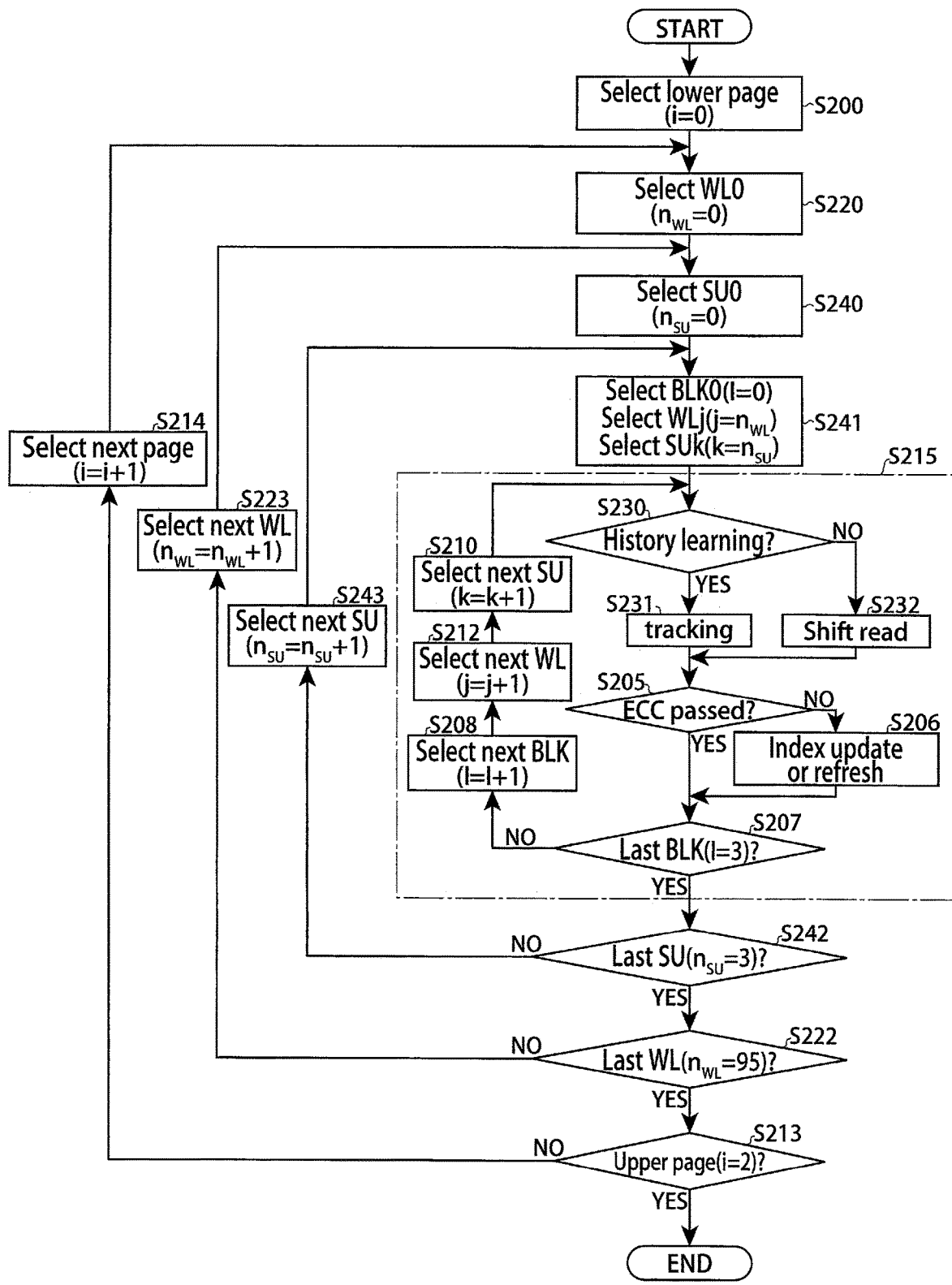
FIG. 39 is a flowchart showing the third example of the patrol operation according to the sixth embodiment.

Next, the third example according to the embodiment will be described. In this example, the first example and the second example are combined, and string units SU are shifted in first loop LP1. In the following, only the parts different from those of the first and second examples will be described. FIG. 39 is a flowchart of the patrol operation according to the third example.

As shown in FIG. 39, in FIG. 37 described in the second example, after step S220, the controller 200 determines an initial string unit SU for executing first loop LP1 (step S240). The variable indicating this initial string unit SU number is $n_{SU}$, in FIG. 39. First, $n_{SU}$="0", and string unit SU0 is selected. Then, block BLK0 is selected (l="0"), and word line WLj (j=$n_{WL}$) and string unit SUk (k=$n_{SU}$) are selected (step S241).

Then, first loop LP1 is executed (step S215). First loop LP1 of this example differs from the second example described in relation to FIG. 37 in that not only a next block BLK (l+1) is selected in step S208 and a next word line WL (j=j+1) is selected in step S212, but also a next string unit SU is selected (k=k+1, step S210). In this manner, the block BLK, the word line WL, and the string unit SU are shifted, and the shift read or tracking operation is executed again (step S232 or S231).

Then, the controller 200 determines whether initial string unit SU in next previous first loop LP1 is the last string unit SU ($n_{su}$="3", i.e., SU3) (step S242). When it is not last string unit SU3 (step S242, NO), the controller 200 selects next string unit SU as initial string unit SU ($n_{su}=n_{su}+1$, step S243), and the processing returns to step S241. In this manner, since initial string unit SU is shifted in each first loop LP1, the variable k may exceed the last string unit SU number (k="3") in step S210. In this case, the variable k is reset to "0" which indicates the initial string unit, and is incremented again from "0".

Thereafter, the processes of step S222 and the subsequent steps described in relation to FIG. 39 in the second example are performed.

Figure 40A:
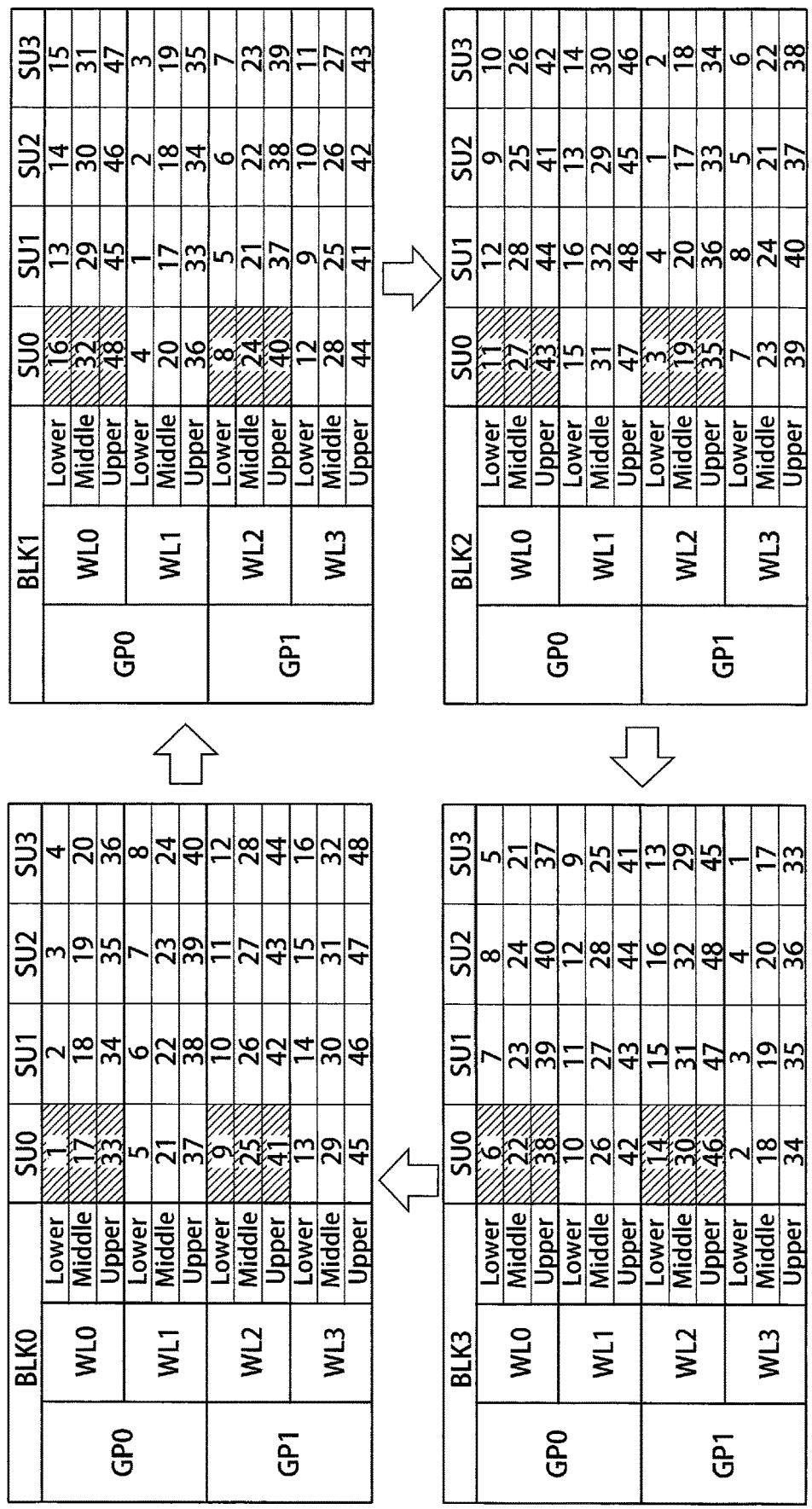
FIG. 40A shows diagrams showing the selection order of pages in the third example of the patrol operation according to the sixth embodiment.
Figure 40B:
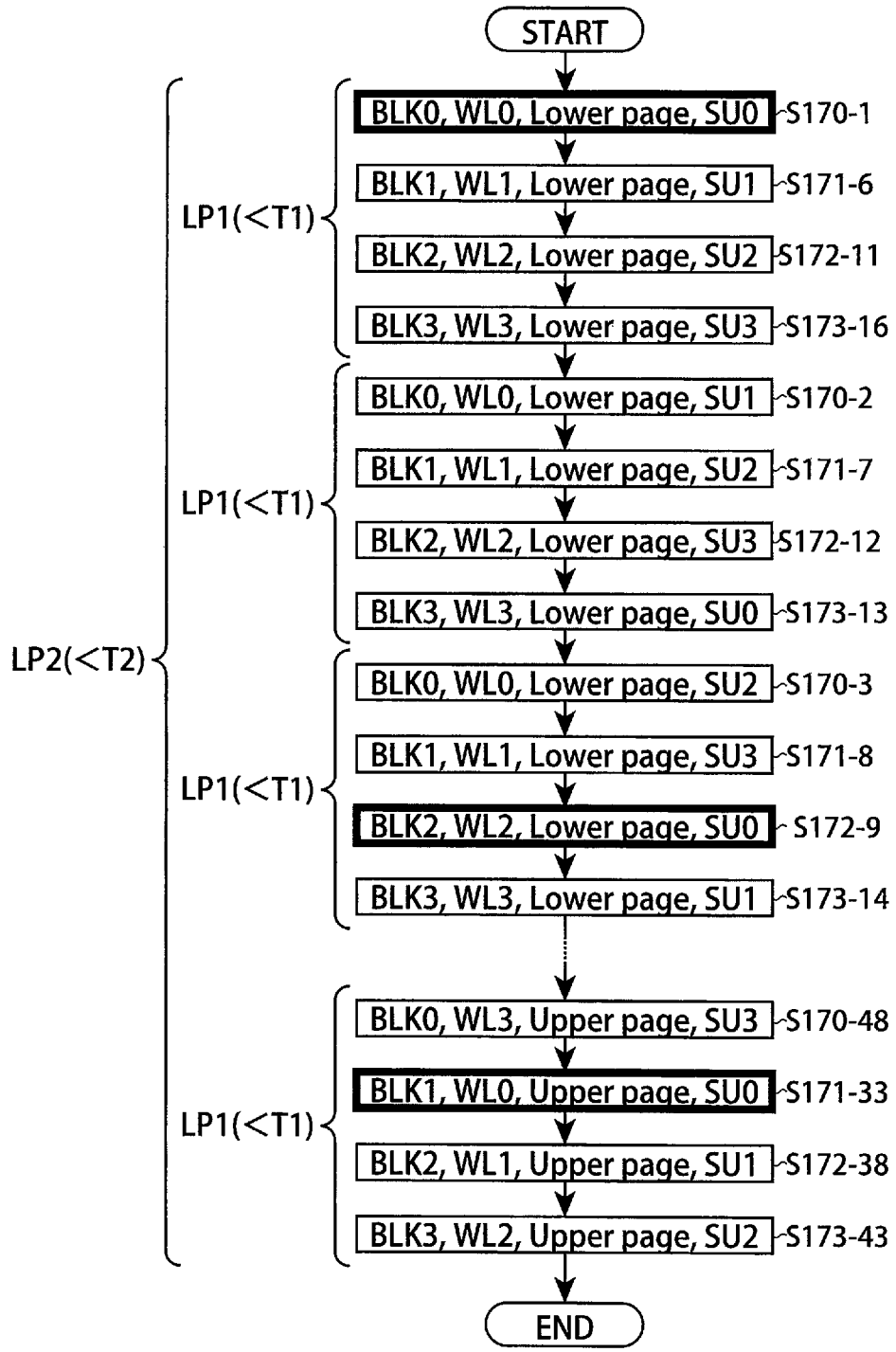
FIG. 40B is a flowchart showing the selection order of pages in the third example of the patrol operation according to the sixth embodiment.

FIG. 40A is a specific example of this example, and like FIG. 38, the tracking operation is performed in the patrol reads shaded in FIG. 40A. FIG. 40B is a flowchart corresponding to FIG. 40A, and the tracking operation is performed in the steps indicated by the frame of the thick line in FIG. 40B.

As shown in FIGS. 40A and 40B, at first, block BLK0, word line WL0, the lower page, and string unit SU0 are selected, and the shift read is executed (step S170-1). At this time, the tracking operation is performed, and voltages corresponding to the intersections between the threshold distributions for the lower page, i.e., the intersection between the "Er" state threshold distribution and the "A" state threshold distribution, and the intersection between the "D" state threshold distribution and the "E" state threshold distribution, are obtained. Next, the selected block, the selected word line, and the selected string unit are shifted to block BLK1, word line WL1, and SU1, respectively, and the shift read on the lower page is executed (step S171-6). Then, the selected block, the selected word line, and the selected string unit are shifted to block BLK2, word line WL2, and string unit SU2, respectively, and the shift read on the lower page is executed (step S172-11). Then, block BLK3, word line WL3, the lower page, and string unit SU3 are selected, and the shift read is executed (step S173-16).

In this manner, the selected page remains as it is while the selected block BLK number is incremented from "0" to "3", the selected word line WL number is incremented from "0" to "3", and the selected string unit SU number is incremented from "0" to "3". These four steps constitute a first round of first loop LP1. Namely, the first round of first loop LP1 includes steps S170-1, S171-6, S172-11, and S173-16 in FIG. 34B described in the fifth embodiment.

Next, the initial string unit SU number is incremented from "0" to "1", and first loop LP1 is repeated. Namely, at first, block BLK0, word line WL0, the lower page, and string unit SU1 are selected, and the shift read is executed (step S170-2). Next, block BLK1, word line WL1, the lower page, and string unit SU2 are selected, and the shift read is executed (step S171-7). Next, block BLK2, word line WL2, the lower page, and string unit SU3 are selected, and the shift read is executed (step S172-12). Then, block BLK3, word line WL3, the lower page, and string unit SU0 are selected, and the shift read is executed (step S173-13).

The same applies thereafter, and in the third and fourth rounds of first loop LP1, the initial string unit SU number is incremented to "2" and "3", respectively. In addition, in the fifth, ninth, and thirteenth rounds of first loop LP1, the initial word line WL number is incremented to "1" to "3", respectively. Namely, in the fifth round of loop LP1, the initial word line is changed from WL0 to WL1. In the ninth round of loop LP1, the initial word line is changed from WL1 to WL2. In the thirteenth round of loop LP1, the initial word line is changed from WL2 to WL3. Then, the tracking operation is performed in the following.

first round of first loop LP1: BLK0, SU0, WL0, lower page third round of first loop LP1: BLK2, SU0, WL2, lower page sixth round of first loop LP1: BLK3, SU0, WL0, lower page eighth round of first loop LP1: BLK1, SU0, WL2, lower page ninth round of first loop LP1: BLK0, SU0, WL2, lower page eleventh round of first loop LP1: BLK2, SU0, WL0, lower page fourteenth round of first loop LP1: BLK3, SU0, WL2, lower page sixteenth round of first loop LP1: BLK1, SU0, WL0, lower page seventeenth round of first loop LP1: BLK0, SU0, WL0, middle page nineteenth round of first loop LP1: BLK2, SU0, WL2, middle page twenty-second round of first loop LP1: BLK3, SU0, WL0, middle page twenty-fourth round of first loop LP1: BLK1, SU0, WL2, middle page twenty-fifth round of first loop LP1: BLK0, SU0, WL2, middle page twenty-seventh round of first loop LP1: BLK2, SU0, WL0, middle page thirtieth round of first loop LP1: BLK3, SU0, WL2, middle page thirty-second round of first loop LP1: BLK1, SU0, WL0, middle page thirty-third round of first loop LP1: BLK0, SU0, WL0, upper page thirty-fifth round of first loop LP1: BLK2, SU0, WL2, upper page thirty-eighth round of first loop LP1: BLK3, SU0, WL0, upper page fortieth round of first loop LP1: BLK1, SU0, WL2, upper page forty-first round of first loop LP1: BLK0, SU0, WL2, upper page forty-third round of first loop LP1: BLK2, SU0, WL0, upper page forty-sixth round of first loop LP1: BLK3, SU0, WL2, upper page forty-eighth round of first loop LP1: BLK1, SU0, WL0, upper page In the manner described above, first loop LP1 is repeated forty eight times by which the second loop LP2 is executed.

Next, the process of the memory cell array 110 during execution of first loop LP1 of this example will be described. FIG. 40C is a circuit diagram of the memory cell array 110 during execution of the first round of first loop LP1.

First, at time t1 of FIG. 40C, step S170-1 is executed. Namely, word line WL0 of block BLK0 is selected, and the tracking operation on the lower page is executed. Then, the shift read is executed using the DAC value obtained by the tracking operation.

At next time t2, step S171-6 is executed. Namely, word line WL1 of block BLK1 is selected, and the shift read on the lower page is executed. Thus, read voltage VCGRV is applied to word line WL1 of block BLK1, and voltage VREAD is applied to other word lines WL0, WL2, and WL3. In addition, in order to select string unit SU1, voltage VSG is applied to selection gate line SGD1.

At next time t3, step S172-11 is executed. Namely, word line WL2 of block BLK2 is selected, and the shift read on the lower page is executed. Thus, read voltage VCGRV is applied to word line WL2 of block BLK2, and voltage VREAD is applied to other word lines WL0, WL1, and WL3. In addition, in order to select string unit SU2, voltage VSG is applied to selection gate line SGD2.

At next time t4, step S173-16 is executed. Namely, word line WL3 of block BLK3 is selected, and the shift read on the lower page is executed. Thus, read voltage VCGRV is applied to word line WL3 of block BLK3, and voltage VREAD is applied to other word lines WL0 to WL2. In addition, in order to select string unit SU3, voltage VSG is applied to selection gate line SGD3.

During times t1 to t4 described above, steps S170-1, S171-6, S172-11 and S173-16, i.e., the first round of first loop LP1, are completed. Then, the second round of first loop LP1 (steps S170-2, S171-7, S172-12 and S173-13) are executed during times t5 to t8. This is shown in FIG. 40D.

As shown in FIG. 40D, the difference from FIG. 40C is that string units SU1, SU2, SU3, and SU0 are selected at times t5 to t8, respectively. Namely, at times t5, t6, t7, and t8, selection gate lines SGD1, SGD2, SGD3, and SGD0 are selected, respectively. The others are the same as FIG. 40C.

During times t5 to t8 described above, the second round of first loop LP1 is completed. Then, the third round of first loop LP1 (steps S170-3, S171-8, S172-9, and S173-14) is executed during times t9 to t12. This is shown in FIG. 40E.

Figure 40E:
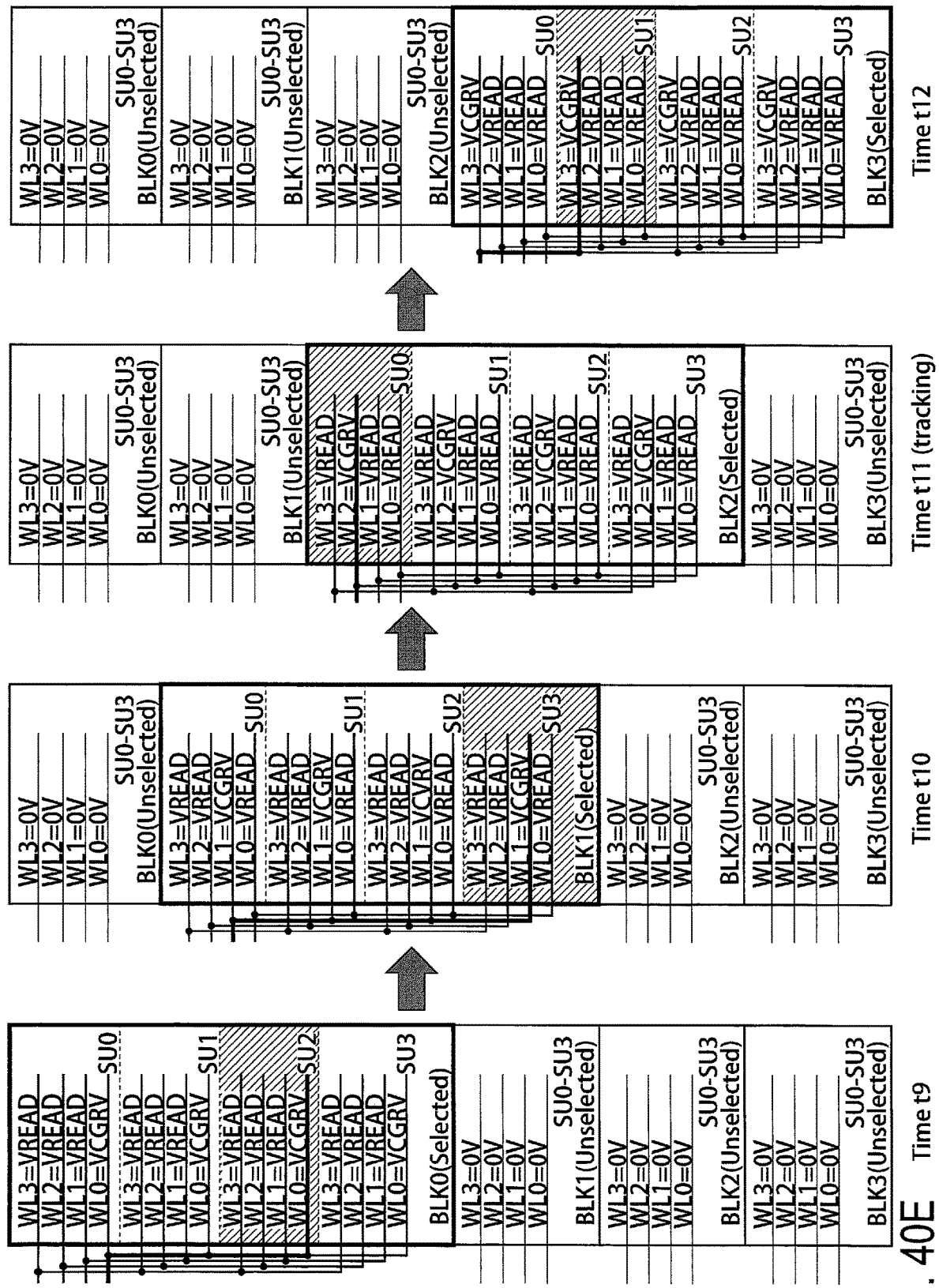

As shown in FIG. 40E, the difference from FIG. 40D is that at times t9 to t12, string units SU2, SU3, SU0, and SU1 are selected, respectively. Namely, at times t9, t10, t11, and t12, selection gate lines SGD2, SGD3, SGD0, and SGD1 are selected, respectively. The others are the same as FIG. 40D.

As described above, in first loop LP1, not only block BLK and word line WL, but also string unit SU to be selected may be shifted.

6.4 Fourth Example

Next, the fourth example according to the present embodiment will be described. In this example, pages are shifted instead of string units SU in first loop LP1 in the third example described above. In the following, only the parts different from those of the third example will be described. FIG. 41 is a flowchart of the patrol operation according to the fourth example.

As shown in FIG. 41, the controller 200 determines, in FIG. 39 described in the third example, an initial page for executing first loop LP1 (step S250). The variable indicating the initial page is $n_{LMU}$ in FIG. 41, in which $n_{LMU}$="0" corresponds to the lower page, $n_{LMU}$="1" corresponds to the middle page, and $n_{LMU}$="2" corresponds to the upper page. First, $n_{LMU}$w="0", and the lower page is selected.

Furthermore, the controller 200 executes step S220 in a manner similar to the third example, and the initial word line WL in first loop LP1 is determined ($n_{WL}$="0"). In addition, the controller 200 selects string unit SU0 (k=0) subjected to first loop LP1 (step S202).

Then, the controller 200 selects block BLK0 (l="0"), word line WLj (j=$n_{WL}$), and page i (i=$n_{LMU}$) (step S251).

Then, first loop LP1 is executed (step S215). First loop LP1 of this example differs from that in the third example described in relation to FIG. 39 in that not only a next block BLK (l+1) is selected in step S208 and a next word line WL is selected (j=j+1) in step S212, but also a next page is selected (i=i+1, step S214). In first loop LP1, the string unit SU number does not change. In this manner, the block BLK, the word line WL, and the read target page are shifted, and the shift read or tracking operation is executed again (step S232 or S231).

Then, the controller 200 determines whether string unit SU subjected to next previous first loop LP1 is last string unit SU (k="3", i.e., SU3) (step S209). When it is not last string unit SU3 (step S209, NO), the controller 200 selects a next string unit SU (step S210), and the processing returns to step S251.

When the target of first loop LP1 is last string unit SU3 (step S209, YES), the controller 200 determines whether the initial word line WL in the next previous first loop LP1 is the last word line WL ($n_{WL}$="95", i.e., WL95) (step S222). When it is not last word line WL95 (step S222, NO), the controller 200 executes the process of step S223. When it is last word line WL95 (step S222, YES), the controller 200 determines whether the initial page in next previous first loop LP1 is the upper page ($n_{LMU}$="2") (step S252). When it is not the upper page (step S252, NO), the controller 200 selects a next page ($n_{LMU}$=$n_{LMU}$+1, step S253), and the processing returns to step S220. In this manner, since the initial page is shifted in each first loop LP1, the variable i may exceed the upper page number (i="2") in step S214. In this case, the variable i is reset to "0", which indicates the lower page, and is incremented again from "0".

When the initial page in loop LP1 is the upper page (step S252, YES), the second loop is ended.

Figure 42B:
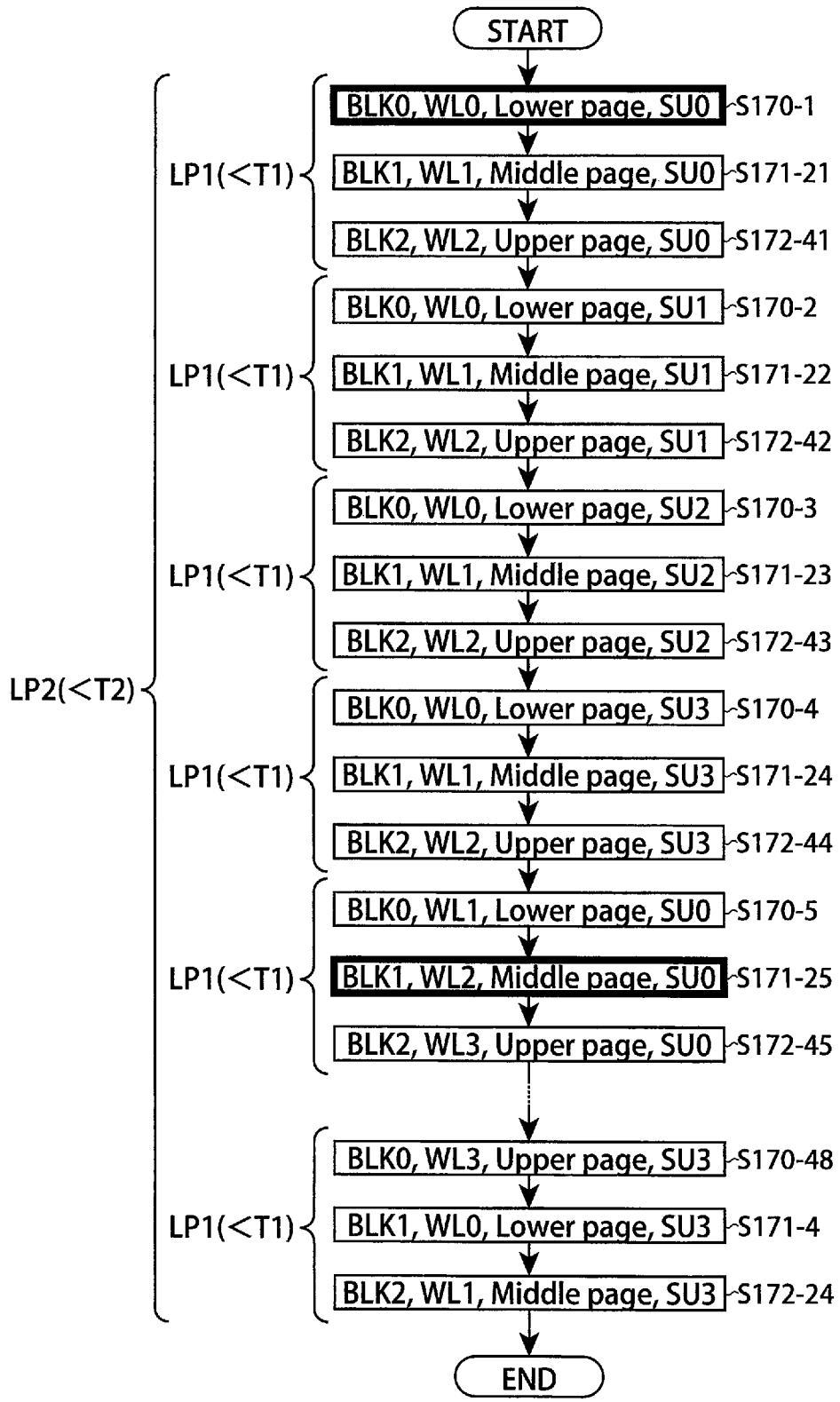
FIG. 42B is a flowchart showing the selection order of pages in the fourth example of the patrol operation according to the sixth embodiment.

FIG. 42A is a specific example of this example, and corresponds to FIGS. 36A, 38A, and 40A described in the first to third examples. In FIG. 42A, the tracking operation is performed in the shaded patrol reads. FIG. 42B is a flowchart corresponding to FIG. 42A, and the tracking operation is performed in the steps indicated by the frame of the thick line. For the sake of clarification, unlike the first to third examples, FIGS. 42A and 42B will be described based on the example where there are three blocks BLK (BLK0 to BLK2). The others are the same as the first to third examples.

As shown in FIGS. 42A and 42B, at first, block BLK0, word line WL0, the lower page, and string unit SU0 are selected, and the tracking operation and shift read are executed (step S170-1). Next, the selected block, the selected word line, and the selected page are shifted to block BLK1, word line WL1, and the middle page, respectively, and the shift read is executed (step S171-21). Then, the selected block, the selected word line, and the selected page are shifted to block BLK2, word line WL2, and the upper page, respectively, and the shift read is executed (step S172-41). In this manner, first loop LP1 of this example includes three shift reads, and this is repeated forty eight times to complete second loop LP2.

Next, the controller 200 increments string unit SU from "0" to "1" to execute the second round of first loop LP1 (steps S170-2, S171-22, and S172-42). Namely, at first, block BLK0, word line WL0, the lower page, and string unit SU1 are selected, and the shift read is executed (step S170-2). Next, block BLK1, word line WL1, the middle page, and string unit SU1 are selected, and the shift read is executed (step S171-22). Then, block BLK2, word line WL2, the upper page, and string unit SU1 are selected, and the shift read is executed (step S172-42).

Thereafter, in a similar manner, in each first loop LP1, block BLK, word line WL, and page are shifted while selected string unit SU is not changed. String unit SU is shifted when first loop LP1 is repeated.

6.5 Advantage According to Present Embodiment

The patrol read described in the fifth embodiment can be performed in the shift read in the order described in the present embodiment. Although exemplification has been omitted in the above-described embodiment, all of word lines WL, string units SU, and pages may be shifted when blocks BLK are shifted in first loop LP1.

Furthermore, by incrementing word lines, string units, and pages in first loop LP1, the tracking number required in first loop LP1 may be leveled out. Thus, it is possible to suppress the bias of the timing at which tracking occurs, and to diminish variations in time required to execute first loop LP1.

7. Modifications, Etc

The memory system 1 according to the above-described embodiments includes a semiconductor memory including first to fourth word lines arranged in order above a semiconductor substrate and first to fourth memory cells coupled to the first to fourth word lines, respectively, and a controller configured to issue a first instruction (test instruction) to determine a threshold distribution of memory cells (tracking operation), and a second instruction (shift read operation) to read data from a memory cell using a read voltage based on the threshold distribution. The controller is further configured to execute: a first operation (S100 in FIG. 16), by selecting the first word line (WL0 in FIG. 15) and issuing the first instruction, to obtain a first read voltage based on a threshold distribution of the first memory cell; a second operation (S105 in FIG. 16), by selecting the second word line (WL1-WL11 in FIG. 15) and issuing the second instruction designating a voltage based on the first read voltage as the read voltage, to read data from the second memory cell; a third operation (S115 in FIG. 16), by selecting the third word line (WL12 in FIG. 15) and issuing the first instruction, to obtain a second read voltage based on a threshold distribution of the third memory cell; and a fourth operation (S115 in FIG. 16), by selecting the fourth word line (WL13-WL23 in FIG. 15) and issuing the second instruction designating a voltage based on the second read voltage as the read voltage, to read data from the fourth memory cell.

In addition, the memory system 1 according to the above-described embodiments includes a semiconductor memory including first to third word lines arranged in order above a semiconductor substrate and first to third memory cells coupled to the first to third word lines, respectively, and a controller configured to issue a first instruction (test instruction) to determine a threshold distribution of memory cells (tracking operation), and a second instruction (shift read operation) to read data from a memory cell using a read voltage based on the threshold distribution. The controller is further configured to execute: a first operation, by selecting the first word line (WL6 in FIGS. 31A-B) and issuing the first instruction, to obtain a first read voltage (+3 in FIG. 31A) based on a threshold distribution of the first memory cell; a second operation, by selecting the third word line (WL18 in FIGS. 31A-B) and issuing the first instruction, to obtain a second read voltage (0 in FIG. 31A) based on a threshold distribution of the third memory cell; and a third operation, by selecting the second word line (WL10 in FIG. 31B) and issuing the second instruction designating a third read voltage (+2 in FIG. 31B) as the read voltage, to read data from the second memory cell. The third read voltage is a value between the first read voltage and the second read voltage.

Furthermore, the memory system 1 according to the above-described embodiments includes a semiconductor memory including memory cells capable of holding data, and a controller controlling the semiconductor memory. The semiconductor memory includes: a first block (BLK0 in FIG. 34A) including first word lines (WL0-WL3 of BLK0 in FIG. 34A) to which memory cells are respectively coupled; and a second block (BLK1 in FIG. 34A) including second word lines ((WL0-WL3 of BLK1 in FIG. 34A) to which memory cells are respectively coupled. The controller is configured to repeatedly access the first block (BLK0) and the second block (BLK1) at a first cycle (LP1 in FIG. 34B). The controller is further configured to repeatedly access the first word lines (WL0-WL3 of BLK0) in the first block and the second word lines (WL0-WL3 of BLK1) in the second block at a second cycle (LP2 in FIG. 34B) larger than the first cycle.

This configuration enables correction of threshold variations of memory cells involved with an elapse of time, thereby improving reliability of the operations of the memory system 1. The above-described embodiments are mere examples, and various modifications are possible.

For example, grouping of word lines described in the first embodiment is not limited to those described in relation to FIGS. 6 and 7, and may be suitably modified. FIGS. 6 and 7 have been described assuming that the silicon pillar 31 is formed of two layers 31-1 and 31-2, but the silicon pillar 31 may be formed of a single layer or three or more layers. Furthermore, the above-described embodiments have assumed that the word line WL on the lowermost layer is initial word line WL0 and that the word line WL on the uppermost layer is last word line WL95. However, this positional relationship may be opposite. Namely, the word line WL on the uppermost layer may be initial word line WL0, and the word line WL on the lowermost layer may be last word line WL95. The tracking operation described in the second embodiment is not limited to the method described in relation to FIGS. 13A to 13C and FIGS. 14A and 14B, and may be any method as long as an intersection of threshold distributions can be searched. Furthermore, the tracking operation may be a method of searching a read voltage at which the number of error bits is minimum, not a method of searching an intersection itself of threshold distributions, and is not limited as long as threshold distributions can be determined. In addition, the history table described in the above embodiments may be provided for each physical block, or may be provided for each logical block. A unique address is assigned to each physical block BLK. This is called a physical address. In contrast, the host apparatus 300 accesses the controller 200 using a logical address which is different from the physical address. Physical blocks BLK designated by the logical address are a logical block which is, for example, a set of a plurality of physical blocks BLK. The relationship between the logical block LB and the physical blocks BLK may always change. For example, when logical block LB0 corresponds to physical blocks BLK0 to BLK3 at a certain point in time, logical block LB0 corresponds to other physical blocks BLK4 to BLK7 at a later point. Therefore, for example, the buffer memory 240 of the controller 200 holds the relationship between a logical address and physical addresses as a logical-to-physical address conversion table.

In the sixth embodiment, some of the examples of the page selection order in the patrol read have been described. However, the page selection order is not limited to the case described in the sixth embodiment, and selection may be performed in other various orders. Namely, the configuration may be such that first loop LP1 is executed at a certain cycle T1 (i.e., accessing all physical blocks), second loop LP2 is executed at a different cycle T2 (i.e., accessing all pages of all physical blocks), and T1<T2. It is preferable that cycle T1 is shorter than a period that requires the influence of interference effects to disappear, and that cycle T1 is the shortest to access all physical blocks BLK. Furthermore, the above embodiments have been described assuming that the voltage shift amount in the shift read is set in the NAND flash memory 100 by the set feature command (see FIG. 8), but it may be designated in the shift read command, for example. Described as an example in the above embodiments is the case where each memory cell transistor MT holds 3-bit data. However, the embodiments may be applied to the case where each memory cell transistor MT holds 2-bit data or 4 or larger bit data.

Note that in each embodiment concerning the present invention, (1) When the memory cell holds 2-bit data ("Er", "A", "B", and "C"), the voltage applied to the selected word line in the reading operation of A level may range from, for example, 0 V to 0.55 V. However, the present embodiments are not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the reading operation of B level may range from, for example, 1.5 V to 2.3 V. However, the voltage is not limited to this and may be set within any one of the ranges of 1.65 V to 1.8 V, 1.8 V to 1.95 V, 1.95 V to 2.1 V, and 2.1 V to 2.3 V.

The voltage applied to the selected word line in the reading operation of C level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V.

A time (tR) of the reading operation may be set within the range of, for example, 25 µs to 38 µs, 38 µs to 70 µs, or 70 µs to 80 µs.

(2) A writing operation may include a program operation and a verify operation. In the writing operation, the voltage first applied to the selected word line in the program operation may range from, for example, 13.7 V to 14.3 V. The voltage is not limited to this and may be set within any one of the ranges of, for example, 13.7 V to 14.0 V and 14.0 V to 14.6 V.

The voltage first applied to the selected word line when write-accessing an odd-numbered word line and the voltage first applied to the selected word line when write-accessing an even-numbered word line may be different.

If the program operation may be ISPP (Incremental Step Pulse Program), the voltage of step-up may be, for example, 0.5 V.

The voltage applied to an unselected word line may be set within the range of, for example, 6.0 V to 7.3 V. However, the voltage is not limited to this and may be set within the range of, for example, 7.3 V to 8.4 or set to 6.0 V or less.

The pass voltage to be applied may be changed depending on whether the unselected word line is an odd-numbered word line or an even-numbered word line.

A time (tProg) of the writing operation may be set within the range of, for example, 1,700 µs to 1,800 µs, 1,800 µs to 1,900 µs, or 1,900 µs to 2000 µs.

(3) In erasing operation,

The voltage first applied to the well which may be formed in the upper portion of the semiconductor substrate and above which the memory cell may be arranged may be set within the range of, for example, 12 V to 13.6 V. However, the voltage is not limited to this and may be set within the range of, for example, 13.6 V to 14.8 V, 14.8 V to 19.0 V, 19.0 V to 19.8 V, or 19.8 V to 21 V.

A time (tErase) of the erasing operation may be set within the range of, for example, 3,000 µs to 4,000 µs, 4,000 µs to 5,000 µs, or 4,000 µs to 9,000 µs.

(4) The structure of the memory cell

A charge accumulation layer may be arranged on a 4 to 10 nm thick tunnel insulating film. The charge accumulation layer may have a stacked structure of a 2 to 3 nm thick insulating film of SiN or SiON and 3 to 8 nm thick polysilicon. A metal such as Ru may be added to the polysilicon. An insulating film is provided on the charge accumulation layer. The insulating film may include a 4 to 10 nm thick silicon oxide film sandwiched between a 3 to 10 nm thick lower High-k film and a 3 to 10 nm thick upper High-k film. As the High-k film, HfO or the like may be usable. The silicon oxide film may be thicker than the High-k film. A 30 to 70 nm thick control electrode may be formed on a 3 to 10 nm thick work function adjusting material on the insulating film. Here, the work function adjusting material may be a metal oxide film such as TaO or a metal nitride film such as TaN. As the control electrode, W or the like is usable.

An air gap may be formed between the memory cells.

In the above embodiments, a NAND flash memory has been exemplified as the semiconductor storage device. However, the embodiments may be applicable not only to the NAND flash memory but also to other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A controller for controlling a semiconductor memory including a first word line, a second word line, a third word line, a fourth word line, a first memory cell coupled to the first word line, a second memory cell coupled to the second word line, a third memory cell coupled to the third word line, and a fourth memory cell coupled to the fourth word line, the controller being configured to:
execute a first operation including selecting the first word line, determining a threshold distribution of the first memory cell, and obtaining a first read voltage based on the threshold distribution of the first memory cell;

execute a second operation including selecting the second word line, designating a voltage based on the first read voltage as the read voltage and reading data from the second memory cell;
execute a third operation including selecting the third word line, determining a threshold distribution of the third memory cell, and obtaining a second read voltage based on the threshold distribution of the third memory cell; and
execute a fourth operation including selecting the fourth word line, designating a voltage based on the second read voltage as the read voltage and reading data from the fourth memory cell.

2. The controller according to claim 1, wherein the semiconductor memory further includes a fifth word line, a sixth word line, a fifth memory cell coupled to the fifth word line and a sixth memory cell coupled to the sixth word line,
the first word line is between the second word line and the fifth word line,
the third word line is between the fourth word line and the sixth word line,
the controller being configured to:
execute, after the first operation:
a fifth operation including selecting the fifth word line, designating a voltage based on the first read voltage as the read voltage and reading data from the fifth memory cell; and
the second operation after the fifth operation.

3. The controller according to claim 1, wherein the semiconductor memory further includes:
a first selection gate line;
a first selection transistor coupled to the first selection gate line; and
a first bit line,
wherein the first to fourth memory cells are coupled in series, and are coupled to the first bit line via the first selection transistor.

4. The controller according to claim 3, wherein the semiconductor memory further includes:
a fifth memory cell coupled to the first word line;
a sixth memory cell coupled to the second word line;
a seventh memory cell coupled to the third word line;
an eighth memory cell coupled to the fourth word line;
a second selection gate line; and
a second selection transistor coupled to the second selection gate line,
wherein the fifth to eighth memory cells are coupled in series, and are coupled to the first bit line via the second selection transistor,
the controller being configured to:
execute a fifth operation including selecting the first word line, designating a voltage based on the first read voltage as the read voltage and reading data from the fifth memory cell;
execute a sixth operation including selecting the second word line, designating a voltage based on the first read voltage as the read voltage and reading data from the sixth memory cell;
execute a seventh operation including selecting the third word line, designating a voltage based on the second read voltage as the read voltage and reading data from the seventh memory cell; and
execute an eighth operation including selecting the fourth word line, designating a voltage based on the second read voltage as the read voltage and reading data from the eighth memory cell.

5. The controller according to claim 1, wherein the semiconductor memory includes a first block including the first to fourth memory cells, and a second block, each of the first block and the second block being a unit of data erasing,
the controller being configured to:
when one of the second operation and the fourth operation fails to read data, copy the data in the first block to the second block.

6. The controller according to claim 1, wherein the semiconductor memory further includes a fifth word line, and a fifth memory cell coupled to the fifth word line,
the controller being configured to:
execute a fifth operation including selecting the fifth word line, determining a threshold distribution of the fifth memory cell and obtaining a third read voltage based on a threshold distribution of the fifth memory cell, wherein
in the second operation, a voltage based on the first read voltage and the third read voltage is designated as the read voltage.

7. The controller according to claim 6, wherein the semiconductor memory further includes:
a first selection gate line and a second selection gate line;
a first selection transistor and a second selection transistor coupled to the first and second selection gate lines, respectively; and
a first bit line,
wherein the first to fourth memory cells are coupled in series, and are coupled to the first bit line via the first selection transistor,
the fifth memory cell is coupled to the first bit line via the second selection transistor, and
the first word line is coupled to the fifth word line.

8. The controller according to claim 6, wherein the fifth word line is located between the first word line and the second word line, and
the first to fifth memory cells are coupled in series.

9. A controller for controlling a semiconductor memory including a first word line, a second word line, a third word line, a first memory cell coupled to the first word line, a second memory cell coupled to the second word line, and a third memory cell coupled to the third word line,
the controller being configured to:
execute a first operation including selecting the first word line, determining a threshold distribution of the first memory cell, and obtaining a first read voltage based on a threshold distribution of the first memory cell;
execute a second operation including selecting the third word line, determining a threshold distribution of the third memory cell, and obtaining a second read voltage based on a threshold distribution of the third memory cell; and
execute a third operation including selecting the second word line, designating a third read voltage as the read voltage and read data from the second memory cell, wherein
the third read voltage is between the first read voltage and the second read voltage.

10. The controller according to claim 9, being configured to, when reading data from the first to third memory cells, designate shift amounts of voltages to be applied to the first to third word lines, wherein
a shift amount for the second word line is between a shift amount for the first word line and a shift amount for the third word line.

11. The controller according to claim 9, being configured to calculate the third read voltage based on the first read voltage and the second read voltage.

\* \* \* \* \*